(12) United States Patent
Chung et al.

(10) Patent No.: US 12,568,641 B2
(45) Date of Patent: Mar. 3, 2026

(54) SEMICONDUCTOR DEVICE WITH VARYING NUMBERS OF CHANNEL LAYERS AND METHOD OF FABRICATION THEREOF

(71) Applicant: Taiwan Semiconductor Manufacturing Co., Ltd., Hsin-Chu (TW)

(72) Inventors: Cheng-Ting Chung, Hsinchu City (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 238 days.

(21) Appl. No.: 18/349,617

(22) Filed: Jul. 10, 2023

(65) Prior Publication Data

US 2023/0352567 A1 Nov. 2, 2023

Related U.S. Application Data

(62) Division of application No. 17/199,877, filed on Mar. 12, 2021, now Pat. No. 11,699,742.

(60) Provisional application No. 63/032,387, filed on May 29, 2020.

(51) Int. Cl.
| | |
|---|---|
| *H10D 30/01* | (2025.01) |
| *H10D 30/62* | (2025.01) |
| *H10D 84/01* | (2025.01) |
| *H10D 84/03* | (2025.01) |

(52) U.S. Cl.
CPC ....... *H10D 30/024* (2025.01); *H10D 30/6211* (2025.01); *H10D 84/0128* (2025.01); *H10D*

*84/013* (2025.01); *H10D 84/0158* (2025.01); *H10D 84/038* (2025.01)

(58) Field of Classification Search
CPC .... H10D 30/14; H10D 30/43; H10D 30/6735; H10D 62/121; H10D 84/0149; H10D 84/0186
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |

(Continued)

FOREIGN PATENT DOCUMENTS

| | | |
|---|---|---|
| CN | 101894842 A | 11/2010 |
| CN | 108807386 A | 11/2018 |

(Continued)

*Primary Examiner* — Tuan A Hoang
(74) *Attorney, Agent, or Firm* — HAYNES AND BOONE, LLP

(57) ABSTRACT

A semiconductor structure includes a stack of at least two semiconductor channel layers, a gate structure wrapping each of the semiconductor channel layers, and first and second source/drain (S/D) features disposed on opposing sides of the gate structure. The first and second S/D features, the semiconductor channel layers, and the gate structure are at a frontside of the semiconductor structure. At least one of the semiconductor channel layers is free of contact with the first S/D feature.

20 Claims, 44 Drawing Sheets

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,090,193 | B1 * | 10/2018 | Chanemougame ... H01L 23/485 |
| 2017/0133375 | A1 | 5/2017 | Fung |
| 2018/0151683 | A1 | 5/2018 | Yeo et al. |
| 2018/0175034 | A1 * | 6/2018 | Goktepeli ......... H01L 21/76898 |
| 2019/0074362 | A1 | 3/2019 | Lee et al. |
| 2019/0148376 | A1 | 5/2019 | Chanemougame et al. |
| 2019/0157310 | A1 | 5/2019 | Glass et al. |
| 2020/0135848 | A1 | 4/2020 | Lim et al. |
| 2020/0303509 | A1 | 9/2020 | Mehandru et al. |
| 2020/0411518 | A1 | 12/2020 | Fulford et al. |

FOREIGN PATENT DOCUMENTS

| | | | |
|---|---|---|---|
| CN | 109727916 | A | 5/2019 |
| CN | 114450772 | A | 5/2022 |
| DE | 102018103075 | A1 | 2/2019 |
| KR | 20170067117 | A | 6/2017 |
| KR | 20190015269 | A | 2/2019 |
| KR | 20190049329 | A | 5/2019 |
| TW | 201724213 | A | 7/2017 |
| TW | 202008512 | A | 2/2020 |

* cited by examiner

Figure 1A:
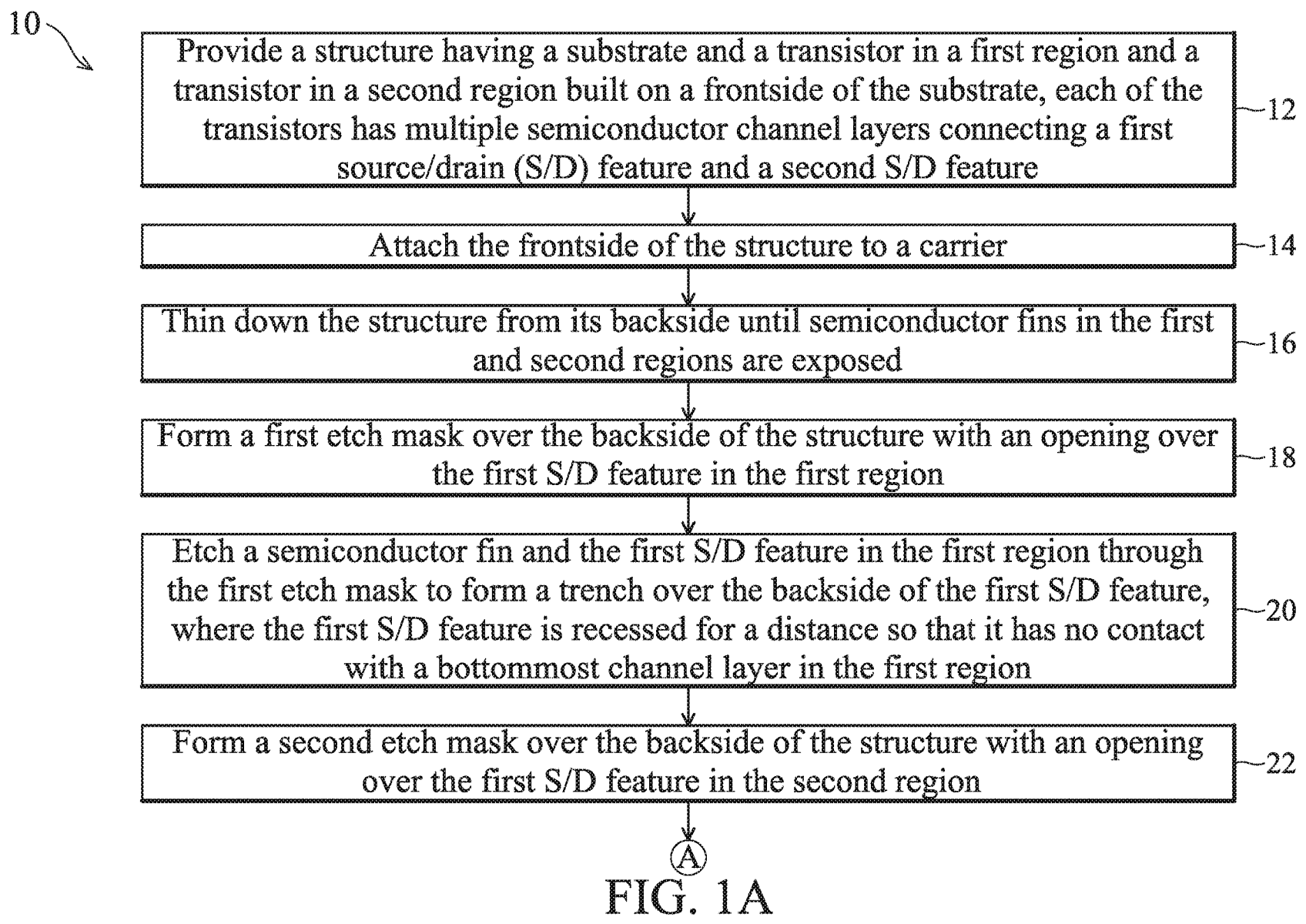

10

Provide a structure having a substrate and a transistor in a first region and a transistor in a second region built on a frontside of the substrate, each of the transistors has multiple semiconductor channel layers connecting a first source/drain (S/D) feature and a second S/D feature

12

Attach the frontside of the structure to a carrier

14

Thin down the structure from its backside until semiconductor fins in the first and second regions are exposed

16

Form a first etch mask over the backside of the structure with an opening over the first S/D feature in the first region

18

Etch a semiconductor fin and the first S/D feature in the first region through the first etch mask to form a trench over the backside of the first S/D feature, where the first S/D feature is recessed for a distance so that it has no contact with a bottommost channel layer in the first region

20

Form a second etch mask over the backside of the structure with an opening over the first S/D feature in the second region

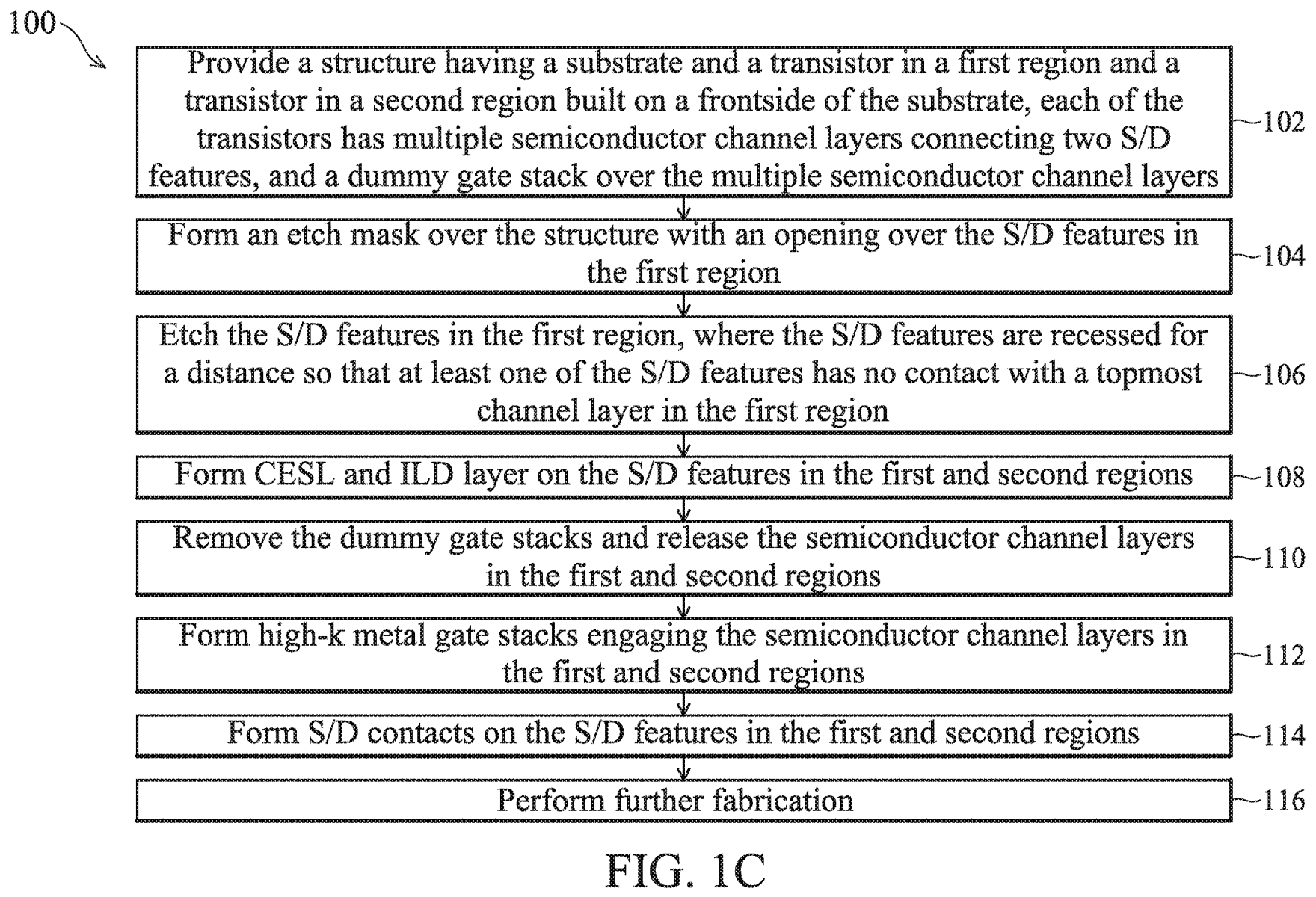

Provide a structure having a substrate and a transistor in a first region and a transistor in a second region built on a frontside of the substrate, each of the transistors has multiple semiconductor channel layers connecting two S/D features, and a dummy gate stack over the multiple semiconductor channel layers — 102

Form an etch mask over the structure with an opening over the S/D features in the first region — 104

Etch the S/D features in the first region, where the S/D features are recessed for a distance so that at least one of the S/D features has no contact with a topmost channel layer in the first region — 106

Form CESL and ILD layer on the S/D features in the first and second regions — 108

Remove the dummy gate stacks and release the semiconductor channel layers in the first and second regions — 110

Form high-k metal gate stacks engaging the semiconductor channel layers in the first and second regions — 112

Form S/D contacts on the S/D features in the first and second regions — 114

Perform further fabrication — 116

FIG. 1C

SEMICONDUCTOR DEVICE WITH VARYING NUMBERS OF CHANNEL LAYERS AND METHOD OF FABRICATION THEREOF

PRIORITY

This is a divisional application of U.S. patent application Ser. No. 17/199,877 filed Mar. 12, 2021, which claims the benefits to U.S. Provisional Application Ser. No. 63/032,387 filed May 29, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structure which can extend around the channel region providing access to the stacked semiconductor channel layers on four sides. Compared to planar transistors, such configuration provides better control of the channel and drastically reduces SCEs (in particular, by reducing sub-threshold leakage). The number of stacked semiconductor channel layers is chosen based on device performance considerations, particularly current driving capability of the transistors.

IC devices include transistors that serve different functions, such as input/output (I/O) functions and core functions. These different functions require the transistors to have different constructions. At the same time, it is advantageous to have similar processes and similar process windows to fabricate these different transistors to reduce cost and improve yield. Although existing GAA transistors and processes are generally adequate for their intended purposes, they have not been entirely satisfactory in every aspect. For example, in an IC chip, there are different regions serving different functions, such as high-power regions for high performance computing (HPC) unit or central processing unit (CPU), which requires GAA transistors with strong current driving capability to achieve high operating speed, and low-power regions for I/O or system-on-a-chip (SoC) unit, which requires GAA transistors with less current driving capability to achieve low-leakage performance. Accordingly, a need of the number of stacked semiconductor channel layers in GAA transistors in different regions may be different in one IC chip. Therefore, in the course of IC evolution, how to achieve varying numbers of stacked semiconductor channel layers suiting different applications on one chip is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B show a flow chart of a method of forming a semiconductor device with varying numbers of stacked semiconductor channel layers in different regions and backside metal wiring layers, according to various aspects of the present disclosure.

FIG. 1C shows a flow chart of a method of forming a semiconductor device with varying numbers of stacked semiconductor channel layers in different regions without a need of backside metal wiring layers, according to various aspects of the present disclosure.

DETAILED DESCRIPTION

Figure 1B:
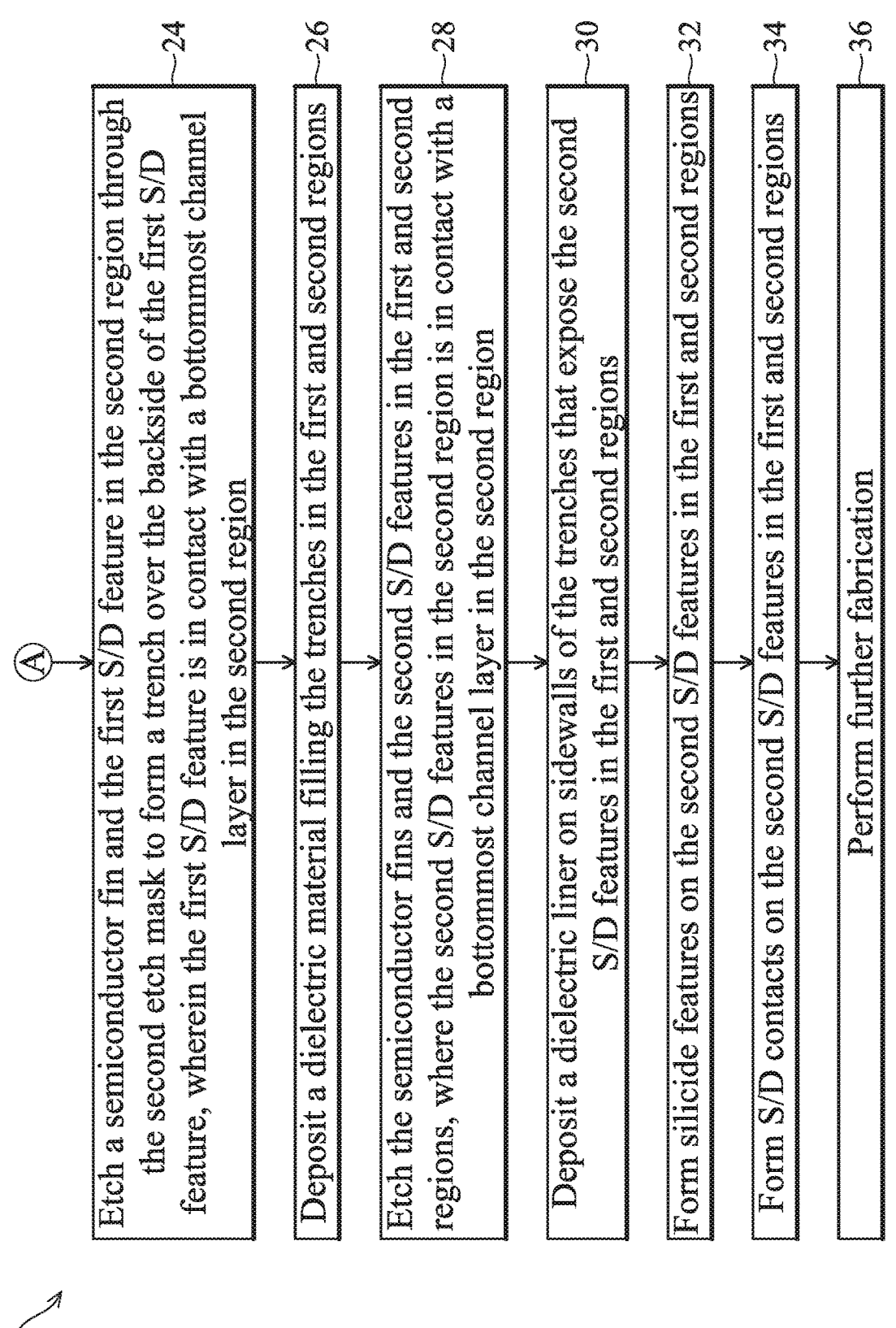

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to integrate circuit (IC) chips having transistors with varying numbers of stacked semiconductor channel layers in different regions suiting different applications on one chip. In various embodiments, at least two gate-all-around (GAA) transistors with different (or varying) numbers of stacked semiconductor channel layers (e.g., nanowires or nanosheets) on the same substrate are placed in a core area (e.g., for high-power applications) and an I/O area (for low-leakage applications) of one IC chip, respectively. The varying numbers of stacked semiconductor channel layers can be achieved either from backside of a semiconductor structure or from frontside of a semiconductor structure, according to various aspects of the present disclosure.

The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

FIGS. 1A and 1B show a flow chart of a method 10 for fabricating a semiconductor device with backside metal wiring layers and varying numbers of stacked semiconductor channel layers in different regions, according to some embodiments of the present disclosure. Metal wiring layers on a backside of a structure, such as backside power rails, increases the number of metal tracks available in the structure for directly connecting to source/drain contacts and vias in addition to an interconnect structure (which may include power rails as well) on a front side (or frontside) of the structure. It also increases the gate density for greater device integration than existing structures without the backside power rails. The backside power rails may have wider dimension than the first level metal (MO) tracks on the frontside of the structure, which beneficially reduces the power rail resistance. The method 10 is described below in conjunction with FIGS. 2 through 15F that illustrate various top and cross-sectional views of a semiconductor device (or device) 200 at various steps of fabrication according to the method 10, in accordance with some embodiments. Additional processing is contemplated by the present disclosure. Additional operations can be provided before, during, and after method 10, and some of the operations described can be moved, replaced, or eliminated for additional embodiments of the method 10.

Figure 2:
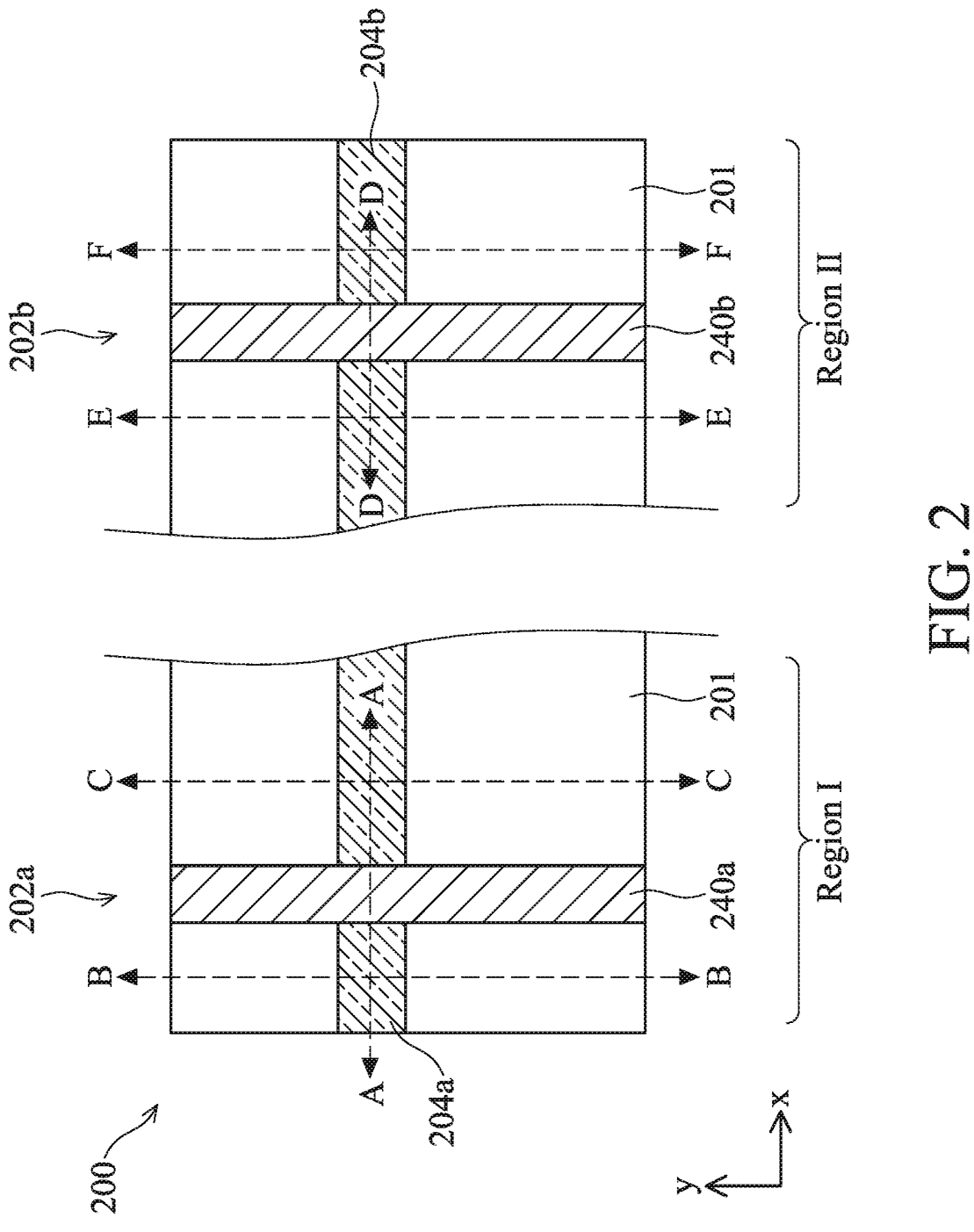
FIG. 2 illustrates a top view of a portion of a semiconductor device, according to some embodiments.
Figures 3A, 3B, 3C:
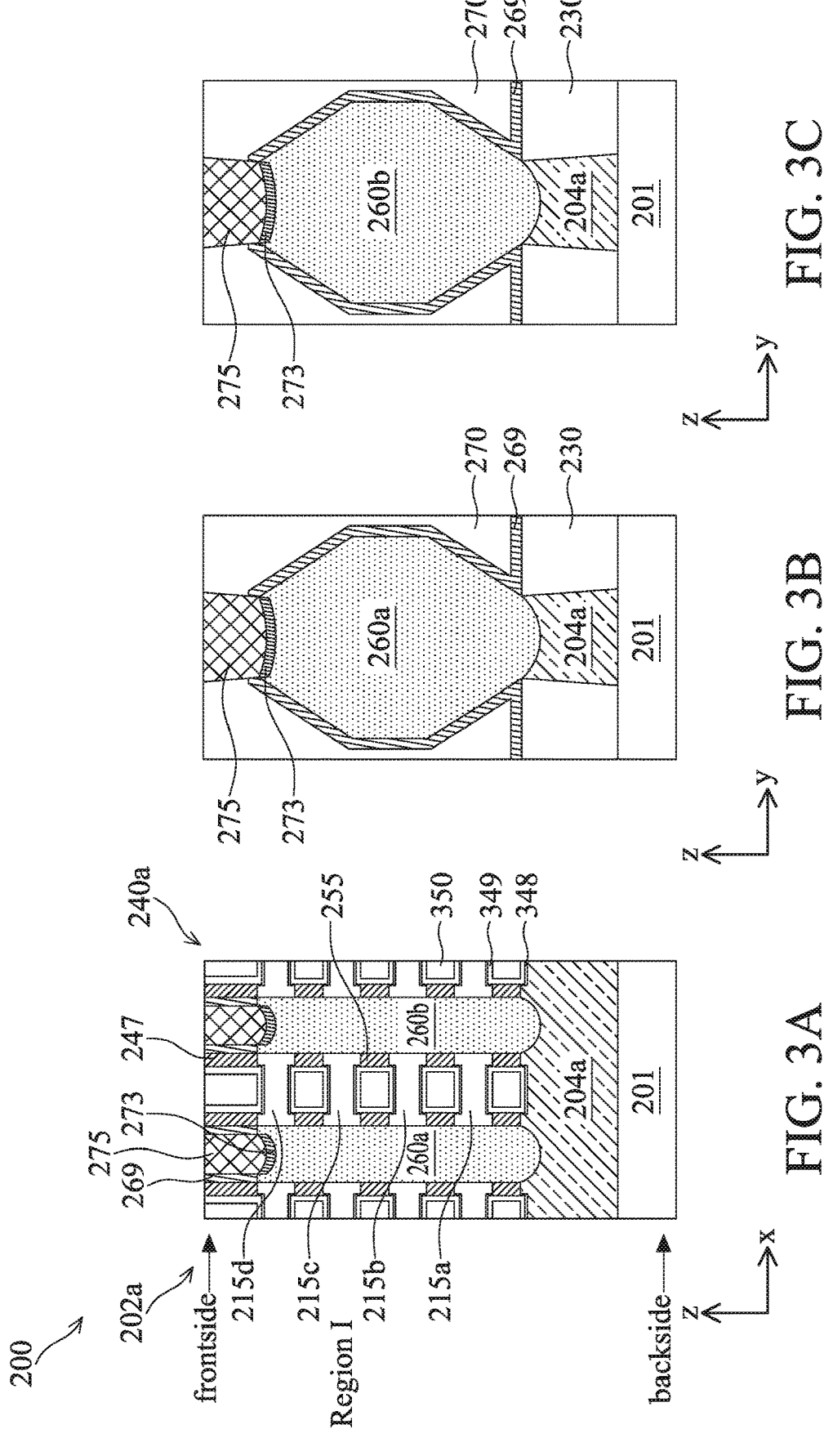
FIGS. 3A, 4A, 5A, 6A, 7A, 8A, 9A, 10A, 11A, 12A, 13A, 14A, and 15A illustrate cross-sectional views along the A-A line of the portion of the semiconductor device in FIG. 2 during fabrication processes according to the method of FIGS. 1A and 1B, in accordance with some embodiments of the present disclosure.
FIGS. 3B, 4B, 5B, 6B, 7B, 8B, 9B, 10B, 11B, 12B, 13B, 14B, and 15B illustrate cross-sectional views along the B-B line of the portion of the semiconductor device in FIG. 2 during fabrication processes according to the method of FIGS. 1A and 1B, in accordance with some embodiments of the present disclosure.
FIGS. 3C, 4C, 5C, 6C, 7C, 8C, 9C, 10C, 11C, 12C, 13C, 14C, and 15C illustrate cross-sectional views along the C-C line of the portion of the semiconductor device in FIG. 2 during fabrication processes according to the method of FIGS. 1A and 1B, in accordance with some embodiments of the present disclosure.
Figures 3D, 3E, 3F:
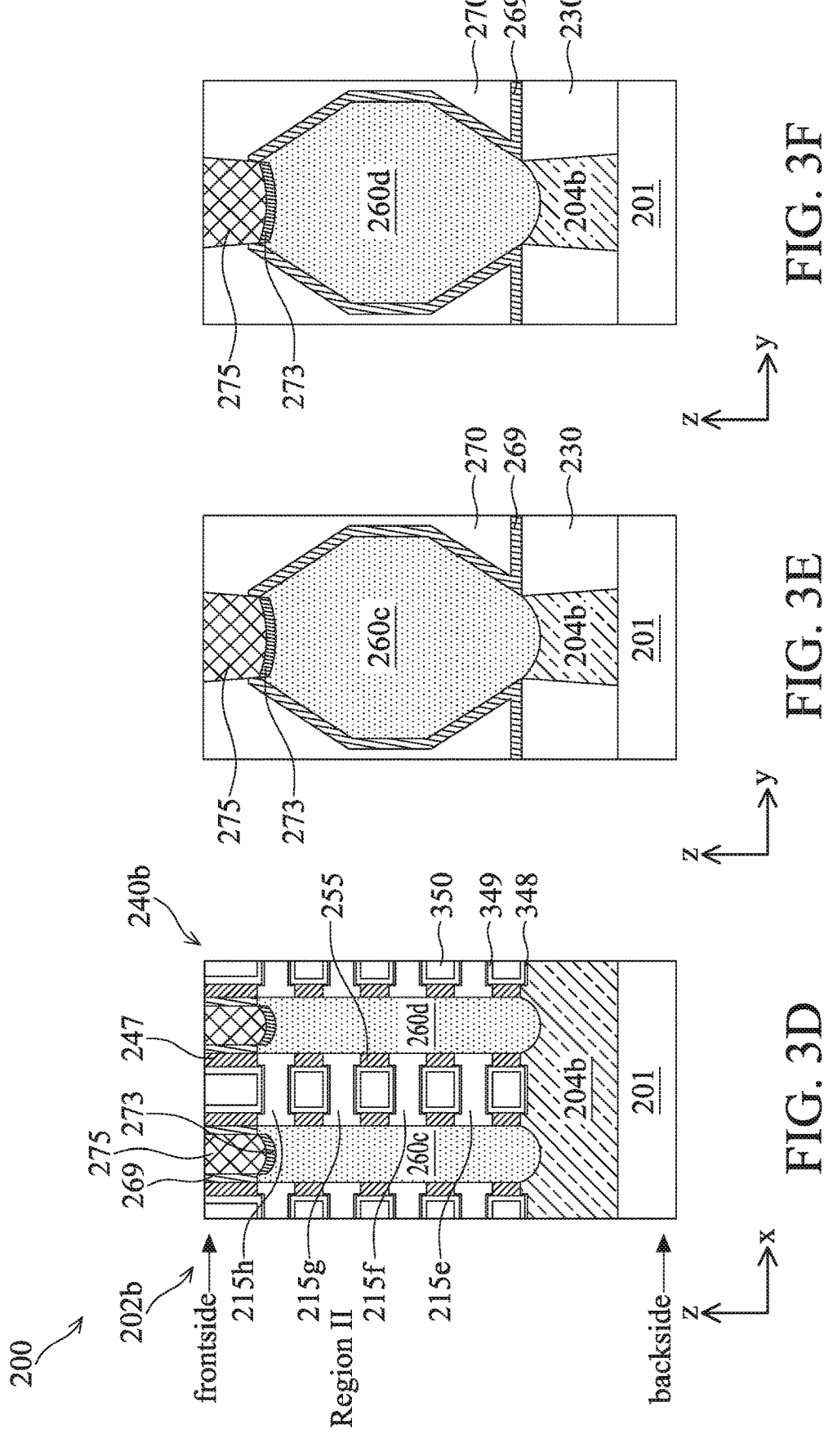
FIGS. 3D, 4D, 5D, 6D, 7D, 8D, 9D, 10D, 11D, 12D, 13D, 14D, and 15D illustrate cross-sectional views along the D-D line of the portion of the semiconductor device in FIG. 2 during fabrication processes according to the method of FIGS. 1A and 1B, in accordance with some embodiments of the present disclosure.
FIGS. 3E, 4E, 5E, 6E, 7E, 8E, 9E, 10E, 11E, 12E, 13E, 14E, and 15E illustrate cross-sectional views along the E-E line of the portion of the semiconductor device in FIG. 2 during fabrication processes according to the method of FIGS. 1A and 1B, in accordance with some embodiments of the present disclosure.
FIGS. 3F, 4F, 5F, 6F, 7F, 8F, 9F, 10F, 11F, 12F, 13F, 14F, and 15F illustrate cross-sectional views along the F-F line of the portion of the semiconductor device in FIG. 2 during fabrication processes according to the method of FIGS. 1A and 1B, in accordance with some embodiments of the present disclosure.

In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIG. 2 and FIGS. 3A-15F have been simplified for the sake of clarity to better understand the inventive concepts of the present disclosure. Additional features can be added in the device 200, and some of the features described below can be replaced, modified, or eliminated in other embodiments of the device 200. FIG. 2 illustrates a top view of the device 200, and FIGS. 3A-15F illustrate cross-sectional views of the device 200, in portion, along the A-A line, the B-B line, the C-C line, the D-D line, the E-E line, and the F-F line in FIG. 2, respectively. Particularly, the A-A line and the D-D line are cuts along the lengthwise direction of semiconductor fins (direction "X"), the B-B line and the E-E line are cuts into the source regions of transistors and are parallel to gate stacks of the transistors (direction "Y"), and the C-C line and the F-F line are cuts into the drain regions of transistors and are parallel to gate stacks of the transistors. It is noted that in various embodiments, the B-B line and the E-E line can be alternatively cut into the drain regions of the transistors and the C-C line and the F-F line can be alternatively cut into the source regions of the transistors. In the present disclosure, a source and a drain are interchangeably used.

At operation 12, the method 10 (FIG. 1A) provides device 200 having a substrate 201 and transistors built on a frontside of the substrate 201. Referring to FIG. 2, the device 200 includes a region I for low-power and/or low-leakage applications, such as an I/O area, and a region II for high-power and/or high-speed applications such as a core area. The region I may include I/O cells, ESD cells, and other circuits. The region II may include high performance computing (HPC) unit, central processing unit (CPU) logic circuits, memory circuits, and other core circuits.

The device 200 includes a substrate 201 and a plurality of semiconductor fins (or fins) protruding out of the substrate 201 including a fin 204a in the region I and a fin 204b in the region II (collectively, fins 204). The fins 204 are oriented lengthwise along the X direction. Each of the fins 204 may be designed for forming an NFET or a PFET. The device 200 also includes a plurality of gate structures (or gate stacks) disposed over the fins 204 including a gate stack 240a in the region I and a gate stack 240b in the region II (collectively, gate stacks 240). The gate stacks 240 are oriented lengthwise along the Y direction. The gate stacks 240 engage the fins 204 in their respective channel regions to thereby form a GAA transistor 202a in the region I and a GAA transistor 202b in the region II. Generally, the GAA transistor 202b needs stronger current driving capability than the GAA transistor 202a due to its power-hungry applications.

Referring to FIGS. 3A-3F, the device 200 includes the substrate 201 at its backside and various elements built on the front surface of the substrate 201. These elements include an isolation structure 230 over the substrate 201, fins 204 (including the fin 204a in the region I and the fin 204b in the region II) extending from the substrate 201 and adjacent to the isolation structure 230. In the region I, the device 200 includes two source/drain (S/D) features 260a and 260b over the fin 204a, semiconductor channel layers (or channel layers) 215a, 215b, 215c, 215d suspended over the fin 204a and connecting the two S/D features 260a/260b, a gate stack 240a between the two S/D features 260a/260b and wrapping around each of the channel layers. In the region II, the device 200 includes two source/drain (S/D) features 260c and 260d (collectively with 260a-b as S/D features 260) over the fin 204b, channel layers 215e, 215f, 215g, 215h (collectively with 215a-d as channel layers 215) suspended over the fin 204b and connecting the two S/D features 260c/260d, a gate stack 240b between the two S/D features 260c/260d and wrapping around each of the channel layers. In each region, the device 200 further includes inner spacers 255 between the S/D features 260 and the gate stacks 240, a (outer) gate spacer 247 over sidewalls of the gate stacks 240, a contact etch stop layer (CESL) 269 adjacent to the gate spacer 247 and over the S/D features 260 and the isolation structure 230, an inter-layer dielectric (ILD) layer 270 over the CESL 269. Over the S/D features 260, the device 200 further includes silicide features 273 and S/D contacts 275.

Referring to FIGS. 4A-4F, the device 200 further includes one or more interconnect layers 277 with wires and vias embedded in dielectric layers. The one or more interconnect layers 277 connecting gate, source, and drain electrodes of various transistors, as well as other circuits in the device 200, to form an integrated circuit in part or in whole. The device 200 may further include passivation layers, adhesion layers, and/or other layers built on the frontside of the device 200. These layers and the one or more interconnect layers are collectively denoted with the label 277. It is noted that the device 200 is flipped upside down in FIG. 4A-4F. For simplicity, FIGS. 4B, 4C, 4E, 4F, and following drawings with suffix B, C, E, F, omit some features that are already shown in FIGS. 4A and 4D, particularly the interconnect layer 277 and the carrier 370. The various elements of the device 200 are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

In embodiments, the fins 204 may include silicon, silicon germanium, germanium, or other suitable semiconductor, and may be doped n-type or p-type dopants. The fins 204 may be patterned by any suitable method. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 204. For example, the masking element may be used for etching recesses into semiconductor layers over or in the substrate 201, leaving the fins 204 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 204 may be suitable.

The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 can include different structures, such as shallow trench isolation (STI) features and/or deep trench isolation (DTI) features. In an embodiment, the isolation structure 230 can be formed by filling the trenches between fins 204 with insulator material (for example, by using a CVD process or a spin-on glass process), performing a chemical mechanical polishing (CMP) process to remove excessive insulator material and/or planarize a top surface of the insulator material layer, and etching back the insulator material layer to form the isolation structure 230. In some embodiments, the isolation structure 230 include multiple dielectric layers, such as a silicon nitride layer disposed over a thermal oxide liner layer.

The S/D features 260 include epitaxially grown semiconductor materials such as epitaxially grown silicon, germanium, or silicon germanium. The S/D features 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 260 may be doped with n-type dopants and/or p-type dopants. In some embodiments, for n-type transistors, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the S/D features 260.

In embodiments, the channel layers 215 includes a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are initially part of a stack of semiconductor layers that include the channel layers 215 and other sacrificial semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stacks 240, the sacrificial semiconductor layers are selectively removed, leaving the channel layers 215 suspended over the fins 204. In the illustrated embodiment, the channel layer 215a is the bottommost channel layer and the channel layer 215d is the topmost channel layer in the region I; the channel layer 215e is the bottommost channel layer and the channel layer 215h is the topmost channel layer in the region II. It is noted that four (4) channel layers 215 are vertically stacked in each region, which is for illustrative purposes only and not intended to be limiting beyond what is specifically recited in the claims. It can be appreciated that any number of channel layers can be formed, depending on device performance needs. In some embodiments, the number of channel layers 215 in each region is between (including) 2 and 10. Although the number of channel layers 215 appears the same in both region I and region II, as will be discussed in further details below, the method 10 reduces the number of channel layers 215 in actual usage in the region I for less current driving capability and keeps the maximum available number of channel layers 215 in actual usage in the region II for stronger current driving capability.

In some embodiments, the inner spacers 255 include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacers 255 include a low-k dielectric material, such as those described herein. The inner spacers 255 may be formed by deposition and etching processes. For example, after S/D trenches are etched and before the S/D features 260 are epitaxially grown from the S/D trenches, an etch process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacers 255.

In the depicted embodiment, the gate stacks 240 include a high-k dielectric layer 349, a gate electrode layer 350, and an interfacial layer 348 between the high-k dielectric layer 349 and the channel layers 215. The high-k dielectric layer 349 includes a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The high-k dielectric layer 349 may be formed by ALD, CVD, metal-organic CVD (MOCVD), PVD, thermal oxidation, and/or other suitable methods. The interfacial layer 348 may include silicon dioxide, silicon oxynitride, or other suitable materials. The interfacial layer 348 may be formed by chemical oxidation, thermal oxidation, atomic layer deposition (ALD), chemical vapor deposition (CVD), and/or other suitable methods. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stacks 240 include a high-k dielectric layer and metal layer(s), it is also referred to as high-k metal gates.

In an embodiment, the gate spacer 247 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacer 247 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form the gate spacers 247. In some embodiments, the gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacer 247 may have a thickness of about 1 nm to about 40 nm, for example.

In embodiments, the CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 270 may be formed by PE-CVD (plasma enhanced CVD), F-CVD (flowable CVD), or other suitable methods.

In some embodiments, the silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 275.

Figures 4A, 4B, 4C:
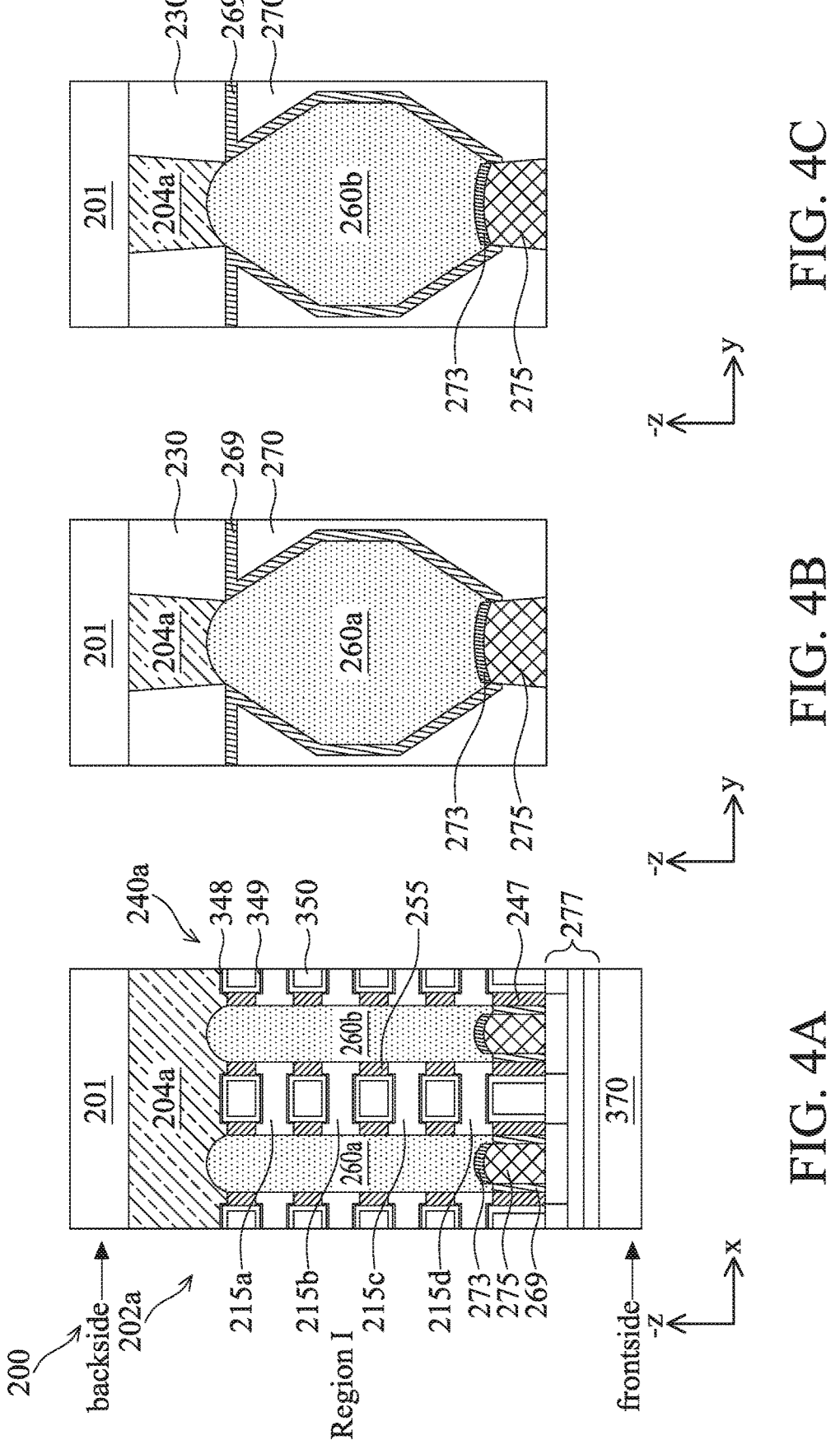
Figures 4D, 4E, 4F:
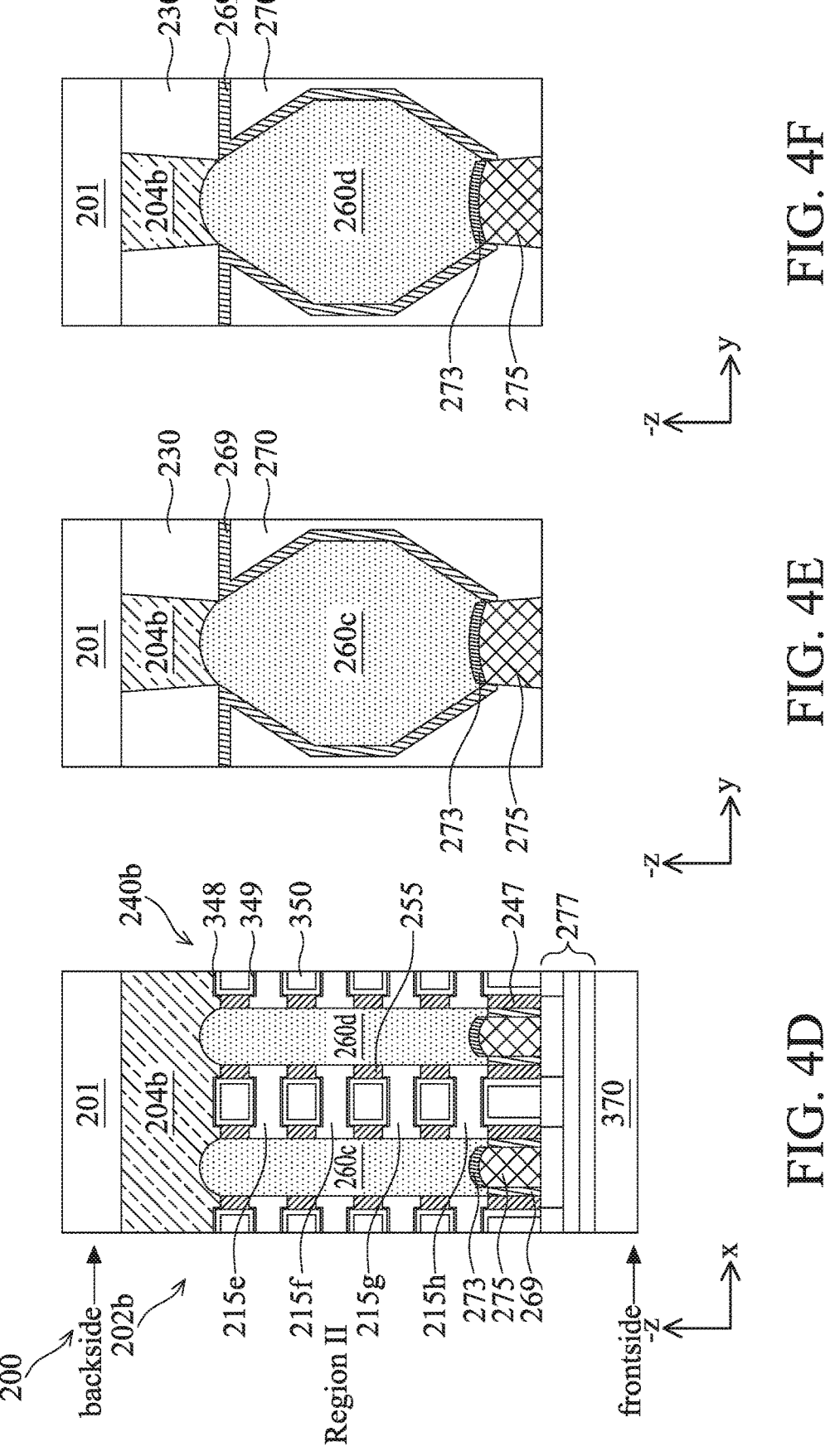
Figures 5A, 5B, 5C:
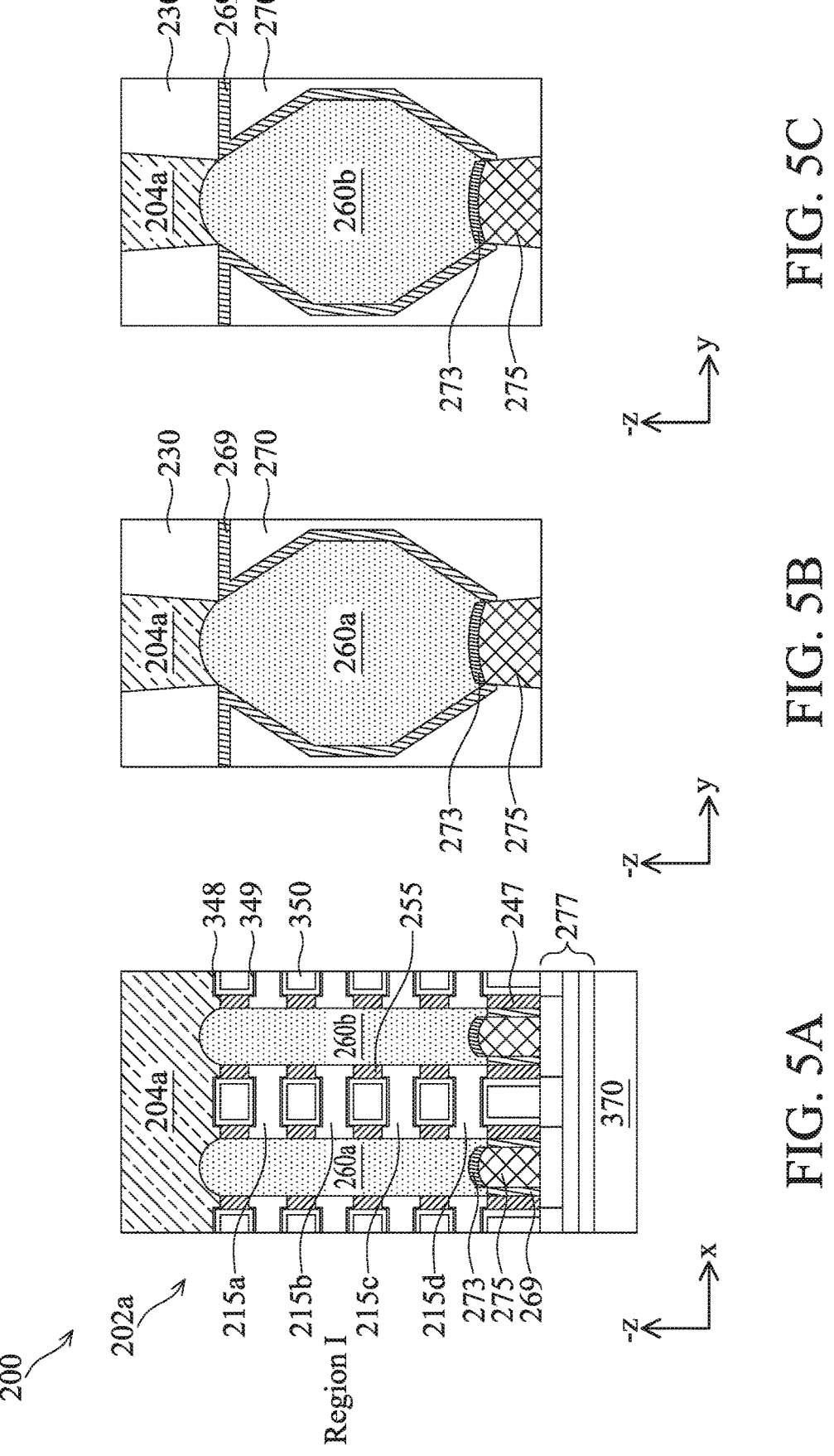
Figures 5D, 5E, 5F:
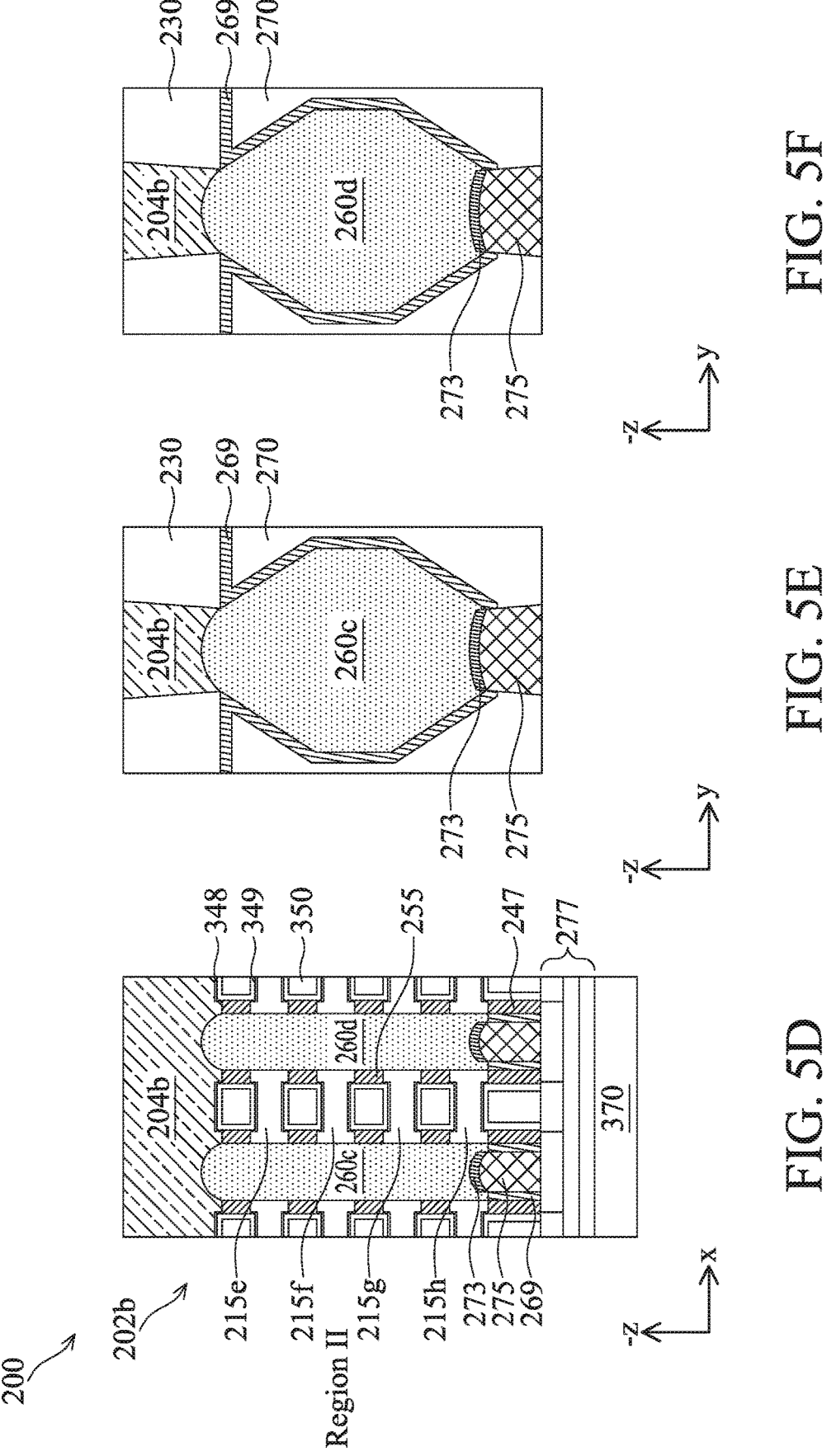
Figures 6A, 6B, 6C:
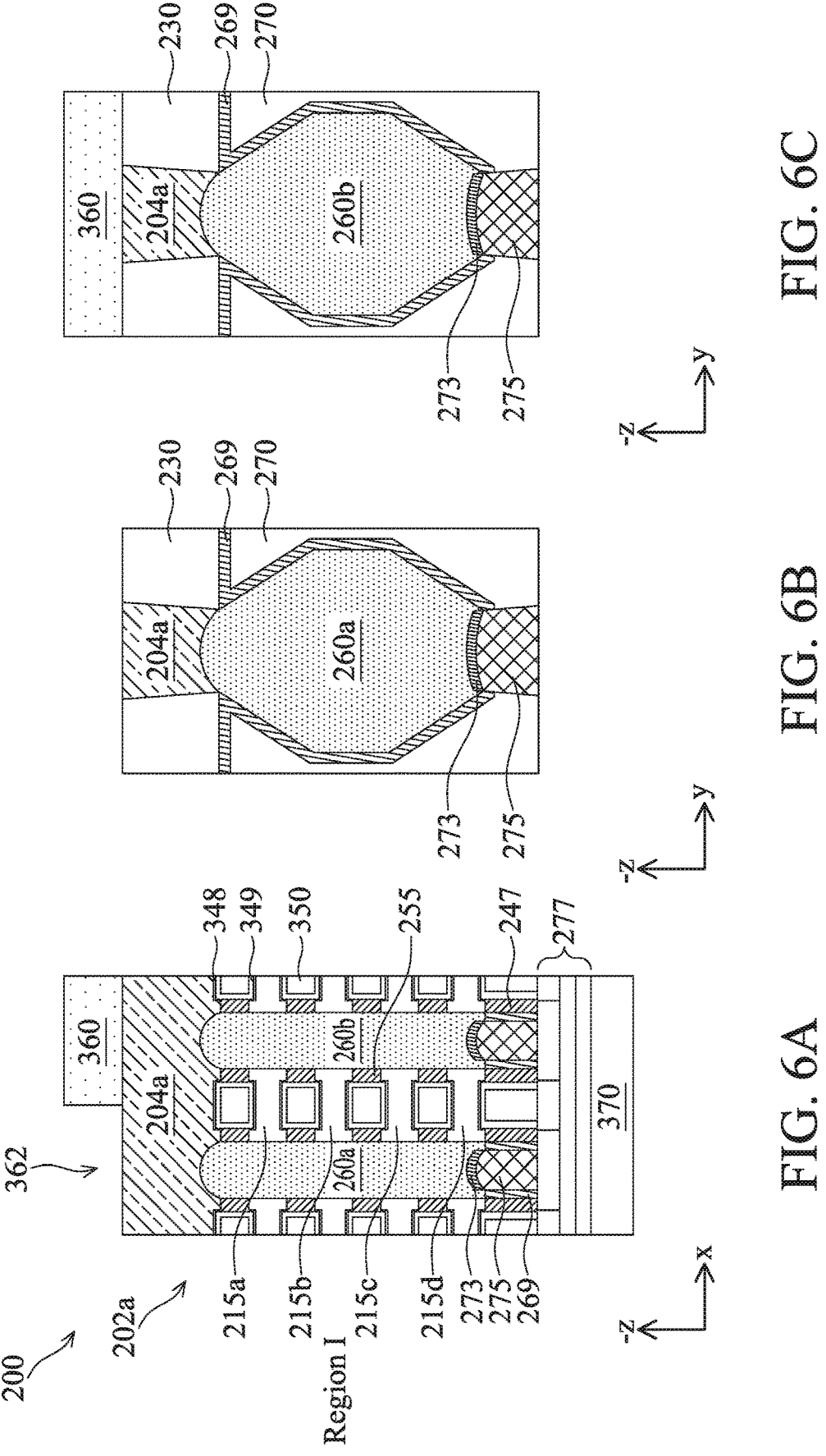
Figures 6D, 6E, 6F:
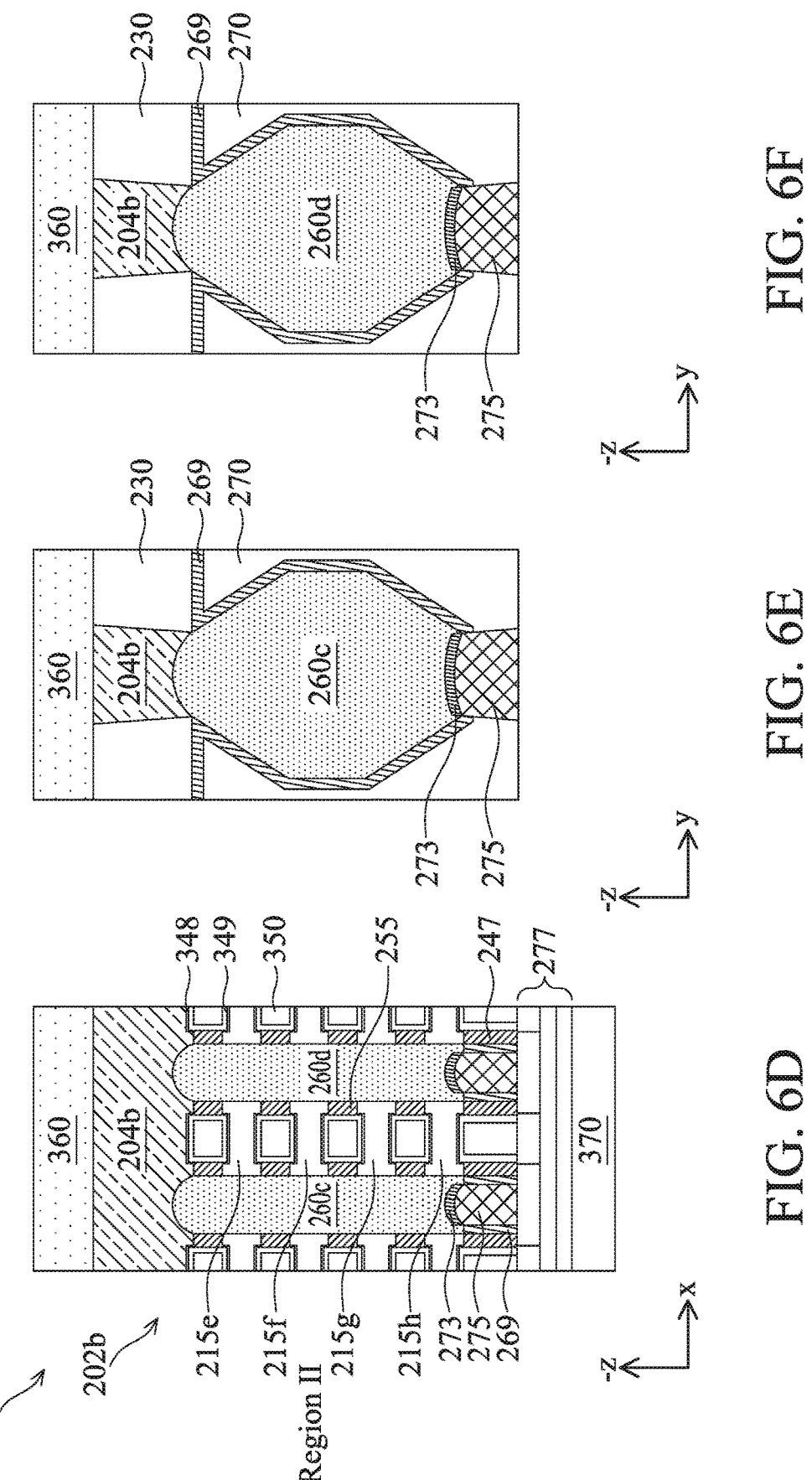

At operation 14, the method 10 (FIG. 1A) flips the device 200 upside down and attaches the frontside of the device 200 to a carrier 370, such as shown in FIGS. 4A and 4D. This makes the device 200 accessible from the backside of the device 200 for further processing. The operation 14 may use any suitable attaching processes, such as direct bonding, hybrid bonding, using adhesive, or other bonding methods. The operation 14 may further include alignment, annealing, and/or other processes. The carrier 370 may be a silicon wafer in some embodiments. In FIGS. 3A-22F, the "z"

direction points from the backside of the device 200 to the frontside of the device 200, while the "−z" direction points from the frontside of the device 200 to the backside of the device 200.

At operation 16, the method 10 (FIG. 1A) thins down the device 200 from the backside of the device 200 until the fins 204 and the isolation structure 230 are exposed from the backside of the device 200. The resultant structure is shown in FIGS. 5A-5F according to an embodiment. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 18, the method 10 (FIG. 1A) forms an etch mask 360 over the backside of the device 200. The etch mask 360 provides openings 362 over the backside of one of the S/D features 260 that is to be recessed from the backside of the device 200. The resultant structure is shown in FIGS. 6A-6F according to an embodiment. In the illustrated embodiment, the opening 362 is provided over the backside of the source feature 260a while the drain feature 260b and the region II are covered by the etch mask 360. In various embodiments, the openings 362 may be provided over the backside of drain features only, source features only, or both source and drain features. The etch mask 360 includes a material that is different than a material of the fin 204a to achieve etching selectivity during backside trench etching. For example, the etch mask 360 includes a resist material (and thus may be referred to as a patterned resist layer and/or a patterned photoresist layer). In some embodiments, the etch mask 360 has a multi-layer structure, such as a resist layer disposed over an anti-reflective coating (ARC) layer and/or a hard mask layer comprising silicon nitride or silicon oxide. The present disclosure contemplates other materials for the etch mask 360, so long as etching selectivity is achieved during the etching of the fin 204a. In some embodiments, operation 18 uses a lithography process that includes forming a resist layer over the backside of the device 200 (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer (e.g., the etch mask 360) includes a resist pattern that corresponds with the mask. Alternatively, the exposure process can be implemented or replaced by other methods, such as maskless lithography, e-beam writing, ion-beam writing, or combinations thereof.

Figures 7A, 7B, 7C:
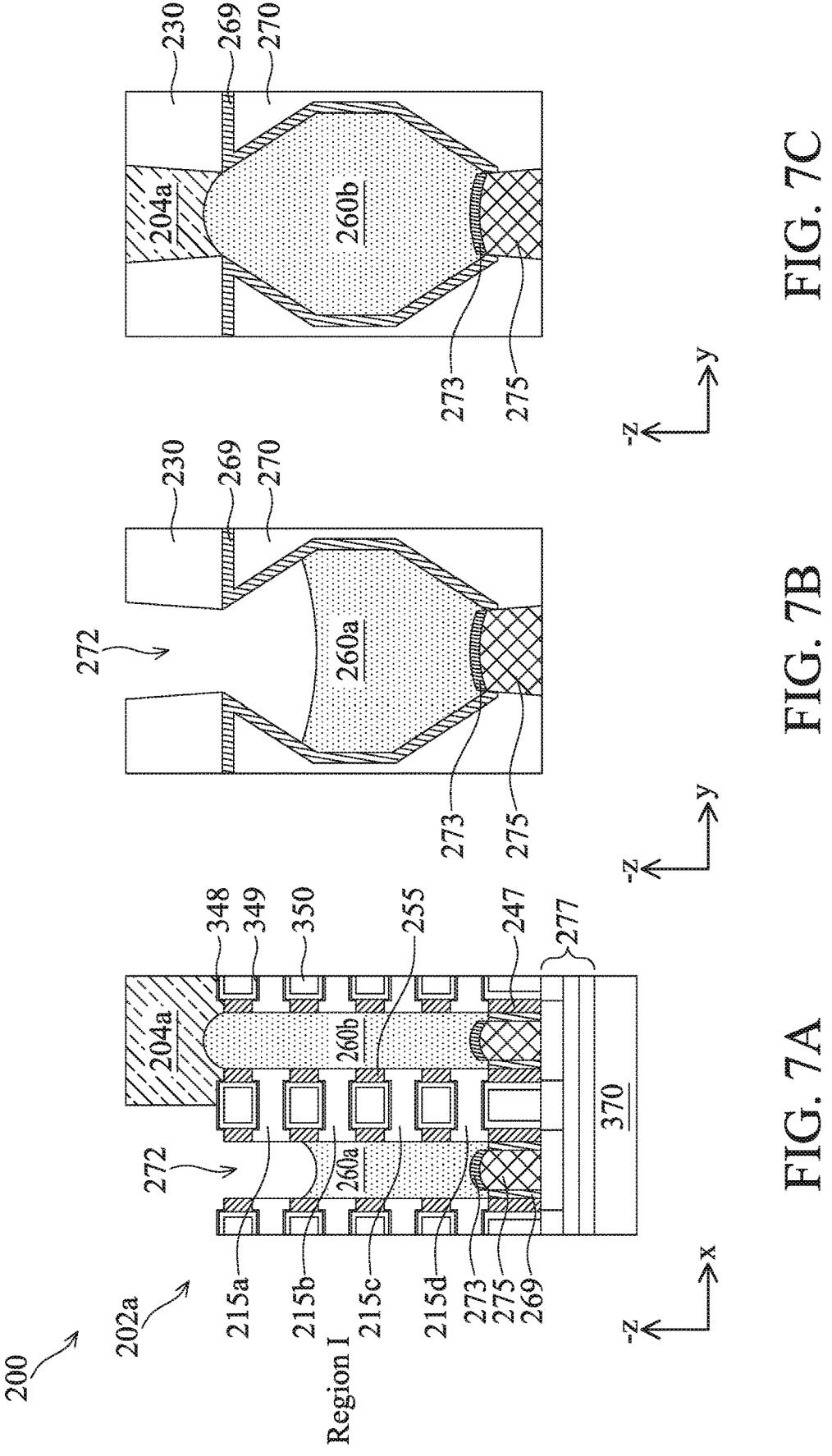
Figures 7D, 7E, 7F:
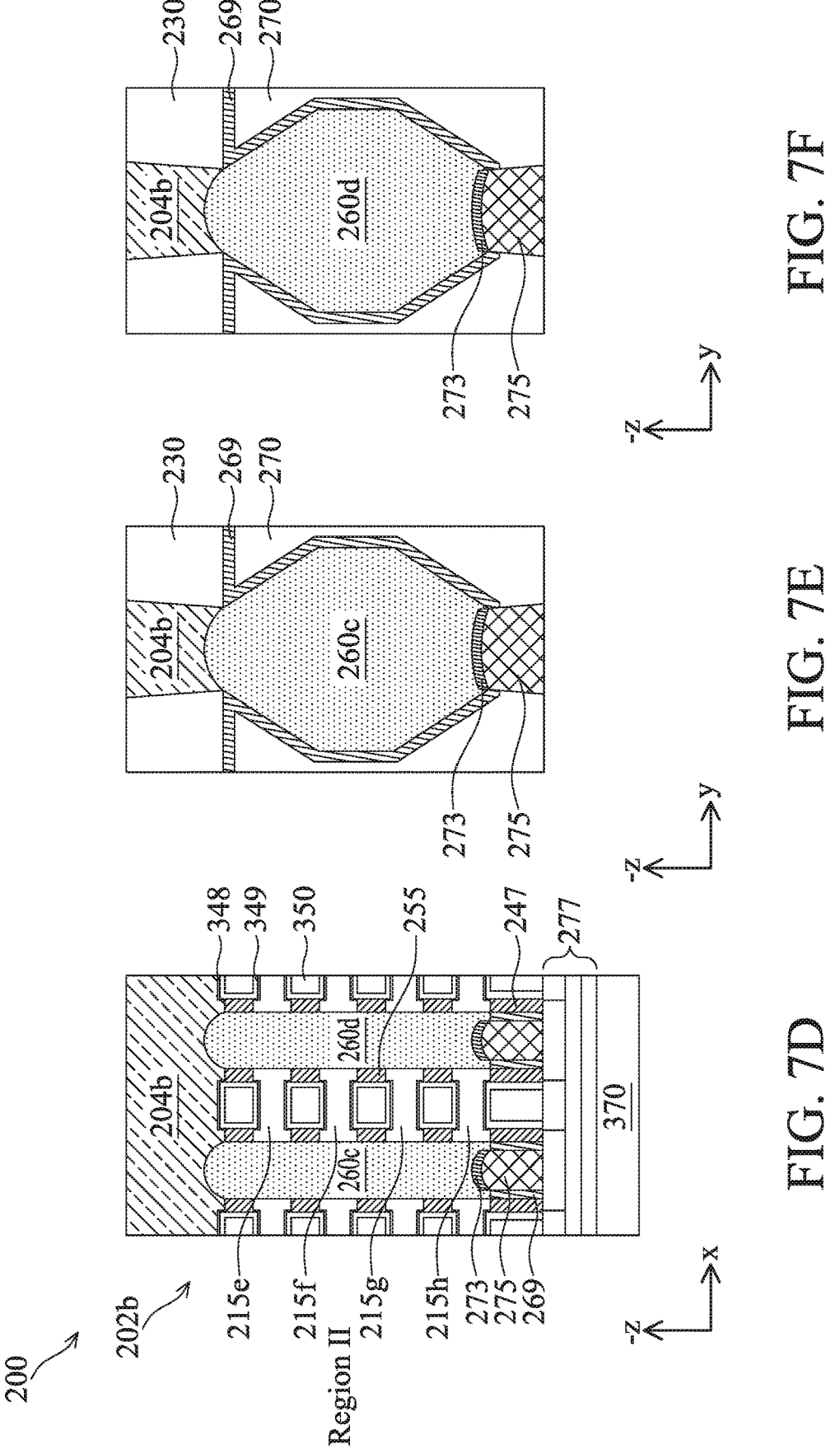
Figures 8A, 8B, 8C:
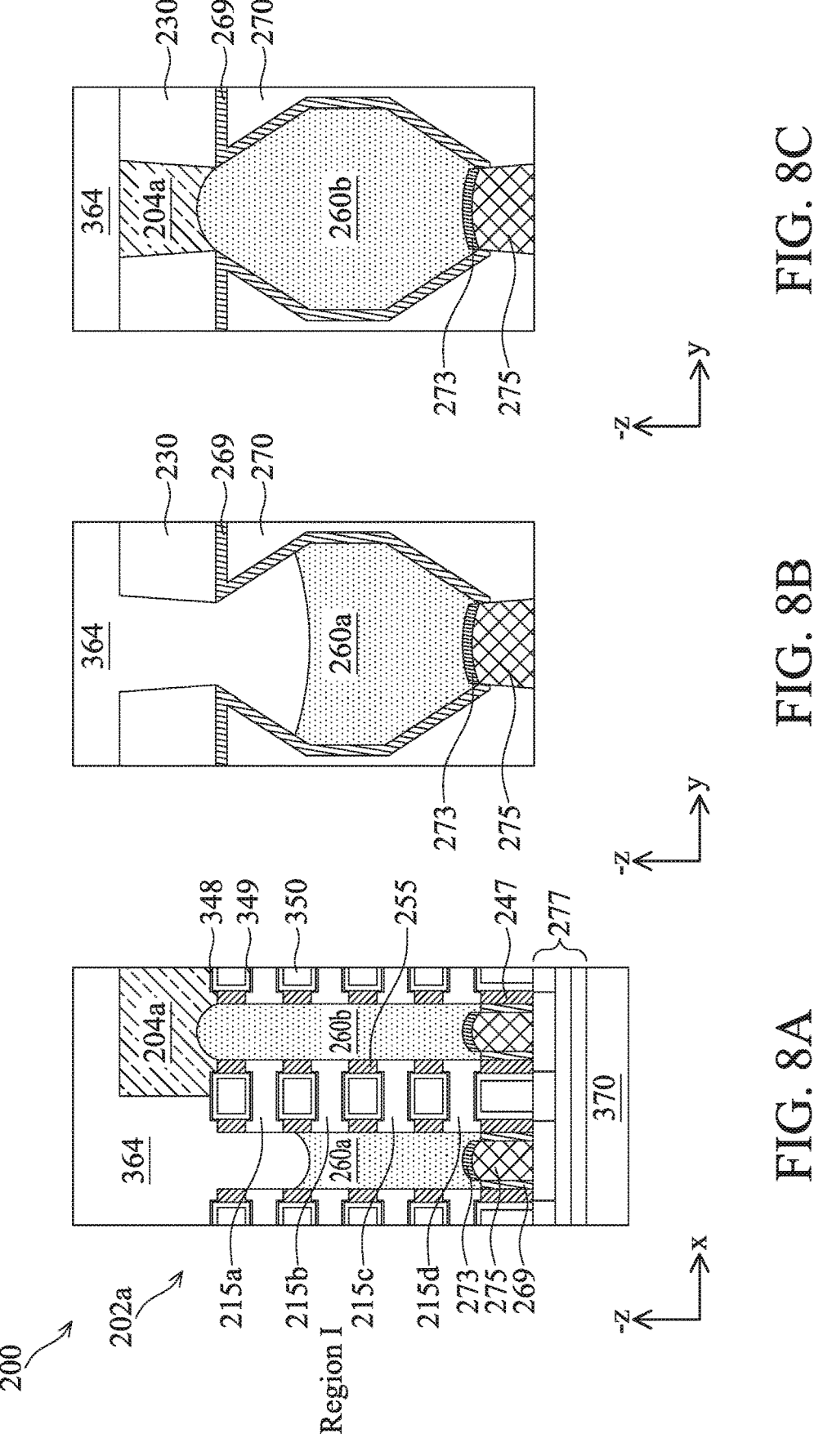
Figures 8D, 8E, 8F:
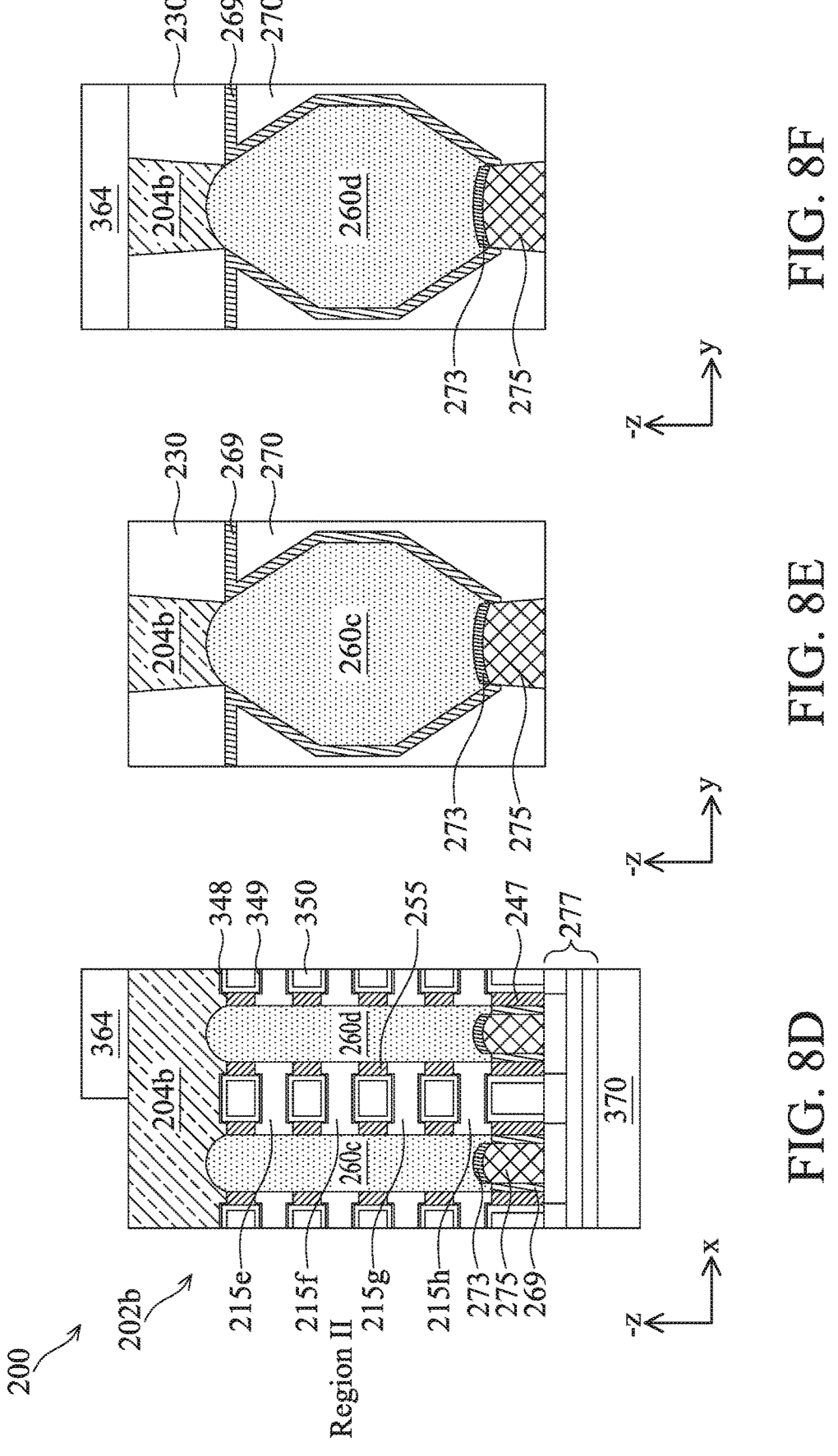

At operation 20, the method 100 (FIG. 1A) etches the fin 204a through the etch mask 360 to form an S/D trench 272. The etch mask 360 is subsequently removed, for example, by a resist stripping process or other suitable process. The S/D trench 272 exposes surfaces of the source feature 260a from the backside. The resultant structure is shown in FIGS. 7A-7F according to an embodiment. In the present embodiment, the operation 20 applies an etching process that is tuned to be selective to the materials of the semiconductor material (e.g. silicon) in the fin 204a and with no (or minimal) etching to the gate stacks 240, the isolation structure 230, the inner spacers 255, and the CESL 269. In the present embodiment, the etching process also etches the source feature 260a to recess it to a level that is below the bottommost channel layer 215a. A terminal end of the bottommost channel layer 215a is exposed in the trench 272. The recessed source feature 260a becomes having no contact with the bottommost channel layer 215a, as illustrated in FIG. 7A. It is noted that the source feature 260a is recessed below one (1) channel layer in the illustrated embodiment, which is for illustrative purposes only and not intended to be limiting beyond what is specifically recited in the claims. It can be appreciated that the source feature 260a can be recessed below more than one channel layer, depending on device performance needs. The recessing depth of the source feature 260a ranges from about 10 nm to about 30 nm for each channel layer thereabove. The operation 20 may apply more than one etching processes. For example, it may apply a first etching process to selectively remove the fin 204a, and then apply a second etching process to selectively recess the source feature 260a to the desired level, where the first and the second etching processes use different etching parameters such as using different etchants. The etching process(es) can be dry etching, wet etching, reactive ion etching, or other etching methods. In some embodiments, the etching of the source feature 260a includes an dry etch process that implements an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching time may last for about 10 seconds to about 50 seconds to recess the source feature 260a below one channel layer.

At operation 22, the method 10 (FIG. 1A) forms an etch mask 364 over the backside of the device 200. The etch mask 364 provides openings 366 over the backside of one of the S/D features 260 that is to be recessed from the backside of the device 200. The resultant structure is shown in FIGS. 8A-8F according to an embodiment. In the illustrated embodiment, the opening 366 is provided over the backside of the source feature 260c while the drain feature 260d and the region I are covered by the etch mask 364. The S/D trench 272 in the region I is also filled by the resist material of the etch mask 364. In various embodiments, the openings 366 may be provided over the backside of drain features only, source features only, or both source and drain features. The etch mask 364 includes a material that is different than a material of the fin 204b to achieve etching selectivity during backside trench etching. For example, the etch mask 364 includes a resist material (and thus may be referred to as a patterned resist layer and/or a patterned photoresist layer). In some embodiments, the etch mask 364 includes material composition substantially similar to the etch mask 360 and the forming of the etch mask 364 and the opening 366 is similar to the operation 18.

Figures 9A, 9B, 9C:
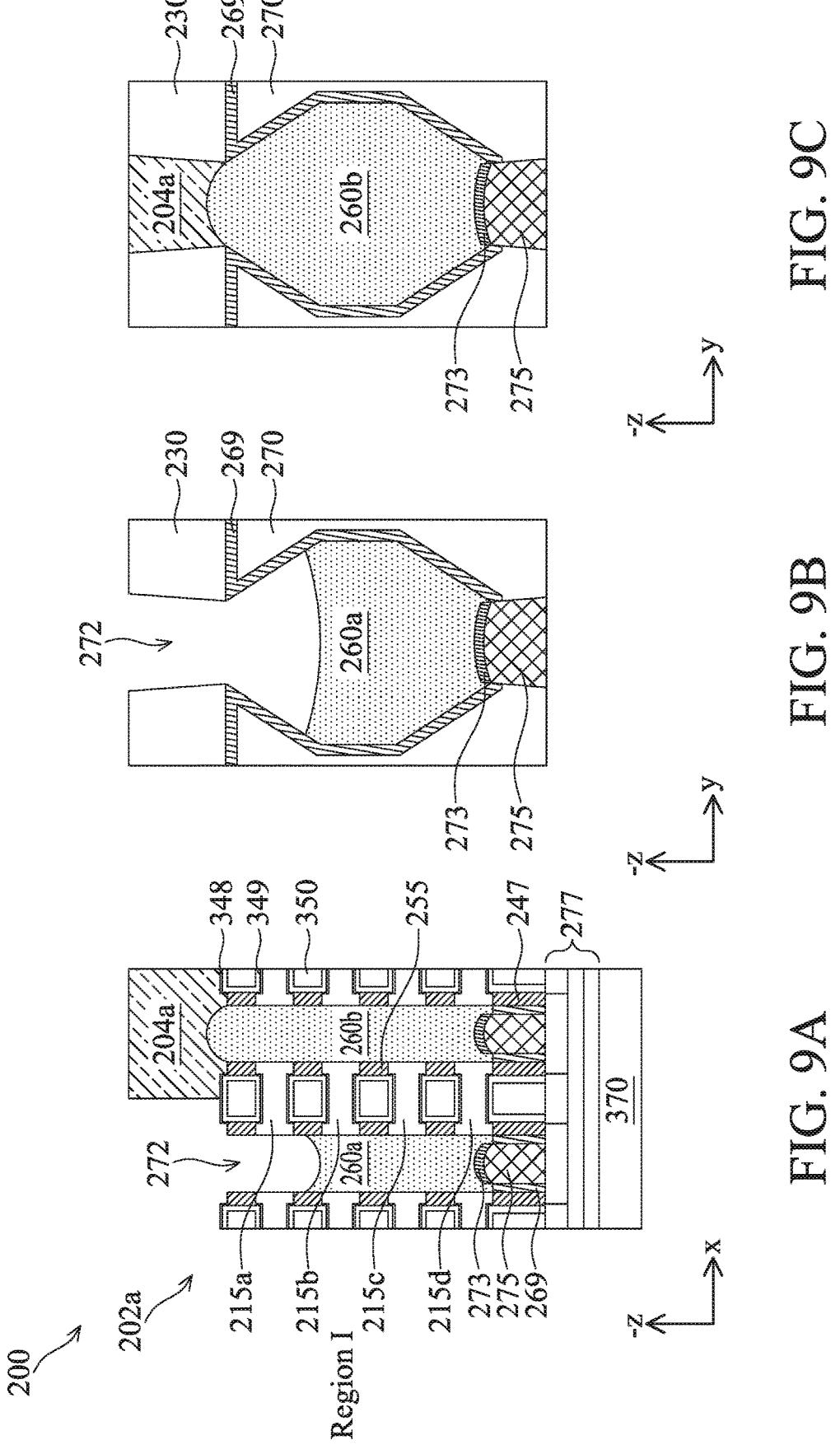
Figures 9D, 9E, 9F:
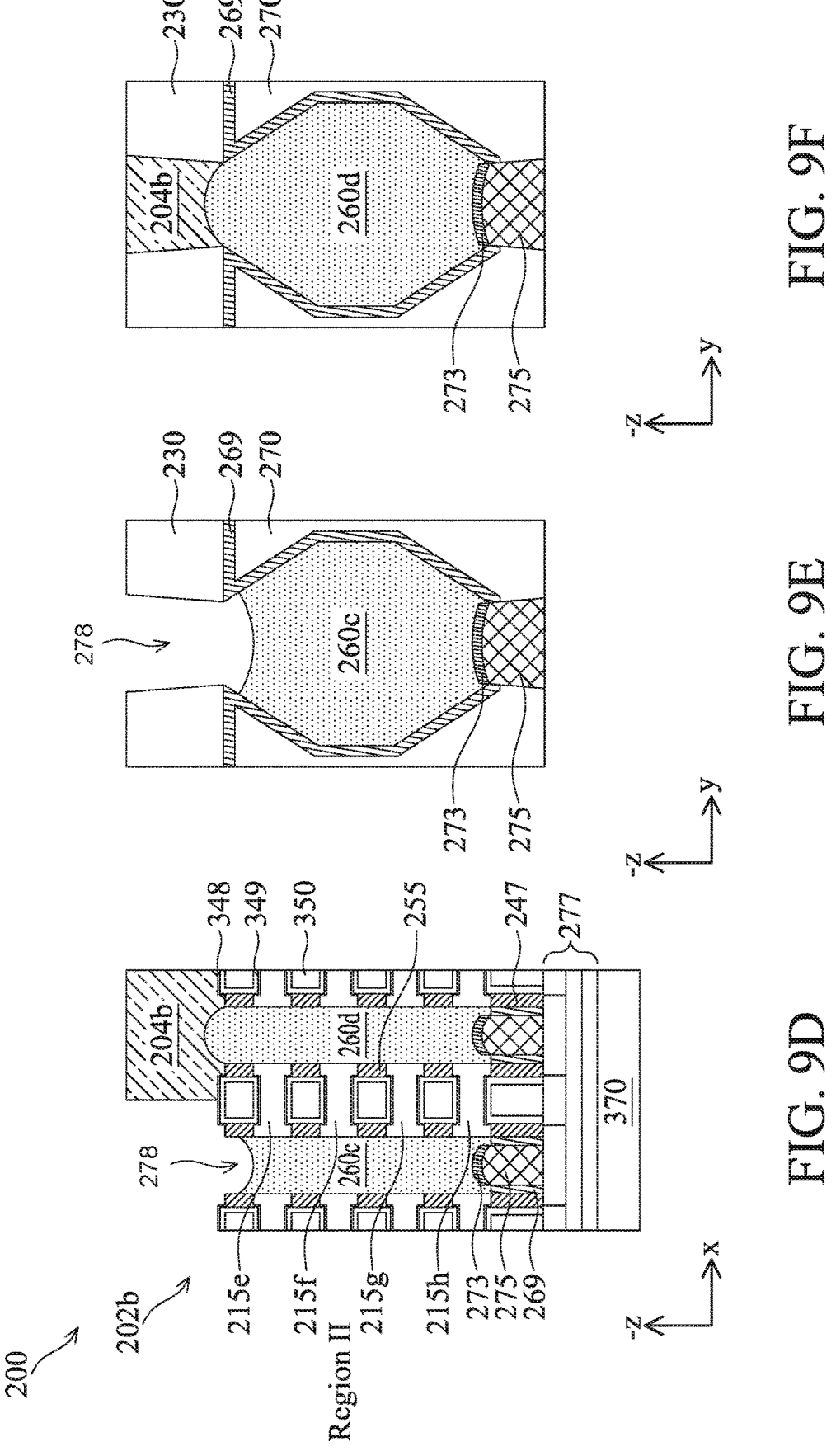
Figures 10A, 10B, 10C:
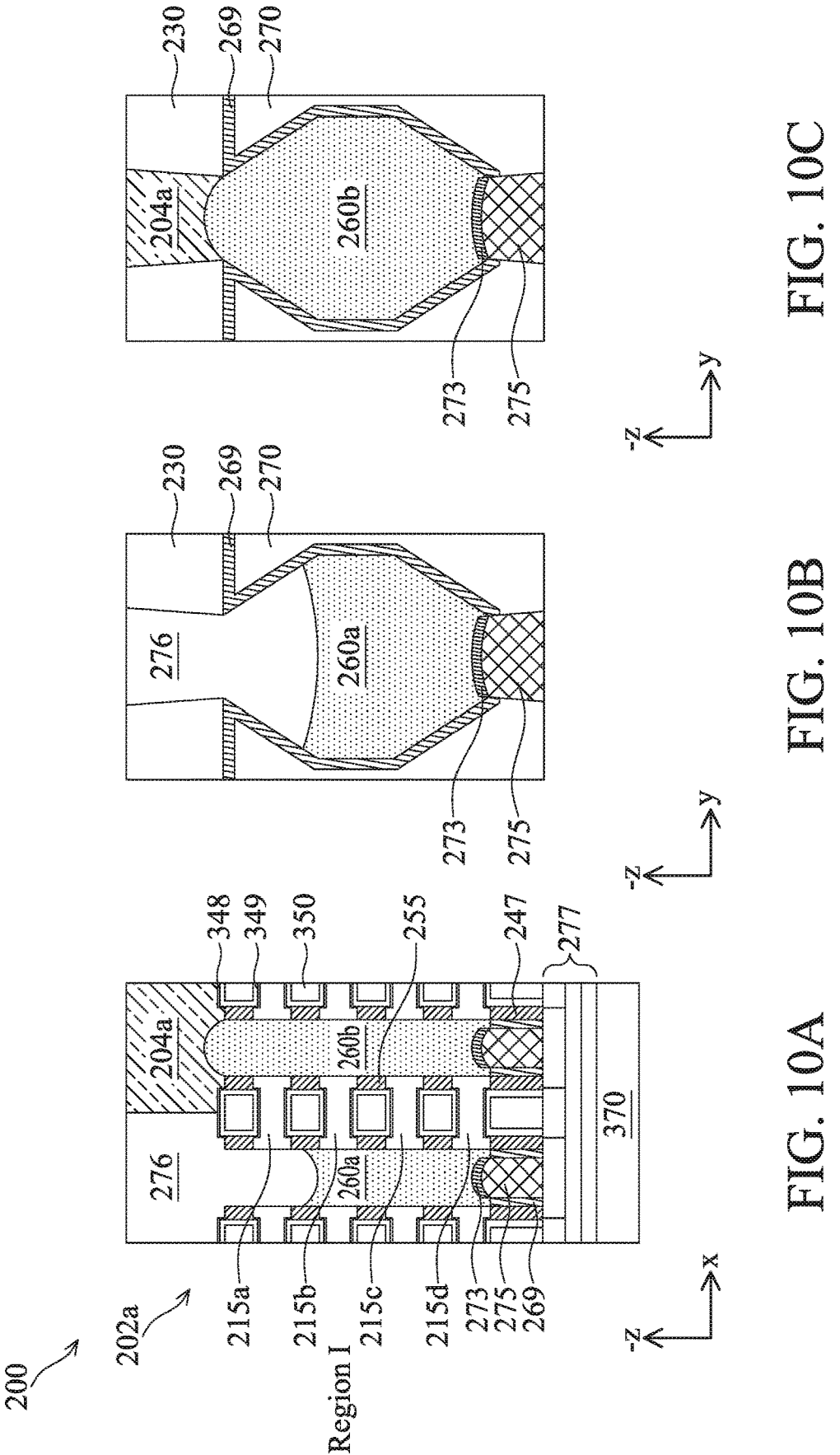
Figures 10D, 10E, 10F:
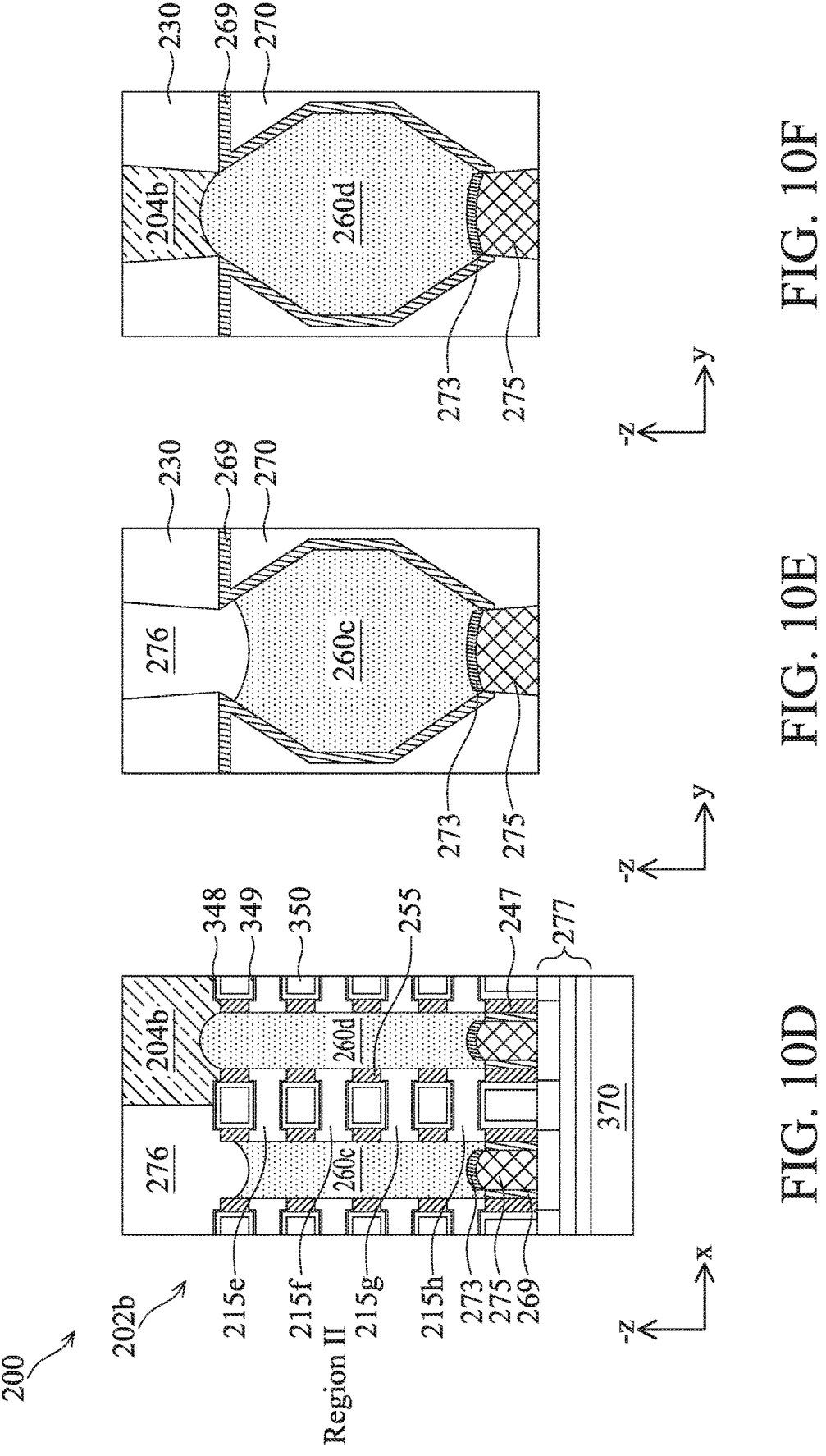

At operation 24, the method 100 (FIG. 1B) etches the fin 204b through the etch mask 364 to form an S/D trench 278 in the region II. The S/D trench 273 in the region II exposes surfaces of the source feature 260c from the backside. The etch mask 364 is subsequently removed, for example, by a resist stripping process or other suitable process. The S/D trench 272 in the region I reappears after the removal of the etch mask 364. The resultant structure is shown in FIGS. 9A-9F according to an embodiment. In the present embodiment, the operation 24 applies an etching process that is tuned to be selective to the materials of the semiconductor material (e.g. silicon) in the fin 204b and with no (or minimal) etching to the gate stacks 240, the isolation structure 230, the inner spacers 255, and the CESL 269. In the present embodiment, the etching process also etches the source feature 260c to recess it to a level that is even with or below an interface between the isolation structure 230 and the CESL 269. The recessed source feature 260c remains higher than the bottommost channel layer 215e, such that the recessed source feature 260c is still in contact with the bottommost channel layer 215e and the bottommost inner spacer 255, as illustrated in FIG. 9D. The operation 24 may apply more than one etching processes. For example, it may apply a first etching process to selectively remove the fin 204b, and then apply a second etching process to selectively recess the source feature 260c to the desired level, where the first and the second etching processes use different etching parameters such as using different etchants. The etching process(es) can be dry etching, wet etching, reactive ion etching, or other etching methods.

At operation 26, the method 10 (FIG. 1B) deposits a dielectric layer 276 with one or more dielectric materials to fill both the S/D trenches 272 and 278 in the regions I and II. The resultant structure is shown in FIGS. 10A-10F. The dielectric layer 276 covers the otherwise exposed terminal end of the bottommost channel layer 215a. In some embodiments, the dielectric layer 276 may include one or more of La2O3, Al2O3, SiOCN, SiOC, SiCN, SiO2, SiC, ZnO, ZrN, Zr2Al3O9, TiO2, TaO2, ZrO2, HfO2, Si3N4, Y2O3, AlON, TaCN, ZrSi, or other suitable material(s), and may be formed by PE-CVD, F-CVD or other suitable methods. The operation 26 may further perform a CMP process to the dielectric layer 276 to remove excessive dielectric materials from the backside of the device 200 and expose the fins 204 and the isolation structure 230.

Figures 11A, 11B, 11C:
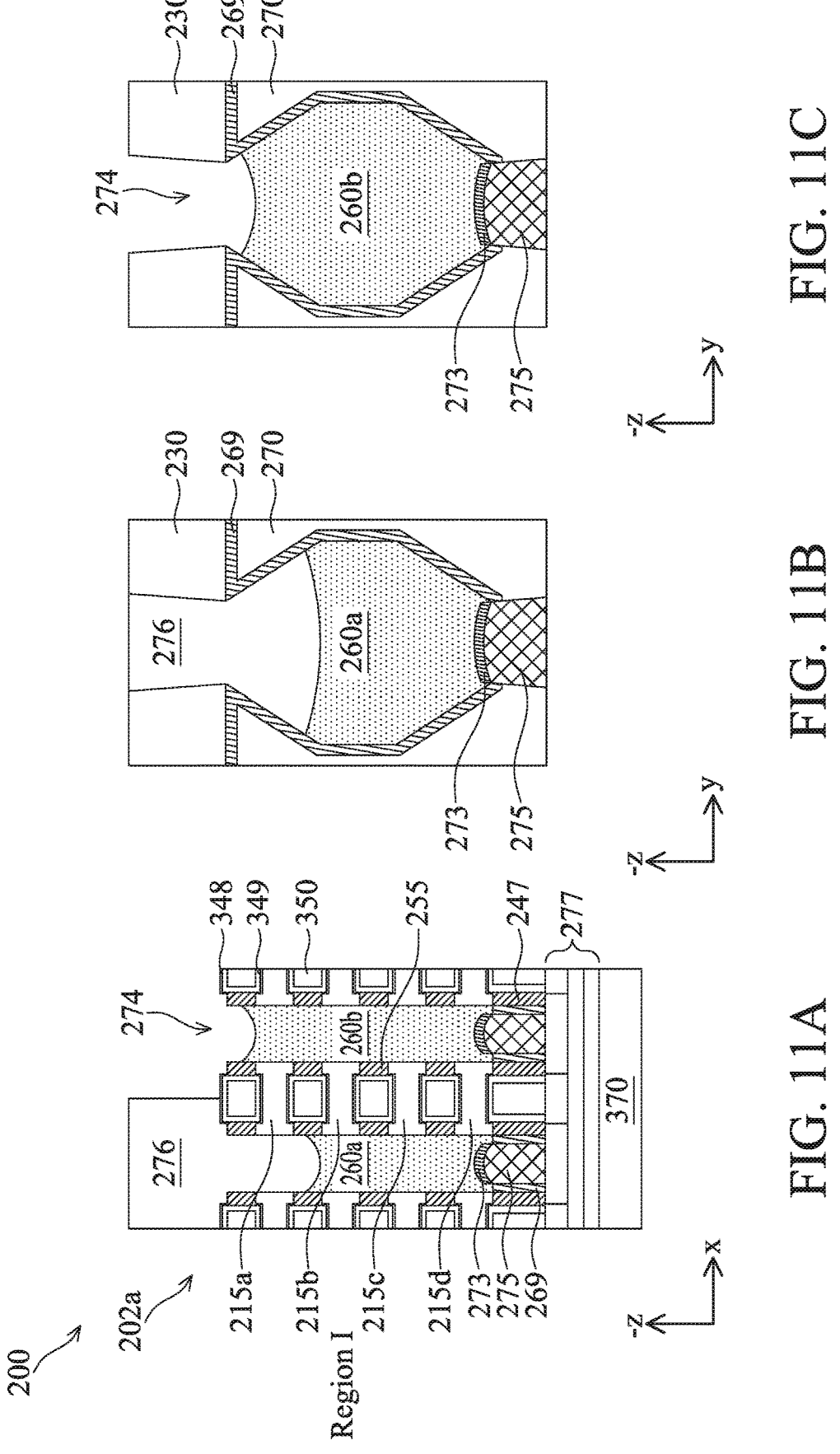
Figures 11D, 11E, 11F:
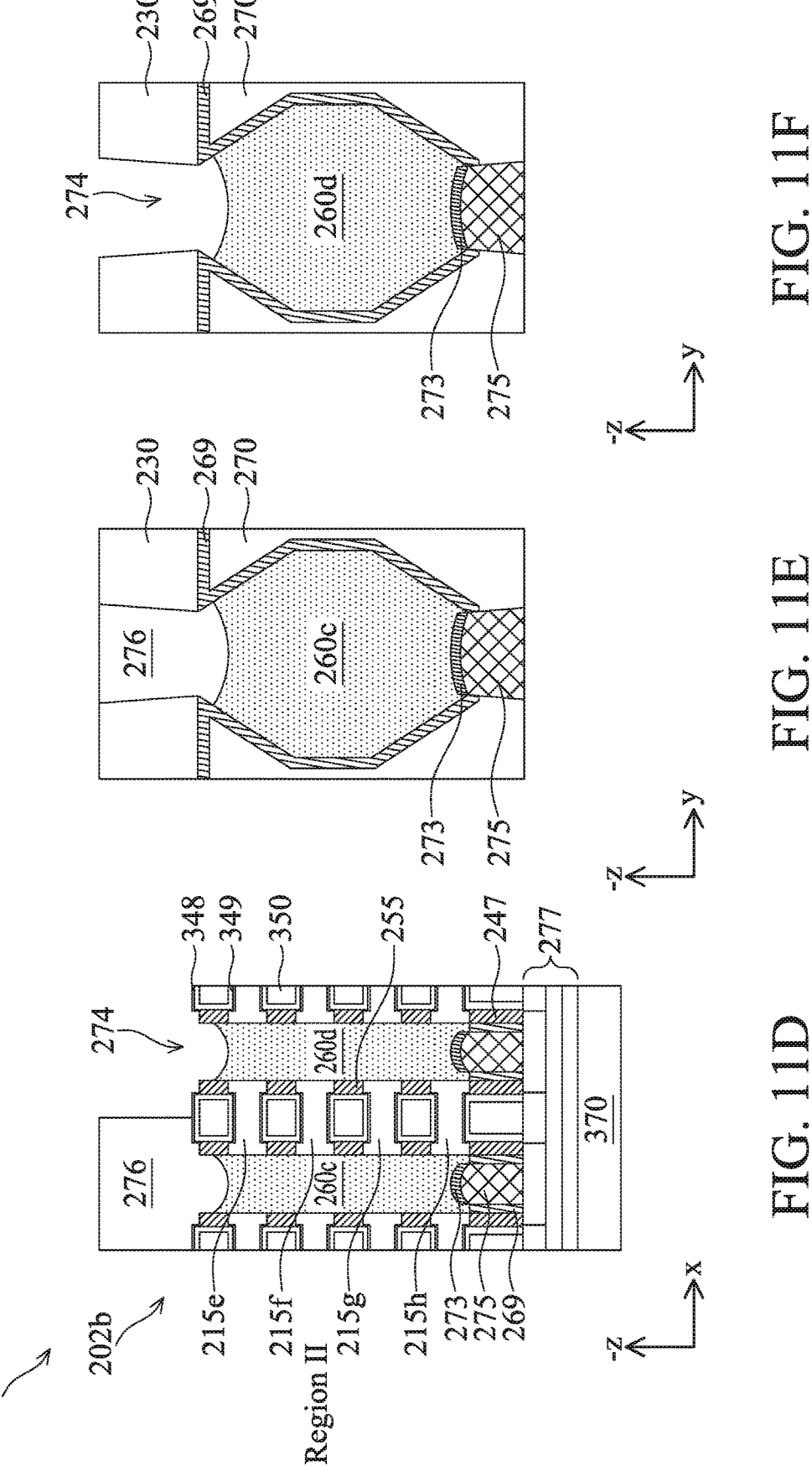
Figures 12A, 12B, 12C:
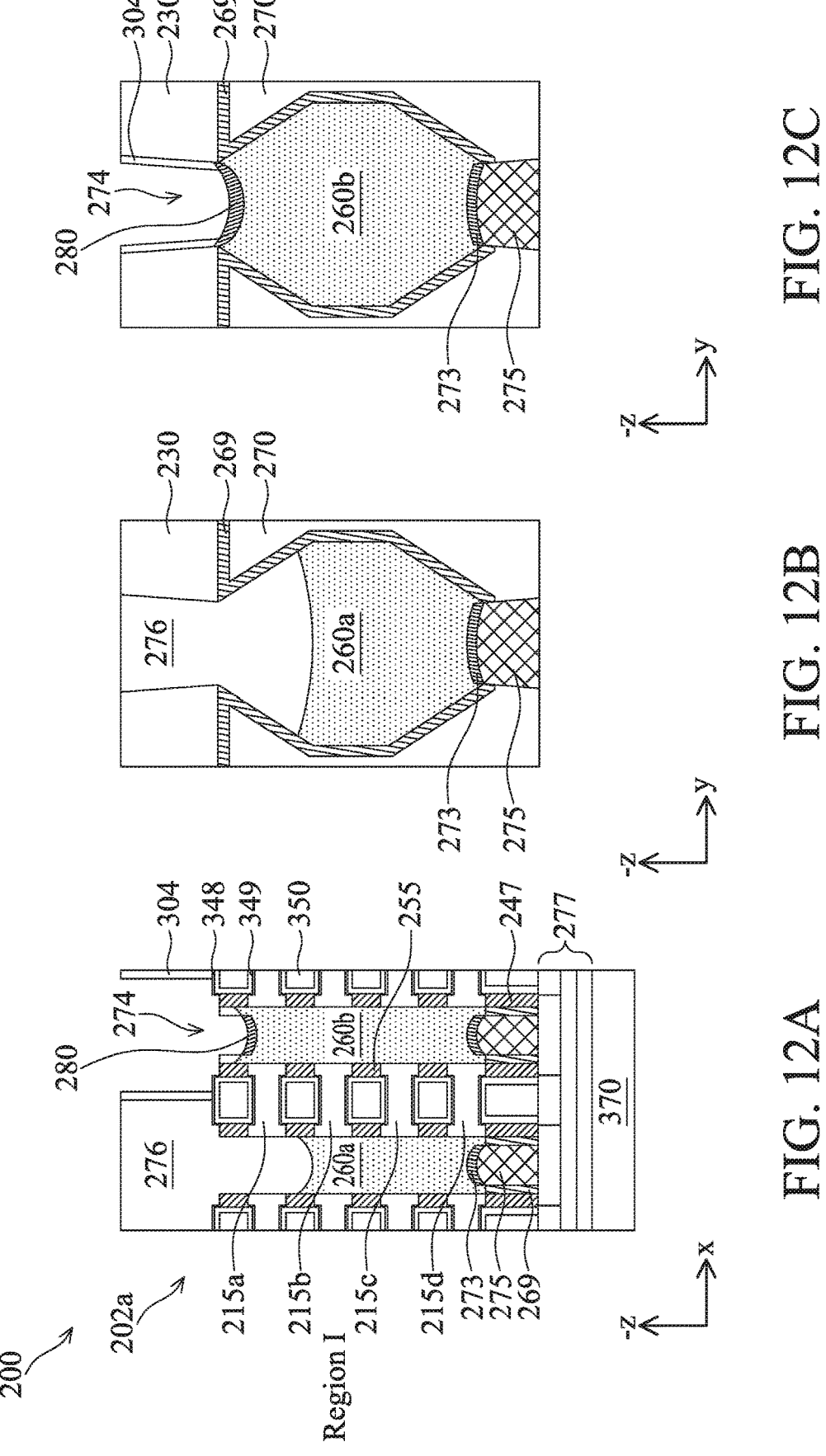
Figures 12D, 12E, 12F:
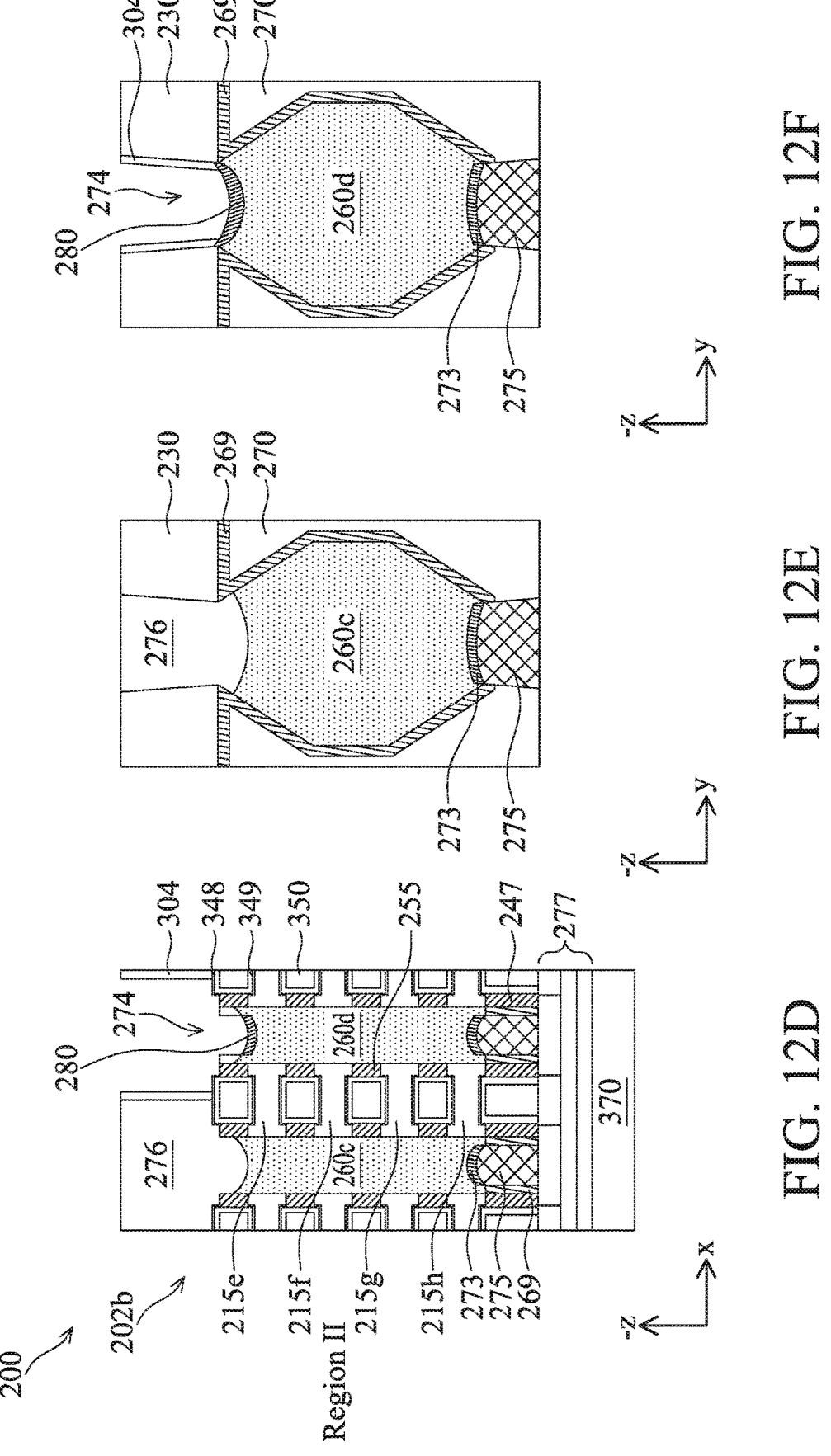
Figures 13A, 13B, 13C:
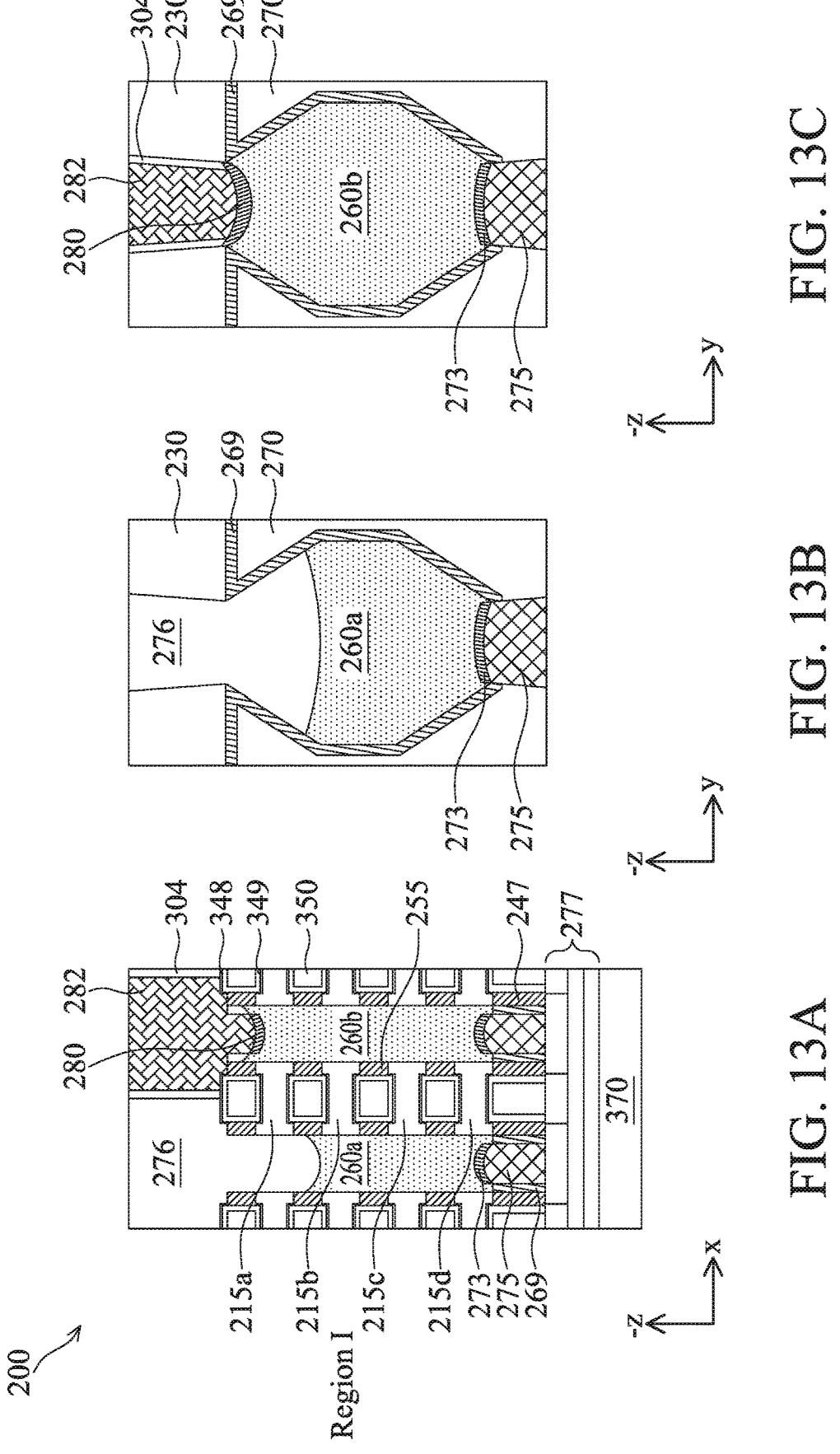
Figures 13D, 13E, 13F:
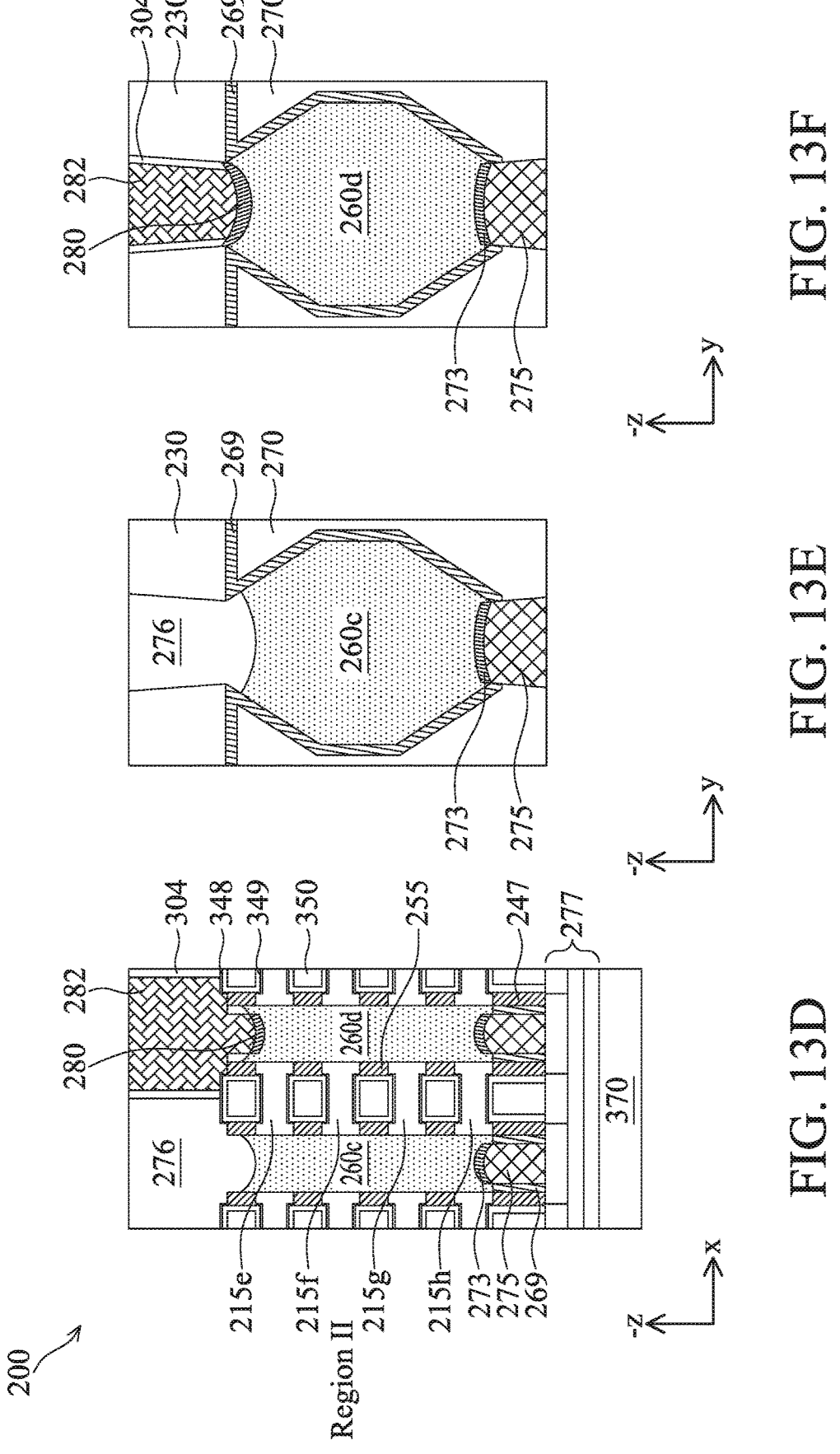

At operation 28, the method 10 (FIG. 1B) selectively etches the fins 204 to form S/D trenches 274 over the backside of the gate stacks 240 and the drain features 260b and 260d, respectively. The S/D trenches 274 expose surfaces of the drain features 260b and 260d from the backside. The resultant structure is shown in FIGS. 11A-11F according to an embodiment. In the present embodiment, the operation 28 applies an etching process that is tuned to be selective to the materials of the semiconductor material (e.g. silicon) in the fins 204 and with no (or minimal) etching to the gate stacks 240, the isolation structure 230, the inner spacers 255, and the CESL 269. In the present embodiment, the etching process also etches the drain features 260b and 260d to recess them to a level that is even with or below an interface between the isolation structure 230 and the CESL 269. The recessed drain feature 260b remains higher than the bottommost channel layer 215a, such that the recess drain feature 260b is still in contact with the bottommost channel layer 215a and the bottommost inner spacer 255; the recessed drain feature 260d remains higher than the bottommost channel layer 215e, such that the recessed drain feature 260d is still in contact with the bottommost channel layer 215e and the bottommost inner spacer 255, as illustrated in FIGS. 11A and 11D. The operation 28 may apply more than one etching processes. For example, it may apply a first etching process to selectively remove the fins 204, and then apply a second etching process to selectively recess the drain features 260b and 260d to the desired level, where the first and the second etching processes use different etching parameters such as using different etchants. The etching process(es) can be dry etching, wet etching, reactive ion etching, or other etching methods.

At operation 30, the method 10 (FIG. 1B) deposits a dielectric liner 304 on the sidewalls of the S/D trenches 274 from the backside of the device 200, such as shown in FIGS. 12A-12F according to an embodiment. In the illustrated embodiment, the operation 30 first conformally deposits the dielectric liner 304 to have a substantially uniform thickness along the various surfaces of the dielectric layer 276, the isolation structure 230, the gate stack 240 (i.e., the interfacial layer 348), the inner spacers 255, and the drain features 260b and 260d. In various embodiment, the dielectric liner 304 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). In some embodiments, the dielectric liner 304 includes the same material composition with the dielectric layer 276. The dielectric liner 304 may be deposited using ALD, CVD, or other suitable methods, and may have a thickness of about 1 nm to about 5 nm in various embodiments. Subsequently, the operation 30 performs an etching process for breaking through, and removing the majority of, the horizontal portions of the dielectric liner 304. The etching process is also referred to as a breakthrough etching process. In some embodiments, the breakthrough etching process may include an anisotropic dry etch process, or the like. In some embodiments where the dielectric liner 304 is formed of an oxide compound, the breakthrough etch process is a reactive ion etch (RIE) process with etch process gases including $CHF_3$, Ar, $CF_4$, $N_2$, $O_2$, $CH_2F_2$, $SF_3$, the like, or a combination thereof. The RIE process may be performed for an etch time between about 2 seconds and about 20 seconds, at a pressure between about 2 mTorr and about 30 mTorr, a temperature between about 10° C. and about 100° C., a radio frequency (RF) power between about 100 W and about 1500 W, and a voltage bias between about 10 V and about 800 V. In the illustrated embodiment, as a result of the operation 30, portions of the dielectric liner 304 remain on sidewalls of the dielectric layer 276, the isolation structure 230, and the inner spacers 255, while top surfaces of the gate stacks 240 (i.e., the interfacial layer 348), the inner spacers 255, and the drain features 260b and 260d are exposed in the S/D trenches 274.

At operation 32, the method 10 (FIG. 1B) forms silicide features 280 in the S/D trenches 274 over the drain features 260b and 260d. The resultant structure is shown in FIGS. 12A-12F according to an embodiment. In an embodiment, the operation 32 first deposits one or more metals into the S/D trenches 274, performing an annealing process to the device 200 to cause reaction between the one or more metals and the drain features 260b and 260d to produce the silicide features 280, and removing un-reacted portions of the one or more metals, leaving the silicide features 280 in the S/D trenches 274. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds.

At operation 34, the method 10 (FIG. 1B) forms S/D contacts 282 in the S/D trenches 274 over the silicide features 280 in the regions I and II. The resultant structure is shown in FIG. 13A-13F. In an embodiment, the S/D contacts 282 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 282.

The dielectric liner 304 serves as a dielectric barrier layer preventing the metallic material in the subsequently-formed S/D contacts from diffusing into the dielectric layer 276. In some alternative embodiments, at operation 26, the method 10 may deposit a barrier layer 279 in the S/D trenches 272 (FIGS. 9A-9F) prior to the depositing of the dielectric layer 276 in forming a bi-layer isolation feature between the dielectric layer 276 and the S/D contact 282. The resultant structure after operation 34 is shown in FIGS. 14A-14F. The bi-layer isolation feature includes the barrier layer 279 and the dielectric liner 304. The bi-layer isolation feature provides better isolation between the subsequently-formed S/D contacts and the dielectric layer 276. Further, the barrier layer 279 prevents the covered epitaxial structure from being oxidized. The barrier layer 279 is conformally deposited in the S/D trenches 272 in the illustrated embodiment. In some embodiments, the barrier layer 279 includes $SiO_2$, SiN, SiCN, SiOCN, SiOC, combinations thereof, or other suitable material(s), and the dielectric liner 304 includes SiN, SiCN, SiOCN, combinations thereof, or other suitable material(s). In furtherance of the embodiments, the barrier layer 279 and the dielectric liner 304 may include different dielectric materials. The barrier layer 279 may be deposited using ALD, CVD, or other suitable methods, and may have a thickness of about 1 nm to about 5 nm in various embodiments.

Figures 14A, 14B, 14C:
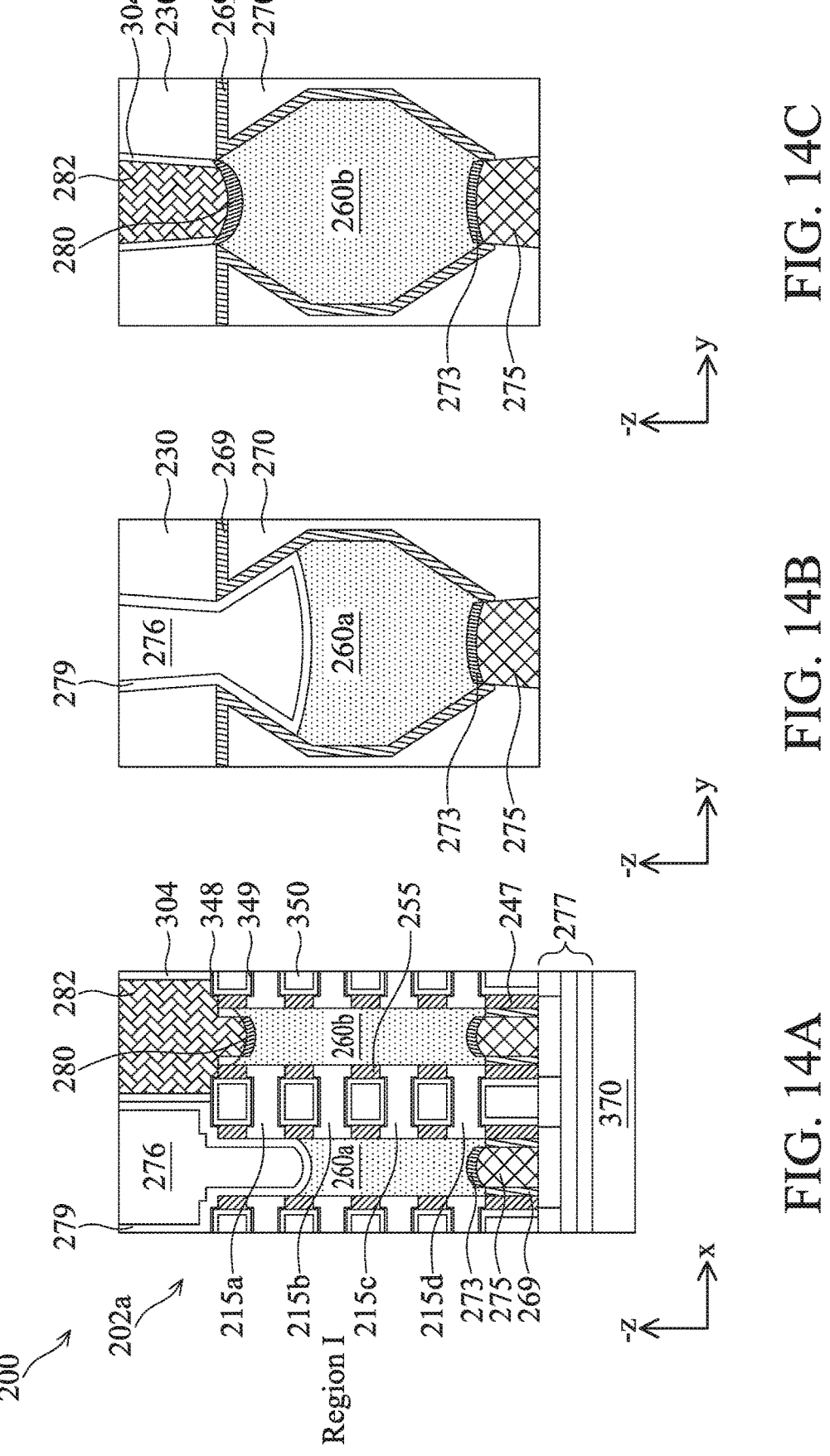
Figures 14D, 14E, 14F:
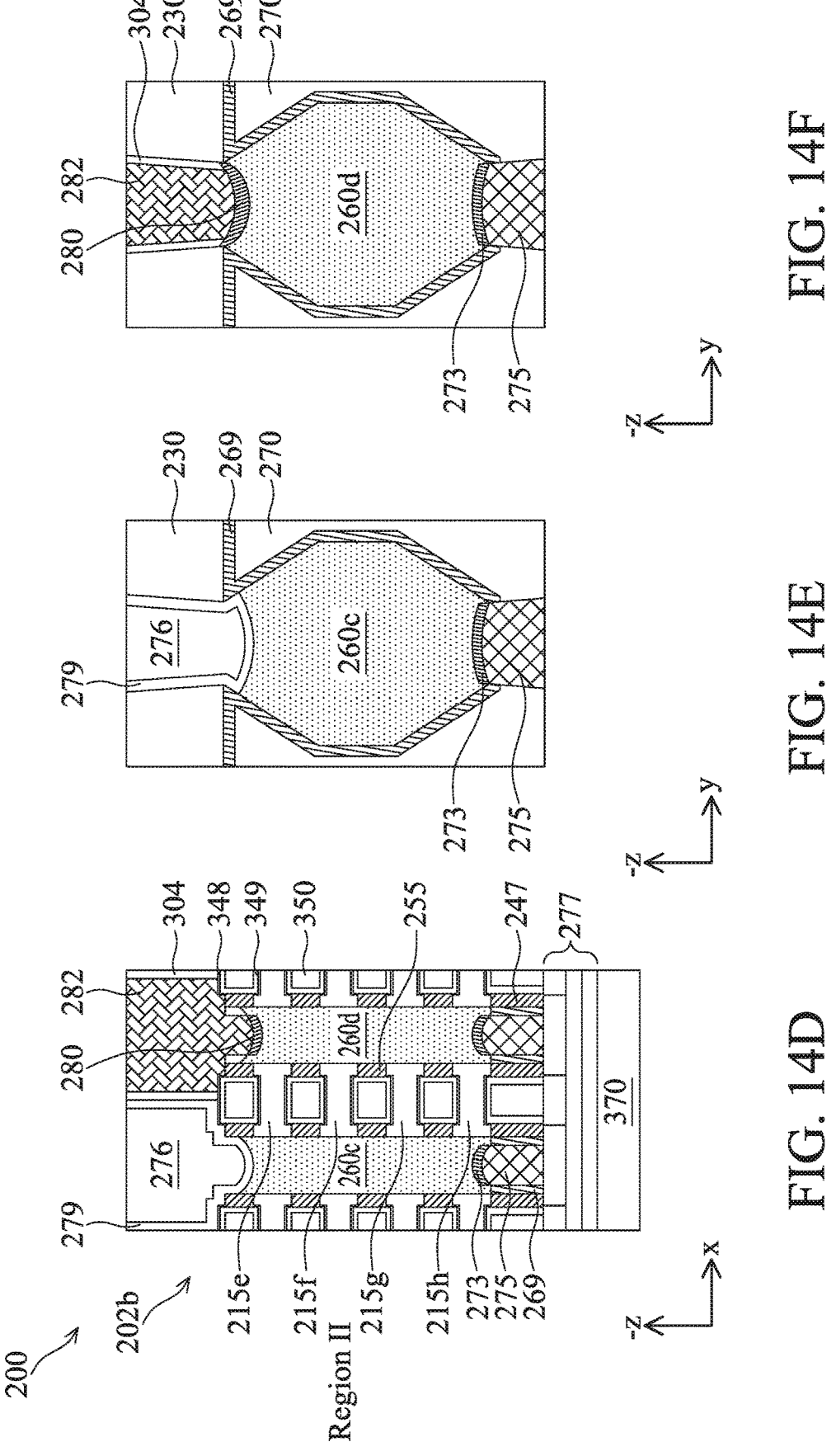
Figures 15A, 15B, 15C:
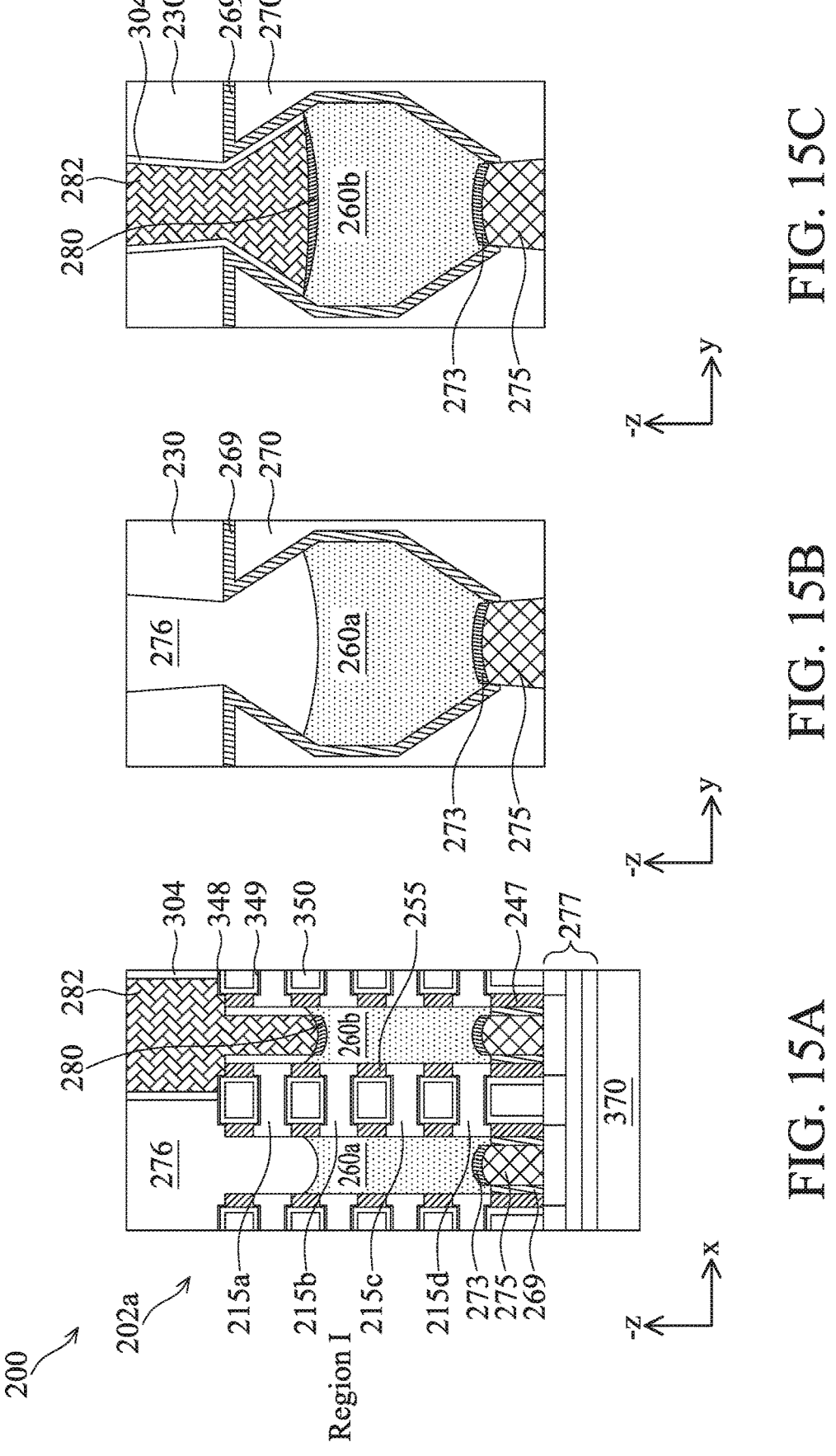
Figures 15D, 15E, 15F:
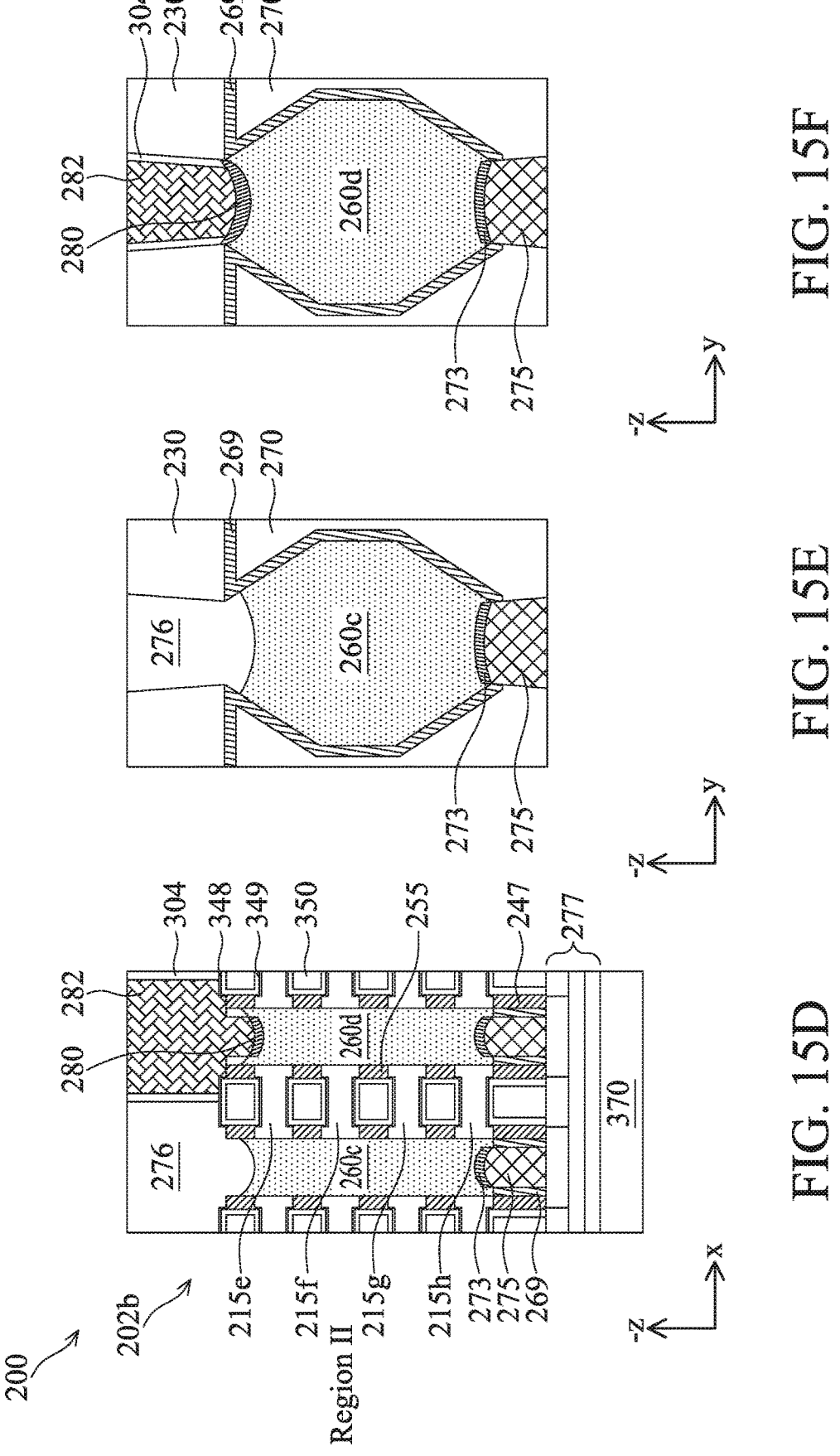
Figures 16A, 16B, 16C:
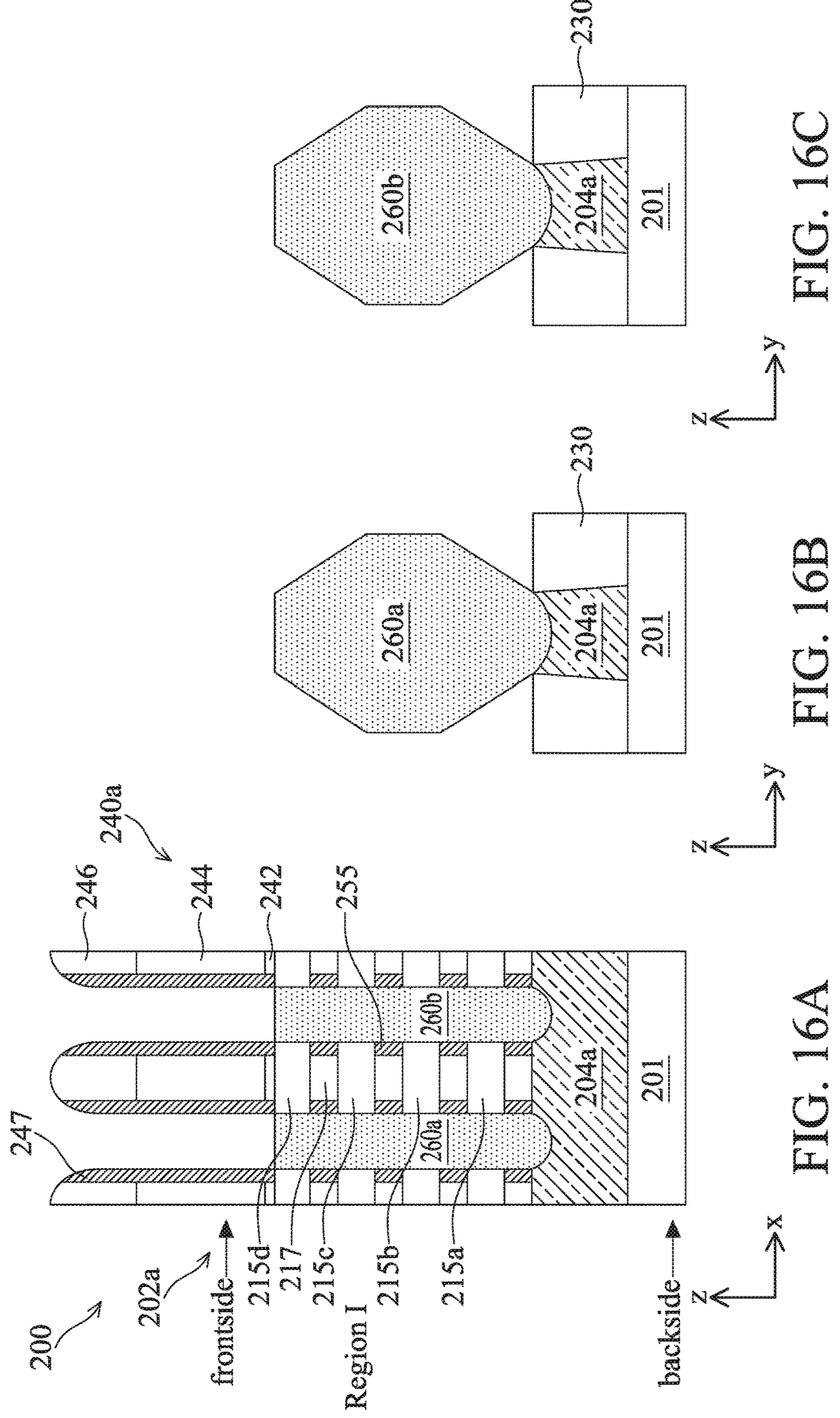
FIGS. 16A, 17A, 18A, 19A, 20A, 21A, and 22A illustrate cross-sectional views along the A-A line of the portion of the semiconductor device in FIG. 2 during fabrication processes according to the method of FIG. 1C, in accordance with some embodiments of the present disclosure.
FIGS. 16B, 17B, 18B, 19B, 20B, 21B, and 22B illustrate cross-sectional views along the B-B line of the portion of the semiconductor device in FIG. 2 during fabrication processes according to the method of FIG. 1C, in accordance with some embodiments of the present disclosure.
FIGS. 16C, 17C, 18C, 19C, 20C, 21C, and 22C illustrate cross-sectional views along the C-C line of the portion of the semiconductor device in FIG. 2 during fabrication processes according to the method of FIG. 1C, in accordance with some embodiments of the present disclosure.
Figures 16D, 16E, 16F:
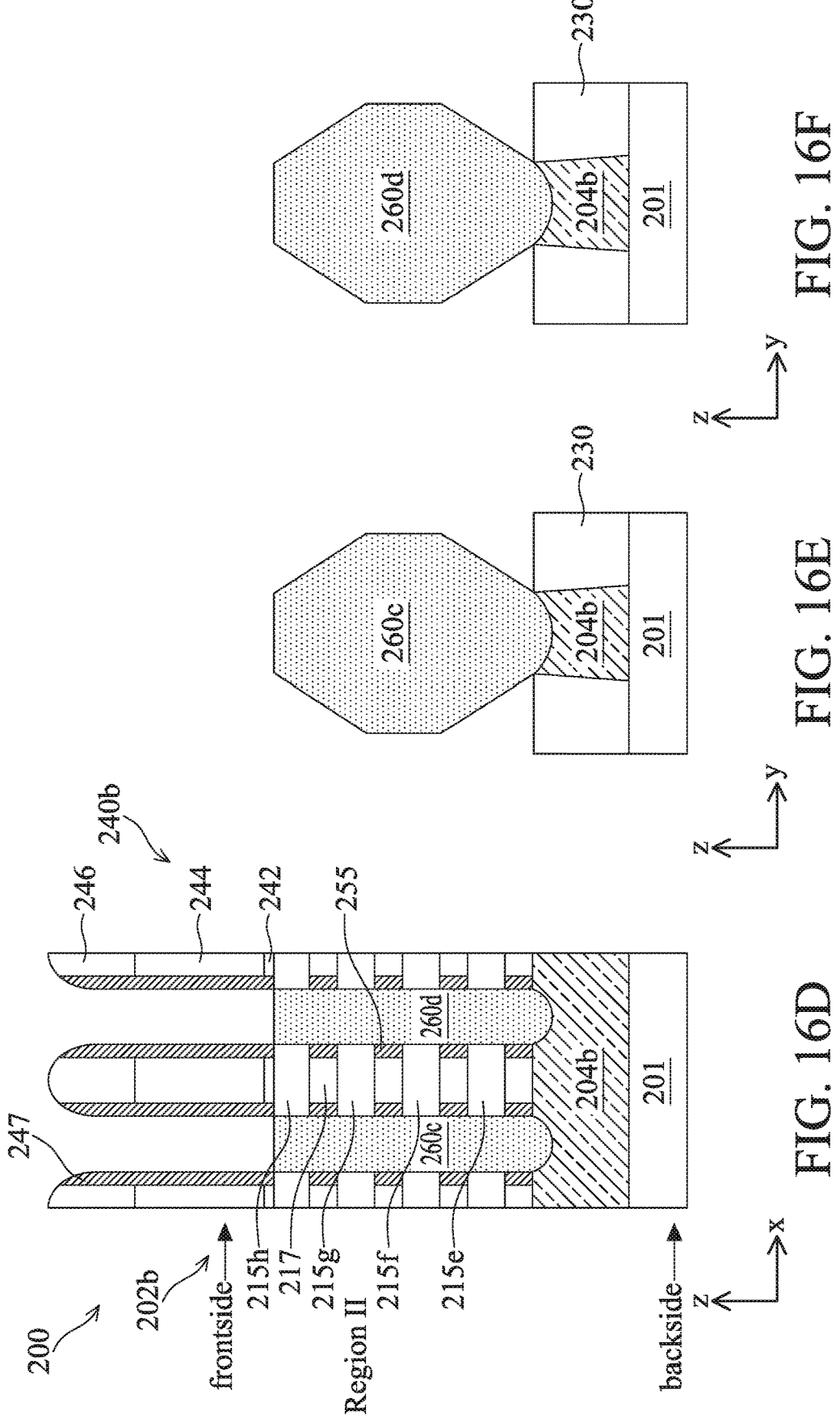
FIGS. 16D, 17D, 18D, 19D, 20D, 21D, and 22D illustrate cross-sectional views along the D-D line of the portion of the semiconductor device in FIG. 2 during fabrication processes according to the method of FIG. 1C, in accordance with some embodiments of the present disclosure.
FIGS. 16E, 17E, 18E, 19E, 20E, 21E, and 22E illustrate cross-sectional views along the E-E line of the portion of the semiconductor device in FIG. 2 during fabrication processes according to the method of FIG. 1C, in accordance with some embodiments of the present disclosure.
FIGS. 16F, 17F, 18F, 19F, 20F, 21F, and 22F illustrate cross-sectional views along the F-F line of the portion of the semiconductor device in FIG. 2 during fabrication processes according to the method of FIG. 1C, in accordance with some embodiments of the present disclosure.

Still referring to FIGS. 14A and 14D, in the GAA transistor 202a in the region I, the source feature 260a is in contact with the channel layers 215b-d but not in contact with the channel layer 215a, and the drain feature 260b is in contact with the channel layers 215a-d. Accordingly, there is no current path through the channel layer 215a from the source feature 260a to the drain feature 260b. The channel layer 215a has been isolated from the channel region of the GAA transistor 202a. The isolation is provided by the recessed source feature 260a and the dielectric layer 276. The number of (effective) channel layers is three (3) in the GAA transistor 202a. As a comparison, in the GAA transistor 202b in the region II, each of the source feature 260c and drain feature 260d is in contact with the channel layers 215e-h. Accordingly, each of the channel layers 215e-h provides a current path from the source feature 260c to the drain feature 260d. The number of (effective) channel layers is four (4) in the GAA transistor 202b. Thus, the method 10 provides varying numbers of channel layers for GAA transistors in different regions of one IC chip serving different functions.

In some alternative embodiments of the method 10, the drain feature 260b in the GAA transistor 202a in the region I can also be recessed. For example, at operation 28, after the forming of the S/D trench 274 exposing the drain feature 260b, the drain feature 260b can be further recessed to a level that is below the bottommost channel layer 215a, before proceeding to operation 30 in forming silicide features. The resultant structure after operation 34 is shown in FIGS. 15A-15F. The recessed source feature 260a and the recessed drain feature 260b both are not in contact with the bottommost channel layer 215a, resulting in an isolated channel layer 215a. In various embodiments, the recessed drain feature 260b may be level with, below, or higher than the recessed source feature 260a.

At operation 36, the method 10 (FIG. 1B) performs further fabrication processes to the device 200. For example, it may form a metal wiring layer (not shown), such as backside power rails, on the backside of the device 200. The metal wiring layer electrically connects to the backside S/D contacts 282 in the regions I and II. In an embodiment, the metal wiring layer may be formed using a damascene process, a dual-damascene process, a metal patterning process, or other suitable processes. The metal wiring layer may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Having a backside metal wiring layer beneficially increases the number of metal tracks available in the device 200 for directly connecting to source/drain contacts and vias. It also increases the gate density for greater device integration than other structures without the backside metal wiring layer. The method 10 at operation 36 may also form one or more interconnect layers on the backside of the device 200, form passivation layers on the backside of the device 200, perform other BEOL processes, and remove the carrier 370.

FIG. 1C shows a flow chart of a method 100 for fabricating a semiconductor device with varying numbers of stacked semiconductor channel layers in different regions without a need of backside metal wiring layer, according to some embodiments of the present disclosure. The method 100 is described below in conjunction with FIG. 2 and FIGS. 16A-22F that illustrate various top and cross-sectional views of a semiconductor device (or device) 200 at various steps of fabrication according to the method 100, in accordance with some embodiments. FIGS. 16A-22F illustrate cross-sectional views of the device 200, in portion, along the A-A line, the B-B line, the C-C line, the D-D line, the E-E line, and the F-F line in FIG. 2, respectively. Particularly, the A-A line and the D-D line are cuts along the lengthwise direction of semiconductor fins (direction "X"), the B-B line and the E-E line are cuts into the source regions of transistors and are parallel to gate stacks of the transistors (direction "Y"), and the C-C line and the F-F line are cuts into the drain regions of transistors and are parallel to gate stacks of the transistors. It is noted that in various embodiments, the B-B line and the E-E line can be alternatively cut into the drain regions of the transistors and the C-C line and the F-F line can be alternatively cut into the source regions of transistors. In the present disclosure, a source and a drain are interchangeably used. Additional processing is contemplated by the present disclosure. Additional operations can be provided before, during, and after method 100, and some of the operations described can be moved, replaced, or eliminated for additional embodiments of the method 100. Some aspects of the method 100 are the same as the method 10, and will be briefly discussed below. Other aspects of the method 100 are different from the method 10, and will be described in more details.

Referring to FIG. 2 and FIGS. 16A-16F, at operation 102, the method 100 (FIG. 1C) provides device 200 having a substrate 201 and transistors built on a frontside of the substrate 201. The device 200 includes a region I for low-power and/or low-leakage applications, such as an I/O area, and a region II for high-power and/or high-speed applications such as a core area. Many aspects of the device 200 are the same as described above. Reference numerals are repeated for ease of understanding. Some differences are discussed below.

The channel layers 215 are part of a stack of semiconductor layers that include the channel layers 215 and other sacrificial semiconductor layers 217 alternately stacked layer-by-layer. The sacrificial semiconductor layers 217 and the channel layers 215 include different material compositions (such as different semiconductor materials, different constituent atomic percentages, and/or different constituent weight percentages) to achieve etching selectivity. For example, the channel layers 215 may include Si and the sacrificial semiconductor layers 217 may include SiGe. However, other embodiments are possible including those that provide for etching selectivity. For example, in some embodiments, either of the channel layer 215 and the sacrificial semiconductor layers 217 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the channel layers 215 and the sacrificial semiconductor layers 217 may be performed by a molecular beam epitaxy (MBE) process, a metalorganic chemical vapor deposition (MOCVD) process, and/or other suitable epitaxial growth processes.

In the illustrated embodiment as shown in FIGS. 16A-16F, the gate stacks 240 are a placeholder and will be replaced by a final metal gate stack in a gate-last process. Therefore, the gate stacks 240 are also referred to as dummy gate stacks 240. The dummy gate stacks 240 include a dummy interfacial layer 242, a dummy gate electrode layer 244, and a hard mask layer 246. The dummy interfacial layer 242 may include a dielectric material such as silicon oxide layer (e.g., SiO$_2$) or silicon oxynitride (e.g., SiON), and may be formed by chemical oxidation, thermal oxidation, atomic layer deposition (ALD), chemical vapor deposition (CVD), and/or other suitable methods. The dummy gate electrode layer 244 may include poly-crystalline silicon (poly-Si) and may be formed by suitable deposition processes such as low-pressure chemical vapor deposition (LPCVD) and plasma-enhanced CVD (PECVD). The hard mask layer 246 may include one or more layers of material such as silicon oxide and/or silicon nitride. In embodiments, the dummy gate stacks 240 may include other suitable layers. The various layers of the dummy gate stacks 240 may be formed by photolithography and etching processes.

At operation 104, the method 100 (FIG. 1C) forms an etch mask 360 over the front side of the device 200, covering the region II while exposing the region I of the device 200. The resultant structure is shown in FIGS. 17A-17F according to an embodiment. In some embodiments, the etch mask 360 includes a resist material (and thus may be referred to as a patterned resist layer and/or a patterned photoresist layer). In an example, the operation 104 may form a patterned photoresist over the region II by photoresist coating, exposing, post-exposure baking, and developing.

Figures 17A, 17B, 17C:
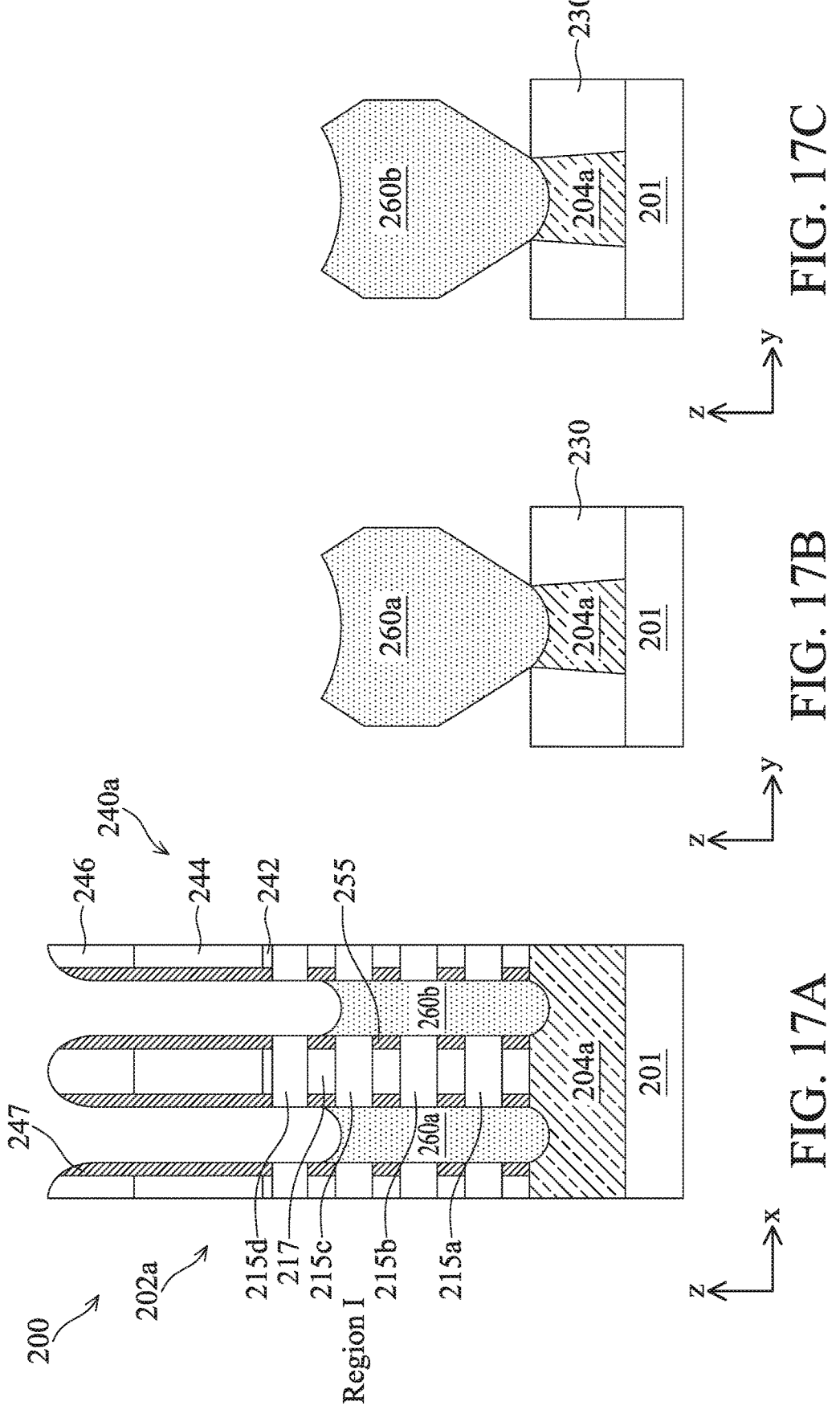
Figures 17D, 17E, 17F:
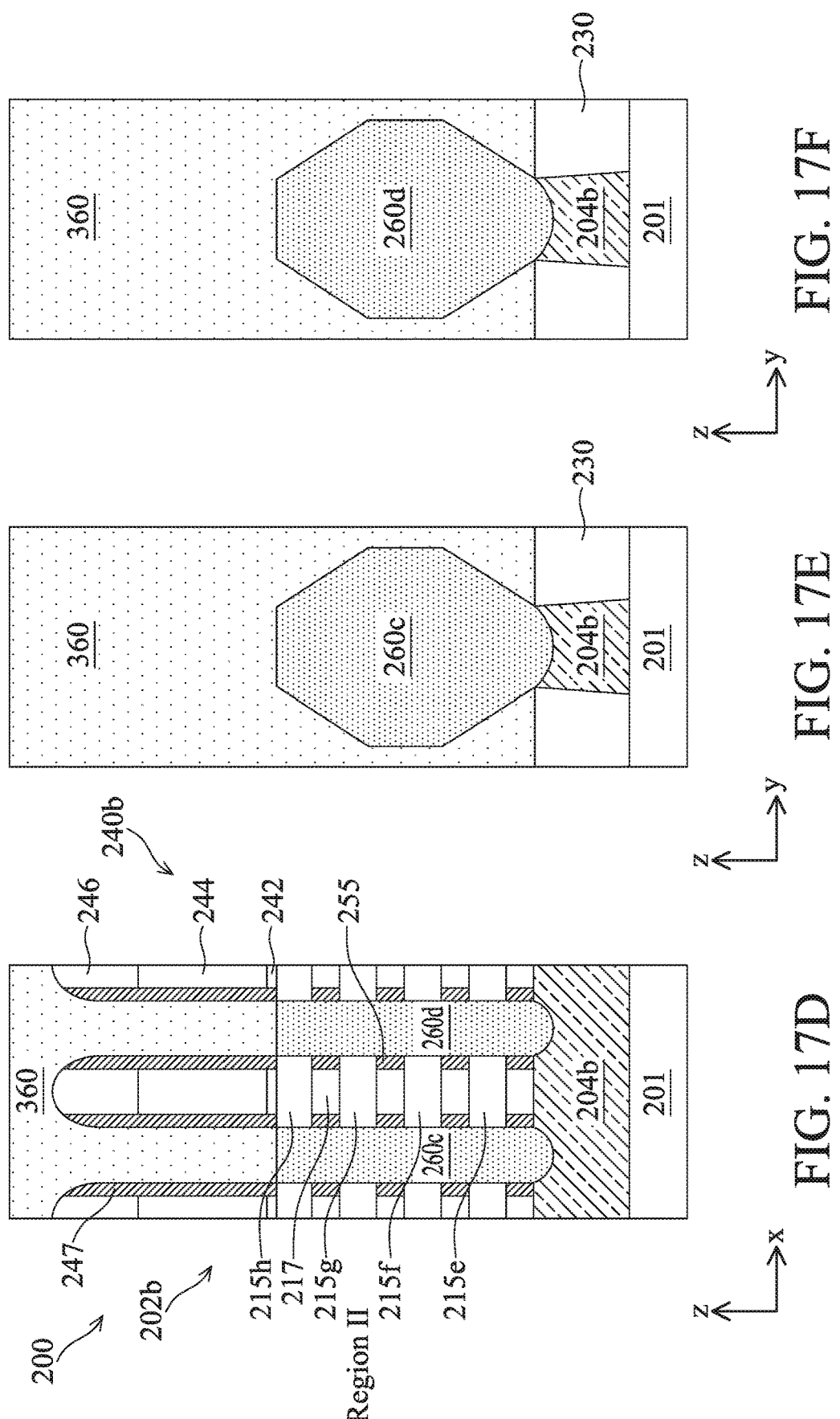
Figures 18A, 18B, 18C:
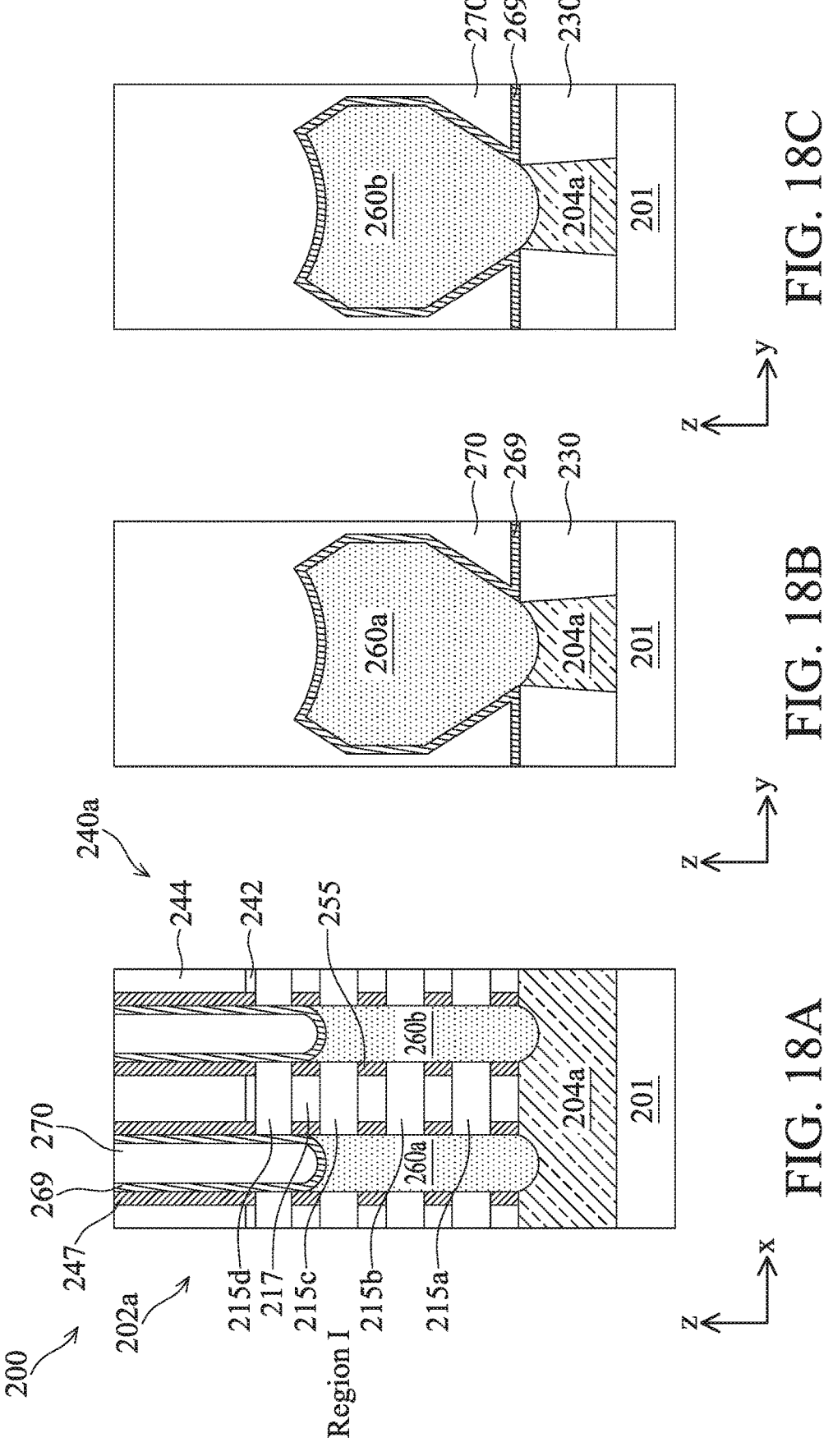
Figures 18D, 18E, 18F:
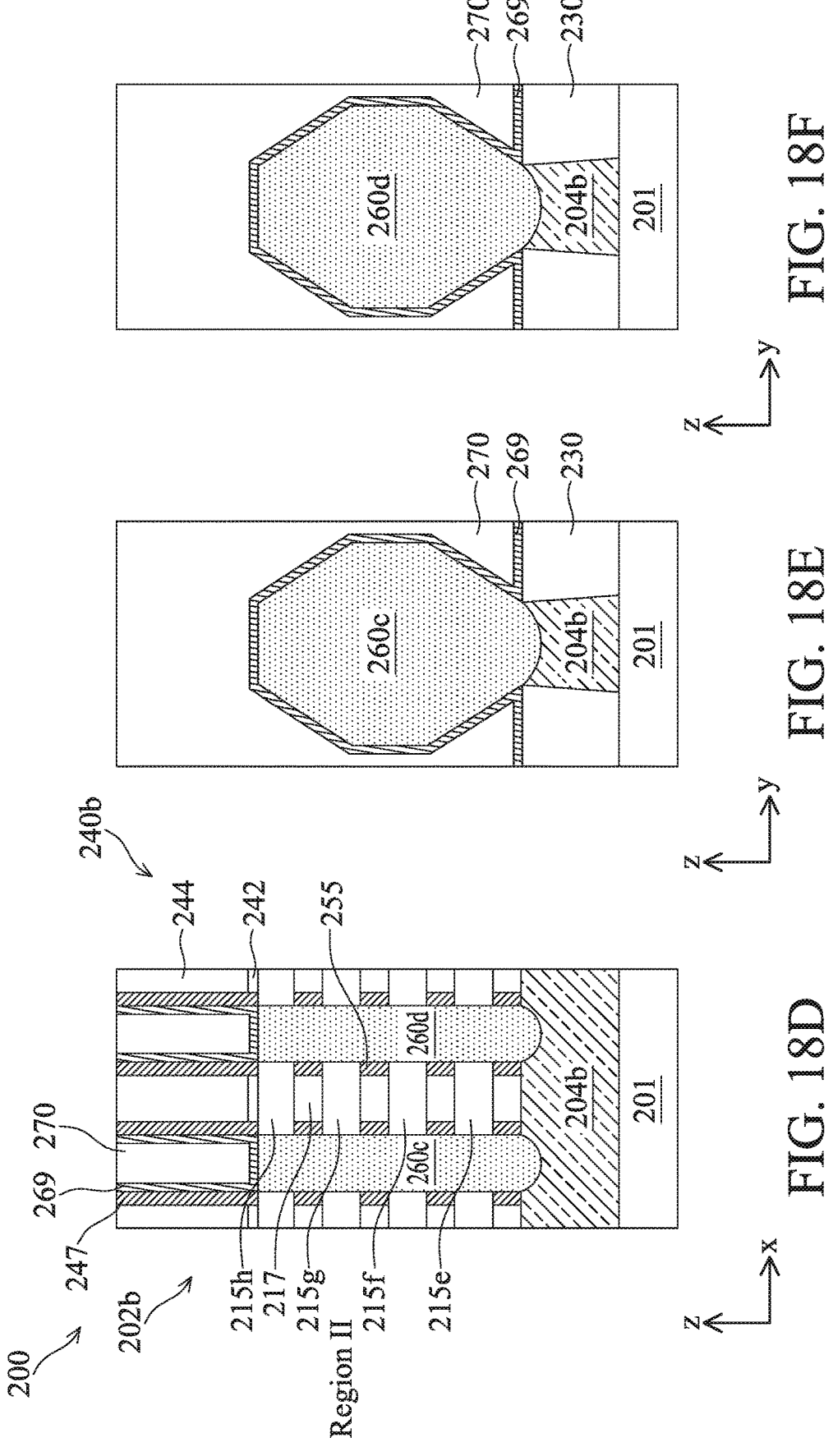
Figures 19A, 19B, 19C:
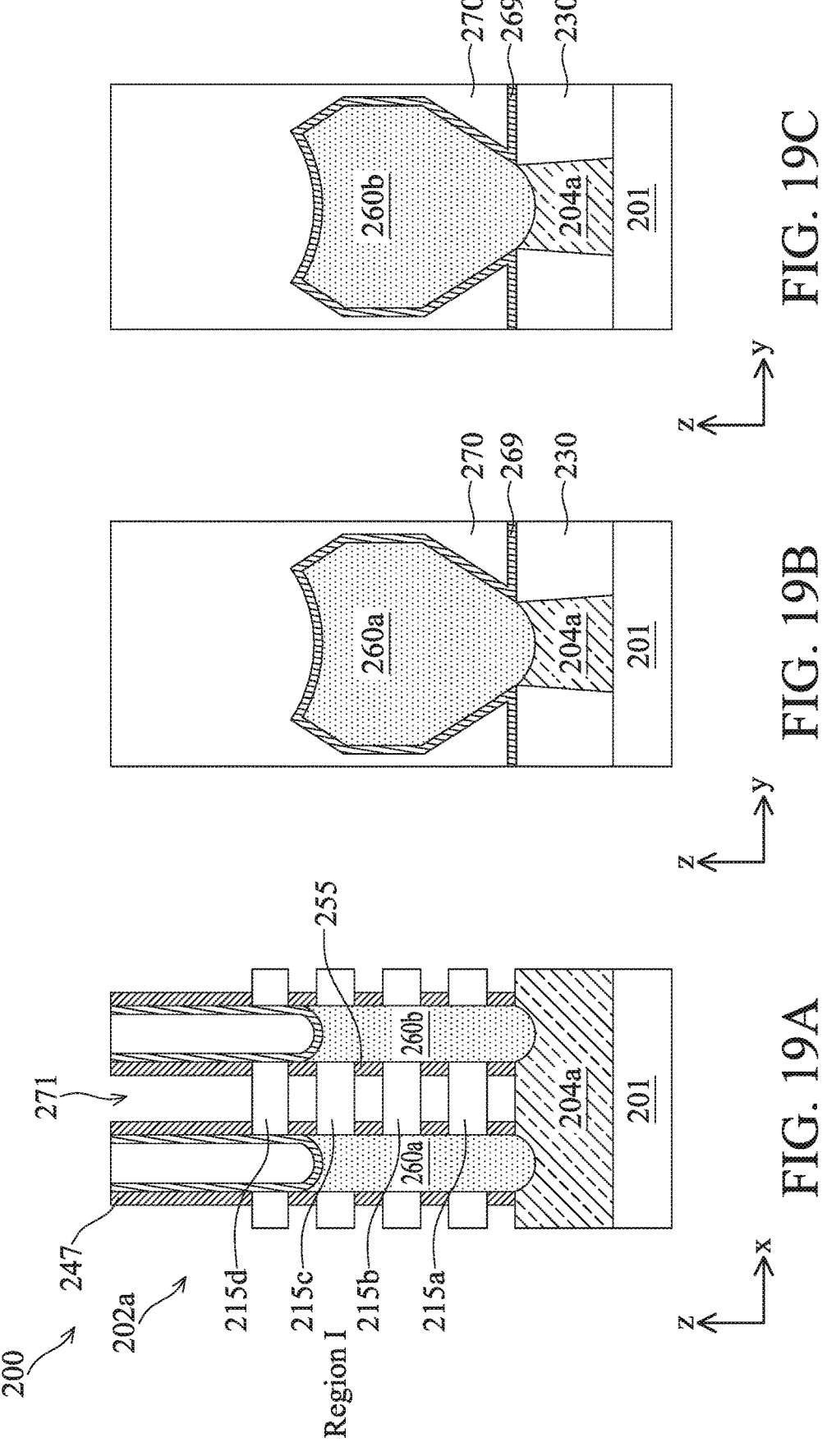
Figures 19D, 19E, 19F:
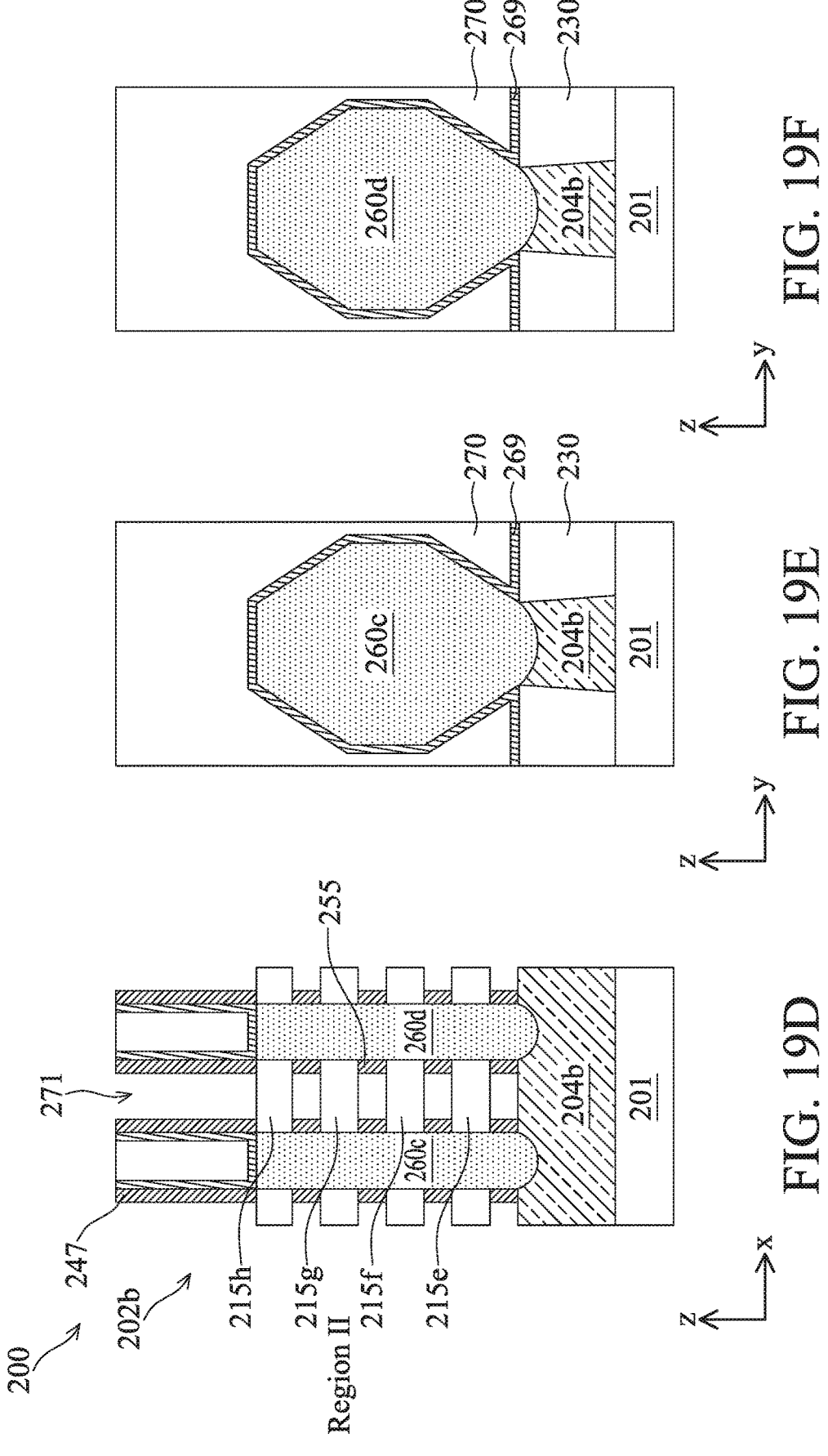
Figures 20A, 20B, 20C:
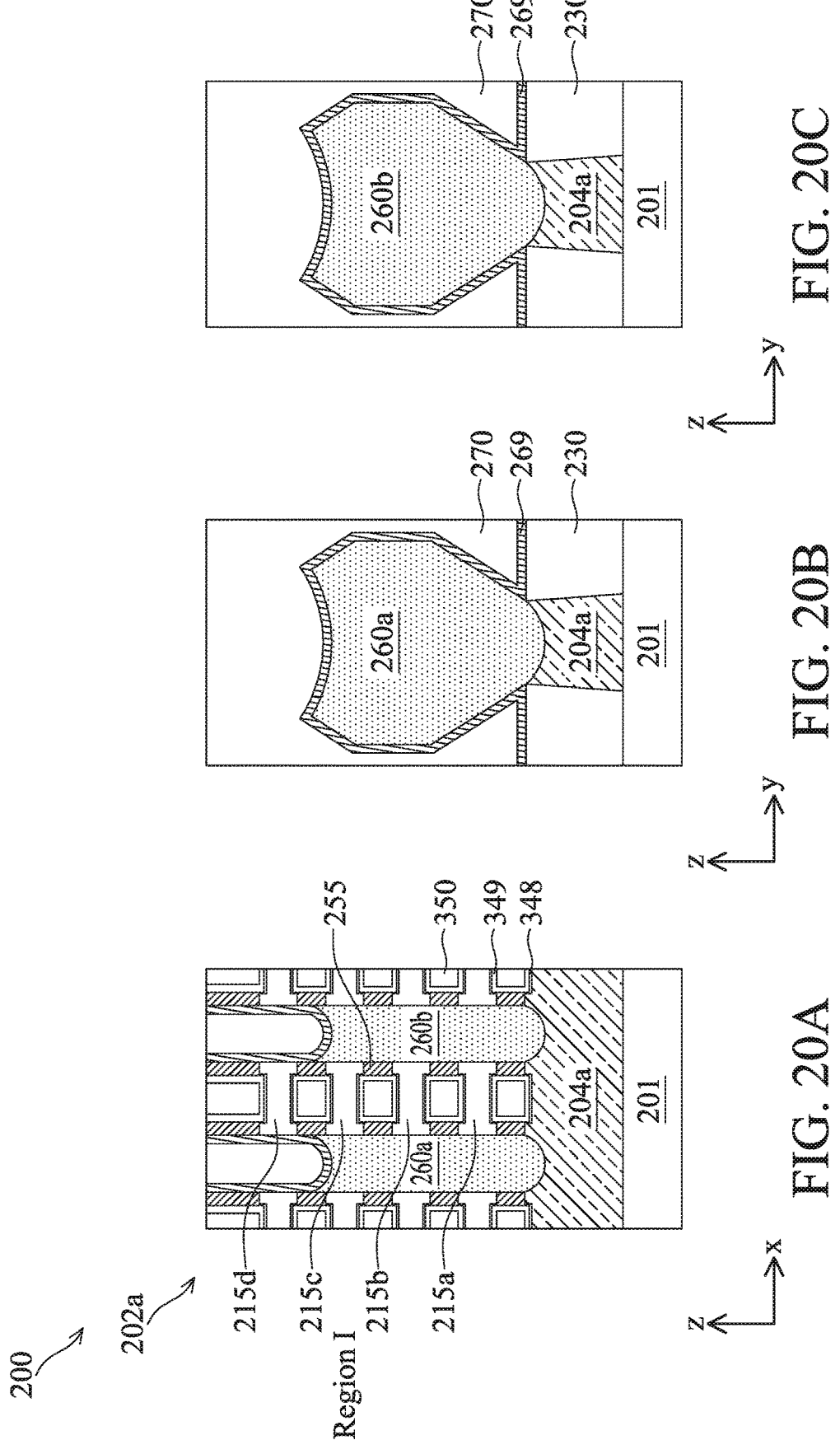
Figures 20D, 20E, 20F:
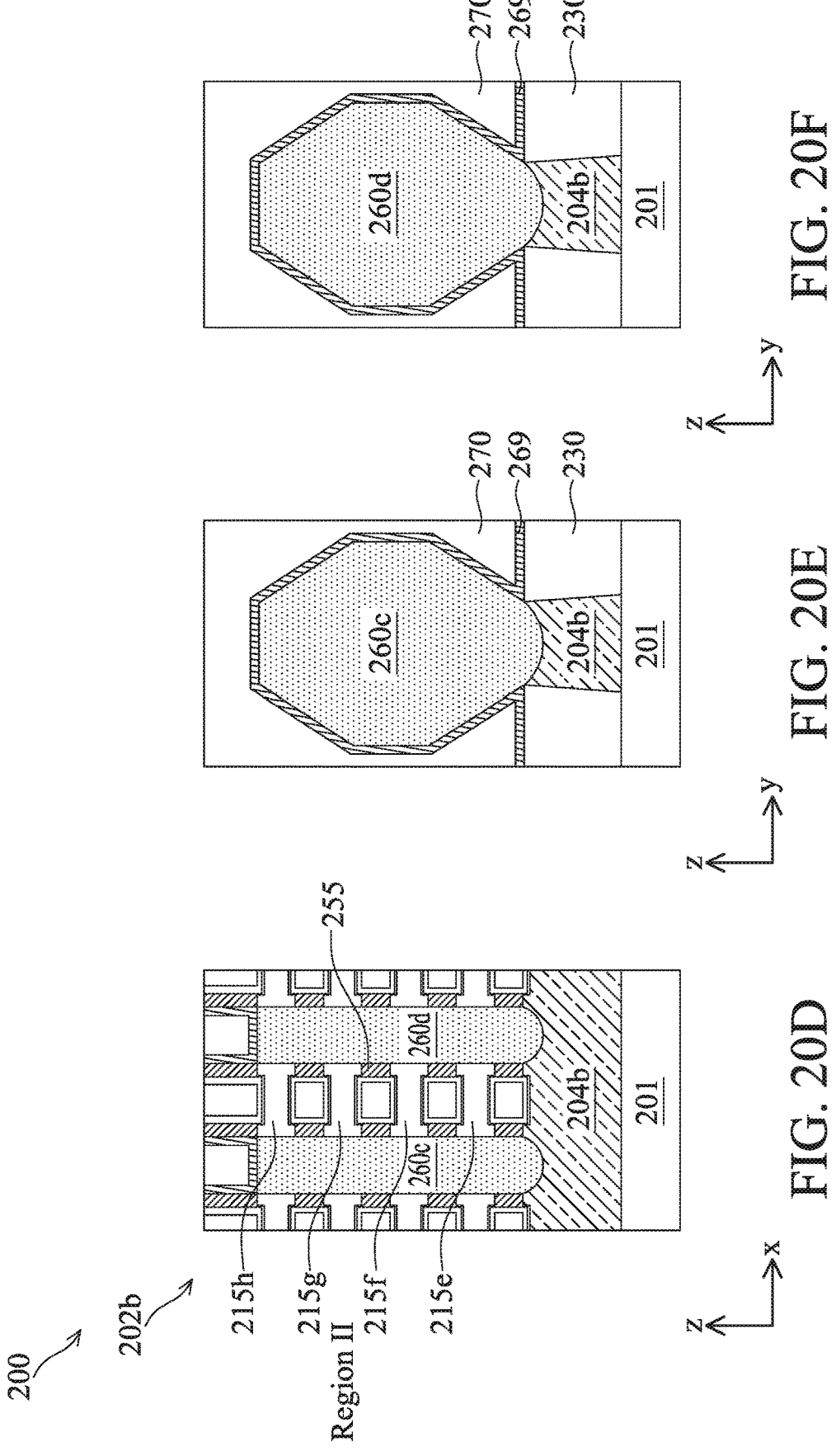

At operation 106, the method 100 (FIG. 1C) selectively etches the S/D features 260 (including the source feature 260a and the drain feature 260b) in the region I. In the present embodiment, the operation 106 applies an etching process that is tuned to be selective to the epitaxial materials of the S/D features 260 and with no (or minimal) etching to the dummy gate stacks 240, the isolation structure 230, the gate spacer 247, the inner spacers 255, and the channel layers 215. The resultant structure is shown in FIGS. 17A-17F according to an embodiment. The etching process etches the S/D features 260 in the region I to recess them to a level that is below the topmost channel layer 215d. The recessed S/D features 260 in the region I has no contact with the topmost channel layer 215d, as illustrated in FIG. 17A. Further, the recessed S/D features 260 may be in contact or not in contact with the topmost inner spacers 255 in some embodiments. It is noted that the S/D features 260 are recessed below one (1) channel layer in the illustrated embodiment, which is for illustrative purposes only and not intended to be limiting beyond what is specifically recited in the claims. It can be appreciated that the S/D features 260 can be recessed below more than one channel layer, depending on device performance needs. The recessed depth of the S/D features 260 ranges from about 10 nm to about 30 nm for each channel layer thereabove. The etching process can be dry etching, wet etching, reactive ion etching, or other etching methods. In some embodiments, the etching of the S/D features 260 includes an dry etch process that implements an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching time may last for about 10 seconds to about 50 seconds to recess the S/D features 260 below one channel layer. The etch mask 360 is subsequently removed, for example, by a resist stripping process or other suitable process.

At operation 108, the method 100 (FIG. 1C) forms various features including a contact etch stop layer (CESL) 269 over the S/D features 260 in both the regions I and II, and an interlayer dielectric (ILD) layer 270 over the CESL 269. The resultant structure is shown in FIGS. 18A-18F according to an embodiment. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The CESL 269 covers the otherwise exposed terminal ends of the topmost channel layer 215d. The ILD layer 270 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 270 may be formed by PECVD, FCVD, or other suitable methods. The operation 108 may perform one or more CMP processes to planarize the top surface of the device 200, remove the hard mask layer 246, and expose the dummy gate electrode layer 244.

At operation 110, the method 100 (FIG. 1C) removes the dummy gate stacks 240 to form gate trenches 271. The resultant structure is shown in FIGS. 19A-19F according to an embodiment. The gate trenches 271 expose surfaces of the channel layers 215 and the sacrificial semiconductor layers 217. The operation 110 may include one or more etching processes that are selective to the materials in the dummy interfacial layer 242 and the dummy gate electrode layer 244. The etching process may include any suitable etching technique such as wet etching, dry etching, RIE, ashing, and/or other etching methods, with an etchant that resists etching the gate spacers 238 and ILD layer 270. In an example, the etching process is a dry etching process using a fluorine-based etchant (e.g., $CF_4$, $CHF_3$, $CH_2F_2$, etc.). Operation 110 also releases channel layers 215 from the gate trenches 271. In the present embodiment, the channel layers 215 include Si, and the sacrificial semiconductor layers 217 include SiGe. The plurality of sacrificial semiconductor layers 217 may be selectively removed. In some implementations, the selectively removal process includes oxidizing the plurality of sacrificial semiconductor layers 217 using a suitable oxidizer, such as ozone. Thereafter, the oxidized sacrificial semiconductor layers 217 may be selectively removed. To further this embodiment, the operation 110 includes a dry etching process to selectively remove the sacrificial semiconductor layers 217, for example, by applying an HCl gas at a temperature of 500° C. to 700° C., or applying a gas mixture of $CF_4$, $SF_6$, and $CHF_3$.

At operation 112, the method 100 (FIG. 1C) deposits metal gate stacks (e.g., high-k metal gates) in the gate trenches 271. The resultant structure is shown in FIGS. 20A-20F according to an embodiment. The metal gate stacks include a high-k dielectric layer 349, a gate electrode layer 350, and an interfacial layer 348 between the high-k dielectric layer 349 and the channel layers 215. The high-k dielectric layer 349 includes a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr) $TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The high-k dielectric layer 349 may be formed by ALD, CVD, metal-organic CVD (MOCVD), PVD, thermal oxidation, and/or other suitable methods. The interfacial layer 348 may include silicon dioxide, silicon oxynitride, or other suitable materials. The interfacial layer 348 may be formed by chemical oxidation, thermal oxidation, atomic layer deposition (ALD), chemical vapor deposition (CVD), and/or other suitable methods. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes.

At operation 114, the method 100 (FIG. 1C) forms S/D contacts 275 over the S/D features 260 in the regions I and II. The resultant structure is shown in FIGS. 21A-21F according to an embodiment. The operation 114 may first selectively etches the ILD layer 270 to form S/D contact holes (not shown). The etching process can be dry etching, wet etching, reactive ion etching, or other etching methods. The selective etching process may be dry etching in an embodiment. For example, the etchant may have a gas mixture of $C_4F_6$, CO, $CO_2$, and Ar. The operation 114 subsequently removes portions of CESL 269 exposed in the S/D contact holes. The etching process can be dry etching, wet etching, reactive ion etching, or other etching methods. In an embodiment, the operation 114 may form silicide features 273 in the S/D contact holes over the S/D features 260. In some embodiments, the silicide features 273 is formed by silicidation such as self-aligned silicide in which a metal material is formed over the S/D features 260, then the temperature is raised to anneal and cause reaction between underlying silicon and the metal to form silicide, and unreacted metal is etched away. The silicide features 273 helps reduce contact resistance. The operation 114 then deposits conductive material in the S/D contact holes over the silicide features 273 to form the S/D contacts 275. In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 275.

Figures 21A, 21B, 21C:
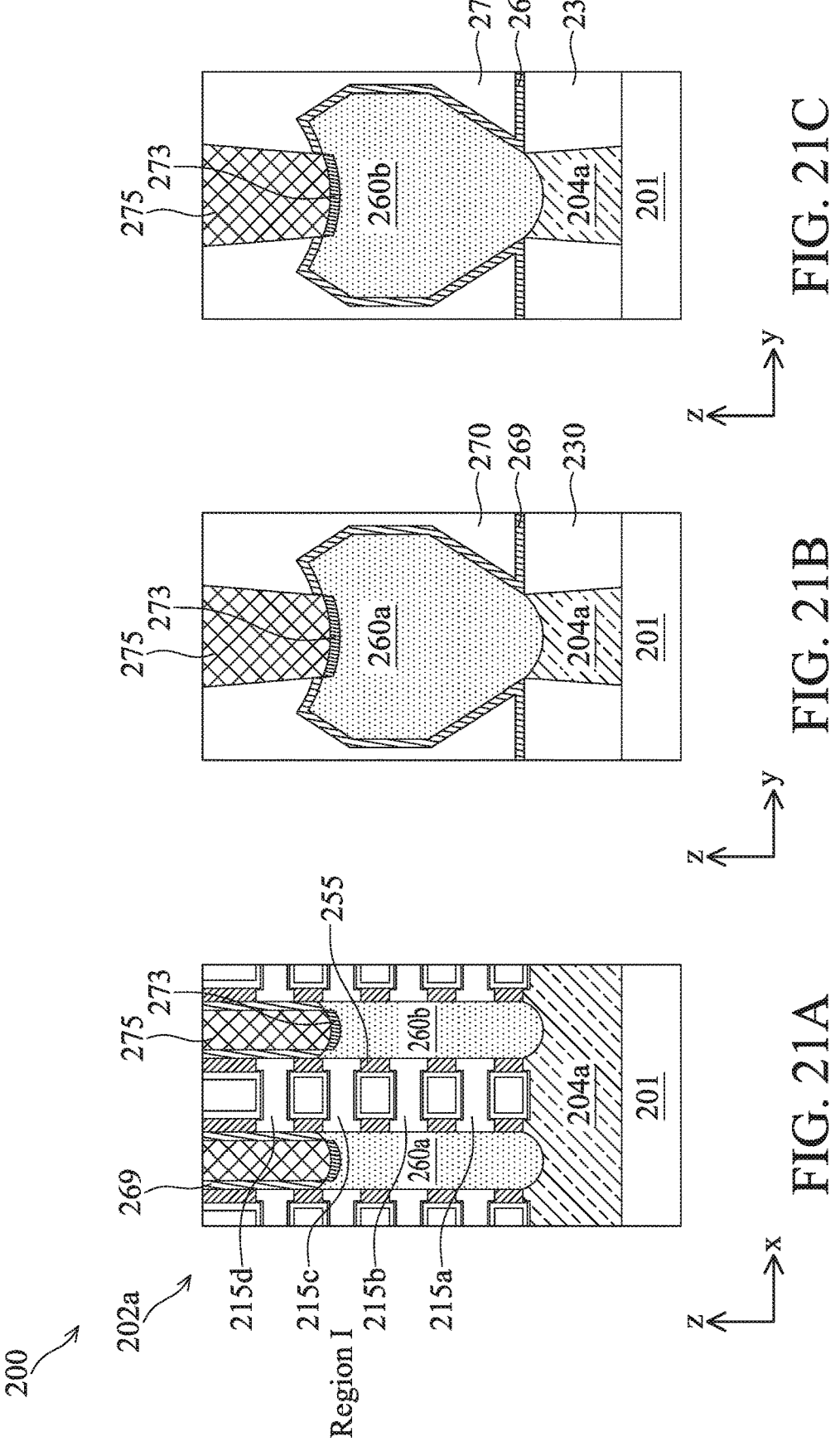
Figures 21D, 21E, 21F:
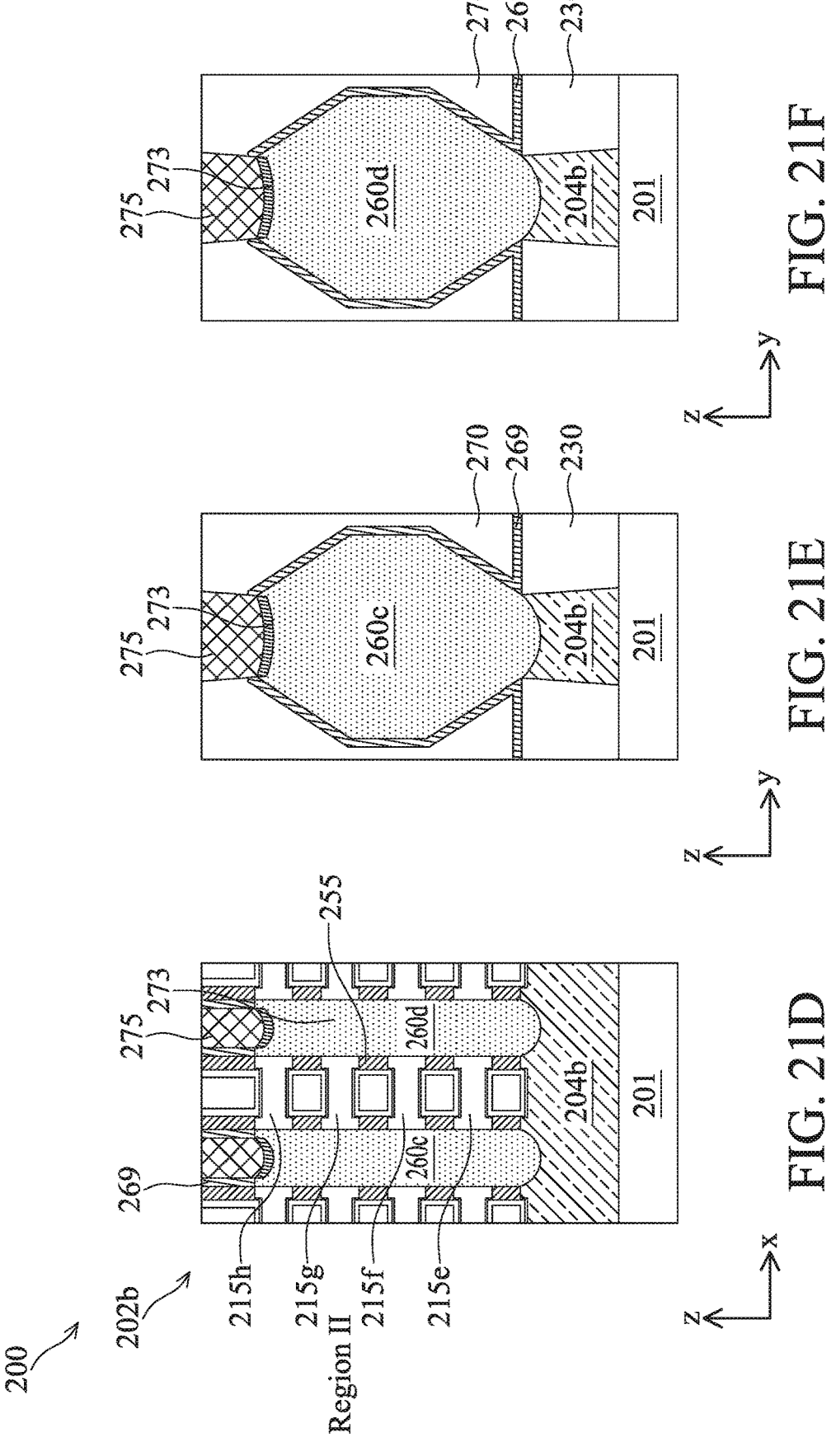
Figures 22A, 22B, 22C:
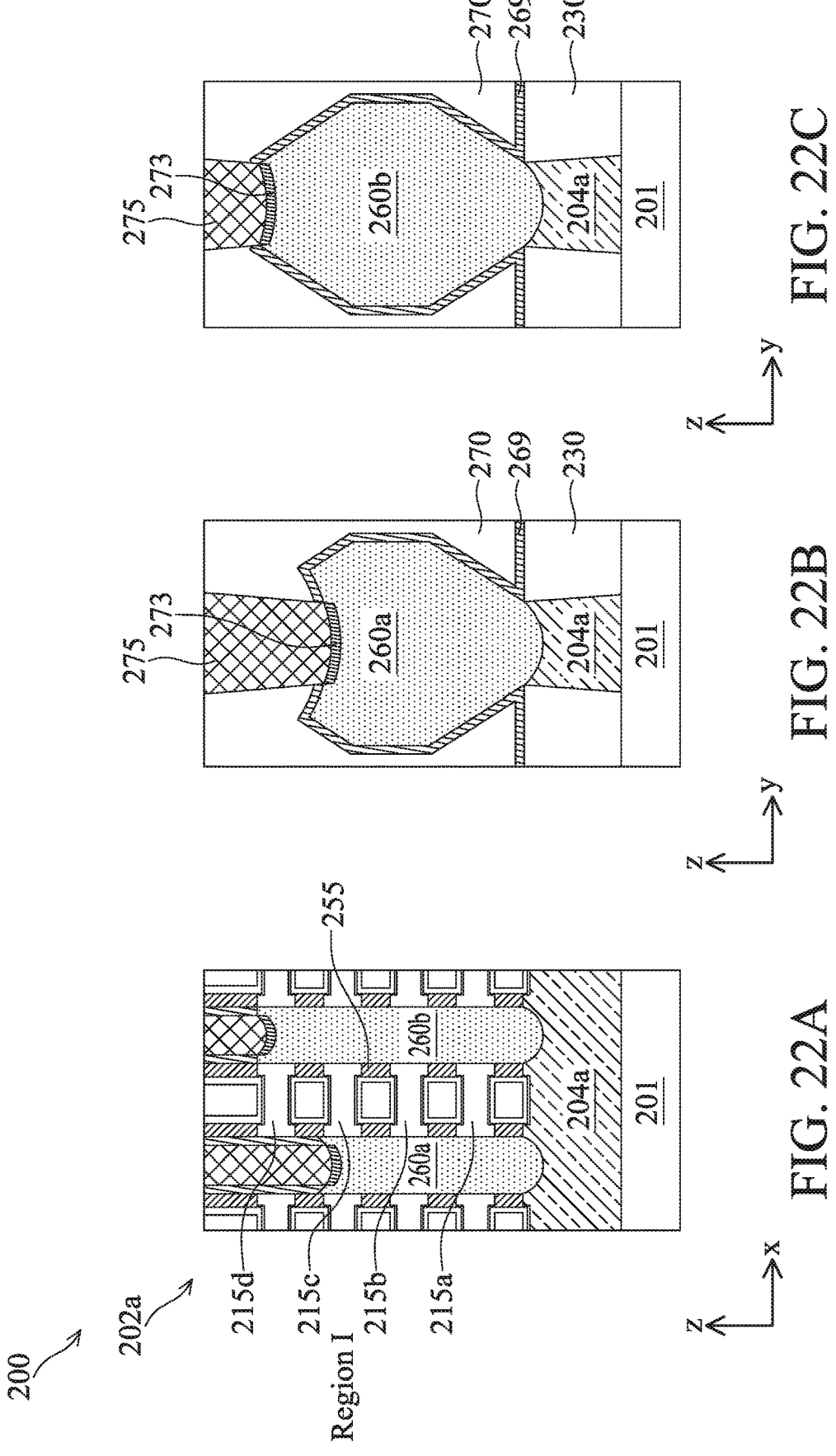
Figures 22D, 22E, 22F:
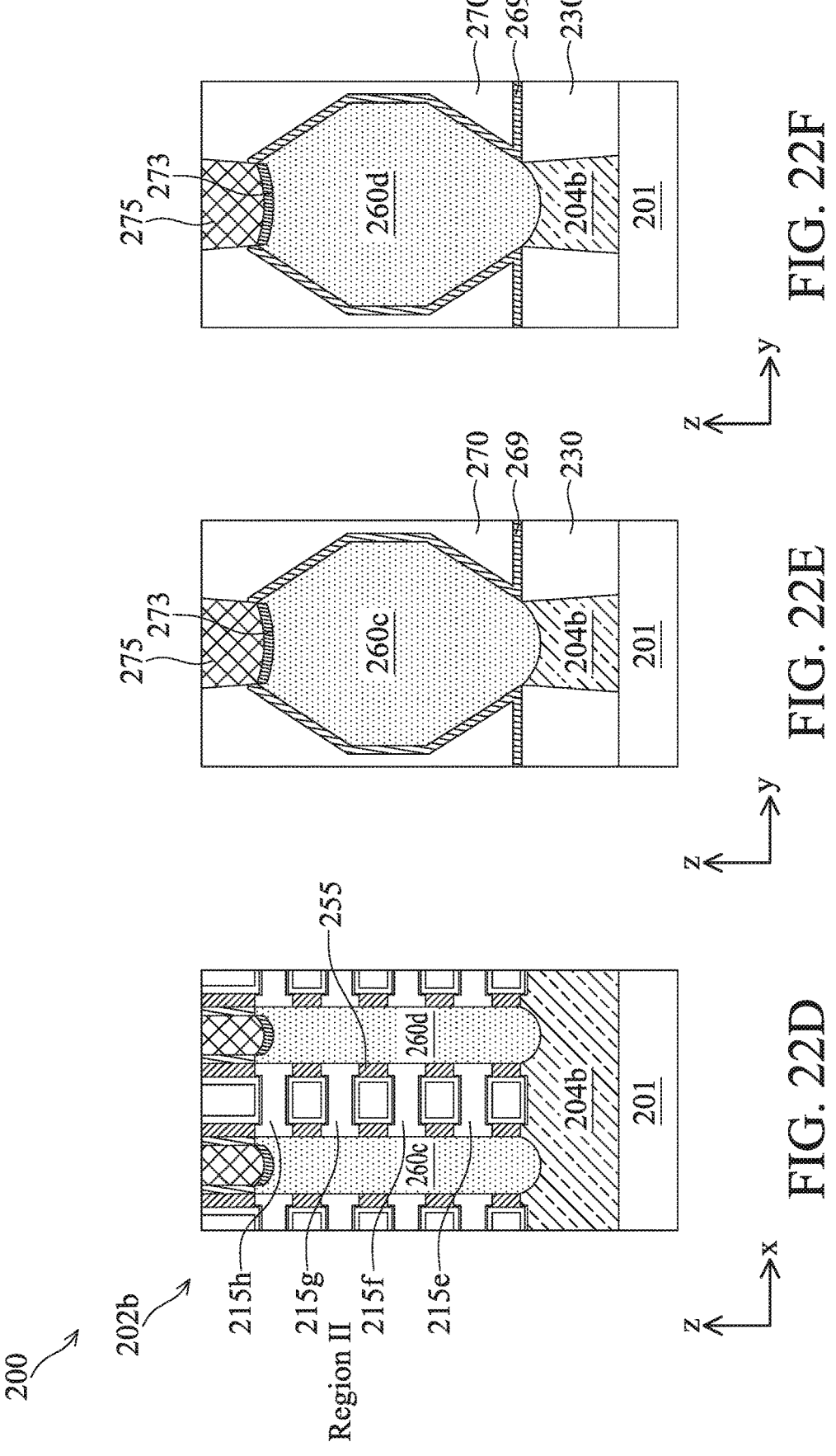

Still referring to FIGS. 21A and 21D, in the GAA transistor 202*a* in the region I, in various embodiments, the recessed drain feature 260*b* may be level with, below, or higher than the recessed source feature 260*a*. Nonetheless, both of the source feature 260*a* and the drain feature 260*b* are in contact with the channel layers 215*a-c* but free of contact with the topmost channel layer 215*d*. Accordingly, there is no current path through the channel layer 215*d* from the source feature 260*a* to the drain feature 260*b*. Thus, the channel layer 215*d* is isolated from the channel region of the GAA transistor 202*a* by the recessed S/D features 260*a* and 260*b* and the CESL 269. The number of (effective) channel layers is three (3) in the GAA transistor 202*a*. As a comparison, in the GAA transistor 202*b* in the region II, each of the source feature 260*c* and drain feature 260*d* is in contact with the channel layers 215*e-h*. Accordingly, each of the channel layers 215*e*-h provides a current path from the source feature 260*c* to the drain feature 260*d*. The number of (effective) channel layers is four (4) in the GAA transistor 202*b*. Accordingly, the method 100 provides varying numbers of channel layers for GAA transistors in different regions of one IC chip serving different functions.

In some alternative embodiments of the method 100, the drain feature 260*b* in the GAA transistor 202*a* in the region I may remain contacting the topmost channel layer 215*d* after recessing. For example, at operation 104, the etch mask 360 may also cover the drain feature 260*b* in the region I and have the opening above the source feature 260*a*. Thus, at operation 106, only the source feature 260*a* is recessed to a level that is below the bottommost channel layer 215*a*. The resultant structure after operation 114 is shown in FIGS. 22A-22F. The recessed source feature 260*a* has no contact with the topmost channel layer 215*d* and the drain feature 260*b* remains in contact with the topmost channel layer 215*d*. Nonetheless, it still results in an isolated channel layer 215*d*.

At operation 116, the method 100 (FIG. 1C) performs further fabrication processes to the device 200. For example, it may form one or more interconnect layers on the frontside of the device 200 electrically connecting the source, drain, gate terminals of various transistors to form a complete IC.

Although not intended to be limiting, embodiments of the present disclosure provide one or more of the following advantages. For example, embodiments of the present disclosure form varying numbers of stacked channel layers in different regions of one IC chip serving different functions. This advantageously meets requirements of different current driving capabilities of various transistors. Further, some embodiments of the present disclosure form backside wiring layers, such as backside power rails, to increase the number of metal tracks available in an integrated circuit and increase the gate density for greater device integration. Embodiments of the present disclosure can be readily integrated into existing semiconductor manufacturing processes.

In one example aspect, the present disclosure is directed to a method. The method includes providing a structure having a frontside and a backside, the structure including a substrate, two or more semiconductor channel layers over the substrate and connecting a first source/drain (S/D) feature and a second S/D feature, and a gate structure engaging the semiconductor channel layers, wherein the substrate is at the backside of the structure and the gate structure is at the frontside of the structure; recessing the first S/D feature, thereby exposing a terminal end of one of the semiconductor channel layers; and depositing a dielectric layer on the first S/D feature and covering the exposed terminal end of the one of the semiconductor channel layers. In some embodiments, after the recessing of the first S/D feature, the first S/D feature is not in contact with the one of the semiconductor channel layers. In some embodiments, the one of the semiconductor channel layers is a bottommost semiconductor channel layer in the structure, and the recessing of the first S/D feature includes etching the first S/D feature from the backside of the structure. In some embodiments, the method further includes etching the substrate from the backside of the structure to form a trench exposing the first S/D feature, wherein the recessing of the first S/D feature includes etching the first S/D feature through the trench. In some embodiments, the gate structure is a high-k metal gate structure. In some embodiments, the one of the semiconductor channel layers is a topmost semiconductor channel layer in the structure, and the recessing of the first S/D feature includes etching the first S/D feature from the frontside of the structure. In some embodiments, the gate structure is a sacrificial gate structure. In some embodiments, the method further includes removing the sacrificial gate structure, thereby exposing the semiconductor channel layers; and forming a high-k metal gate structure engaging the semiconductor channel layers. In some embodiments, after the recessing of the first S/D feature, the second S/D feature remains in contact with each of the semiconductor channel layers. In some embodiments, the recessing of the first S/D feature includes recessing the second S/D feature, thereby exposing another terminal end of the one of the semiconductor channel layers. In some embodiments, the method further includes partially remove the dielectric layer, thereby exposing the first S/D feature; and forming an S/D contact on the first S/D feature.

In another example aspect, the present disclosure is directed to a method. The method includes providing a structure having a frontside and a backside, the structure including a substrate, a semiconductor fin over the substrate, a first source/drain (S/D) feature and a second S/D feature over the semiconductor fin, two or more semiconductor channel layers over the semiconductor fin and connecting the first and second S/D features, and a gate structure engaging the semiconductor channel layers, wherein the substrate is at the backside of the structure and the gate structure is at the frontside of the structure; thinning down the structure from the backside of the structure until the semiconductor fin is exposed; etching the semiconductor fin from the backside of the structure to form a first trench exposing the first S/D feature; recessing the first S/D feature through the first trench, such that a terminal end of a bottommost semiconductor channel layer is exposed in the first trench; and depositing a dielectric layer in the first trench, wherein the dielectric layer covers the terminal end of the bottommost semiconductor channel layer. In some embodiments, the method further includes etching the semiconductor fin from the backside of the structure to form a second trench exposing the second S/D feature; and forming an S/D contact landing on the second S/D feature. In some embodiments, the second S/D feature is in contact with the bottommost semiconductor channel layer. In some embodiments, the method further includes prior to the forming of the S/D contact, recessing the second S/D feature through the second trench, such that another terminal end of the bottommost semiconductor channel layer is exposed in the second trench. In some embodiments, the gate structure is a high-k metal gate structure.

In yet another example aspect, the present disclosure is directed to a semiconductor structure. The semiconductor structure includes two or more semiconductor channel layers vertically stacked on each other; a gate structure engaging the semiconductor channel layers; and first and second source/drain (S/D) features, wherein the first and second S/D features, the semiconductor channel layers, and the gate structure are at a frontside of the semiconductor structure, and wherein at least one of the semiconductor channel layer is free of contact with at least one of the first and second S/D features. In some embodiments, the at least one of the semiconductor channel layer is a bottommost semiconductor channel layer. In some embodiments, the semiconductor structure further includes a metal wiring layer at a backside of the semiconductor structure. In some embodiments, the at least one of the semiconductor channel layer is free of contact with both of the first and second S/D features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

22

What is claimed is:

1. A semiconductor structure, comprising:
a stack of at least two semiconductor layers;
a gate structure wrapping each of the semiconductor layers;
first and second source/drain (S/D) features disposed on opposing sides of the gate structure, wherein the first and second S/D features, the semiconductor layers, and the gate structure are at a frontside of the semiconductor structure, and wherein at least one of the semiconductor layers is free of contact with the first S/D feature; and
a dielectric layer, wherein the at least one of the semiconductor layers includes a top surface, a bottom surface, a first sidewall extending from the top surface to the bottom surface and interfacing with the dielectric layer, and a second sidewall extending from the top surface to the bottom surface and interfacing with the second S/D feature, and wherein the first sidewall is opposing the second sidewall.

2. The semiconductor structure of claim 1, wherein the at least one of the semiconductor layers is a bottommost one of the semiconductor channel layers.

3. The semiconductor structure of claim 2, wherein the dielectric layer is disposed under the first S/D feature.

4. The semiconductor structure of claim 2, further comprising:
a metal contact disposed at a backside of the semiconductor structure and in electrical coupling with the second S/D feature.

5. The semiconductor structure of claim 2, wherein a bottom surface of the first S/D feature has a concave profile bending towards the frontside of the semiconductor structure.

6. The semiconductor structure of claim 1, wherein the at least one of the semiconductor layers is a topmost one of the semiconductor layers.

7. The semiconductor structure of claim 6, wherein the dielectric layer is disposed on the first S/D feature.

8. The semiconductor structure of claim 1, wherein the first S/D feature is a source feature, and the second S/D feature is a drain feature.

9. The semiconductor structure of claim 1, wherein a top surface of the dielectric layer is above the top surface of the at least one of the semiconductor layers.

10. The semiconductor structure of claim 1, wherein a top surface of the dielectric layer interfaces with a bottom surface of the first S/D feature.

11. A semiconductor structure, comprising:
a first region, the first region including:
a plurality of first nanostructures vertically stacked on each other;
a first gate structure wrapping each of the first nanostructures; and
first and second epitaxial features disposed on opposing sides of the first gate structure, wherein at least one of the first nanostructures is free of contact with the first epitaxial feature; and
a second region, the second region including:
a plurality of second nanostructures vertically stacked on each other;
a second gate structure wrapping each of the second nanostructures; and
third and fourth epitaxial features disposed on opposing sides of the second gate structure and abutting each of the second nanostructures, wherein each of the third and fourth epitaxial features extends continuously from a first portion abutting a topmost one of the second nanostructures to a second portion abutting a bottommost one of the second nanostructures.

12. The semiconductor structure of claim 11, wherein a number of the first nanostructures equals a number of the second nanostructures.

13. The semiconductor structure of claim 11, wherein the at least one of the first nanostructures is also free of contact with the second epitaxial feature.

14. The semiconductor structure of claim 11, wherein the at least one of the first nanostructures is in physical contact with the second epitaxial feature.

15. The semiconductor structure of claim 11, wherein the at least one of the first nanostructures is a bottommost one of the first nanostructures.

16. The semiconductor structure of claim 11, wherein the at least one of the first nanostructures is a topmost one of the first nanostructures.

17. A semiconductor structure, comprising:

a plurality of nanostructures vertically stacked on each other;

a gate structure wrapping each of the nanostructures;

an epitaxial feature with a bottom surface above a bottommost one of the nanostructures;

inner spacers disposed between the epitaxial feature and the gate structure; and a dielectric layer disposed under the epitaxial feature and in physical contact with the bottom surface of the epitaxial feature and a bottommost one of the inner spacers.

18. The semiconductor structure of claim 17, wherein the dielectric layer is in physical contact with the bottommost one of the nanostructures.

19. The semiconductor structure of claim 17, wherein the bottom surface of the epitaxial feature has a concave profile bending towards a frontside of the semiconductor structure.

20. The semiconductor structure of claim 17, wherein the epitaxial feature is a first epitaxial feature, the semiconductor structure further comprising:

a second epitaxial feature with a bottom surface below the bottommost one of the nanostructures, wherein the nanostructures are disposed between the first and second epitaxial features.

* * * * *